(12) United States Patent
Kozuma et al.

(10) Patent No.: US 10,230,368 B2
(45) Date of Patent: Mar. 12, 2019

(54) PROGRAMMABLE LOGIC DEVICE AND SEMICONDUCTOR DEVICE

(71) Applicant: Semiconductor Energy Laboratory Co., Ltd., Atsugi-shi, Kanagawa-ken (JP)

(72) Inventors: Munehiro Kozuma, Kanagawa (JP);
Yoshiyuki Kurokawa, Kanagawa (JP);
Takayuki Ikeda, Kanagawa (JP);
Takeshi Aoki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/191,763

(22) Filed: Jun. 24, 2016

(65) Prior Publication Data

US 2016/0380630 A1    Dec. 29, 2016

Related U.S. Application Data

(63) Continuation of application No. 14/725,308, filed on May 29, 2015, now Pat. No. 9,379,711, which is a
(Continued)

(30) Foreign Application Priority Data

Feb. 13, 2013  (JP) ................................. 2013-025157
Feb. 13, 2013  (JP) ................................. 2013-025221

(51) Int. Cl.
*H03K 19/00*     (2006.01)
*H03K 19/173*    (2006.01)
(Continued)

(52) U.S. Cl.
CPC ....... *H03K 19/0013* (2013.01); *H01L 27/124* (2013.01); *H01L 27/1225* (2013.01);
(Continued)

(58) Field of Classification Search
None
See application file for complete search history.

(56) References Cited

U.S. PATENT DOCUMENTS 5,359,242 A  10/1994  Veenstra
5,457,409 A  10/1995  Agrawal et al.
(Continued)

FOREIGN PATENT DOCUMENTS

EP   1737044 A   12/2006
EP   1770865 A    4/2007
(Continued)

OTHER PUBLICATIONS

Lotze.N. et al., "A 62mV 0.13μm CMOS Standard-Cell-Based Design Technique Using Schmitt-Trigger Logic", ISSCC 2011 (Digest of Technical Papers. IEEE International Solid-State Circuits Conference), Feb. 20, 2011, pp. 340-342.
(Continued)

*Primary Examiner* — Crystal L Hammond
(74) *Attorney, Agent, or Firm* — Fish & Richardson P.C.

(57) ABSTRACT

A programmable logic device includes a plurality of programmable logic elements (PLE) whose electrical connection is controlled by first configuration data. Each of The PLEs includes an LUT in which a relationship between a logic level of an input signal and a logic level of an output signal is determined by second configuration data, an FF to which the output signal of the LUT is input, and an MUX. The MUX includes at least two switches each including first and second transistor. A signal including third configuration data is input to a gate of the second transistor through the first transistor. The output signal of the LUT or an output signal of the FF is input to one of a source and a drain of the second transistor.

6 Claims, 33 Drawing Sheets

Related U.S. Application Data continuation of application No. 14/170,825, filed on Feb. 3, 2014, now Pat. No. 9,048,832.

(51) Int. Cl.
  *H03K 19/177* (2006.01)
  *H01L 27/12* (2006.01)
  *H01L 29/786* (2006.01)
  *H03K 19/0944* (2006.01)
  *H01L 29/24* (2006.01)

(52) U.S. Cl.
  CPC .......... *H01L 29/24* (2013.01); *H01L 29/7869* (2013.01); *H03K 19/09441* (2013.01); *H03K 19/1737* (2013.01); *H03K 19/1776* (2013.01); *H03K 19/17728* (2013.01); *H03K 19/17748* (2013.01)

(56) References Cited

U.S. PATENT DOCUMENTS

| | | | |
|---|---|---|---|
| 5,633,601 | A | 5/1997 | Nagaraj |
| 5,731,856 | A | 3/1998 | Kim et al. |
| 5,744,864 | A | 4/1998 | Cillessen et al. |
| 5,789,939 | A | 8/1998 | Agrawal et al. |
| 5,811,986 | A | 9/1998 | Agrawal et al. |
| 5,905,385 | A * | 5/1999 | Sharpe-Geisler ............... H03K 19/1737 326/39 |
| 6,127,702 | A | 10/2000 | Yamazaki et al. |
| 6,294,274 | B1 | 9/2001 | Kawazoe et al. |
| 6,529,041 | B1 | 3/2003 | Ng et al. |
| 6,563,174 | B2 | 5/2003 | Kawasaki et al. |
| 6,727,522 | B1 | 4/2004 | Kawasaki et al. |
| 6,781,865 | B2 | 8/2004 | Ohtsuka et al. |
| 6,924,663 | B2 | 8/2005 | Masui et al. |
| 6,980,025 | B1 | 12/2005 | Verma et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,330,052 | B2 | 2/2008 | Kaptanoglu et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,417,455 | B2 | 8/2008 | Verma et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,476,927 | B2 | 7/2013 | Nishijima |
| 9,225,336 | B2 * | 12/2015 | Aoki ............... H03K 19/1776 |
| 9,344,090 | B2 | 5/2016 | Nishijima et al. |
| 9,349,418 | B2 * | 5/2016 | Yamamoto ........ H01L 27/10897 |
| 9,379,711 | B2 * | 6/2016 | Kozuma .......... H03K 19/17748 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0095181 | A1 | 5/2004 | Ohtsuka et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2005/0206406 | A1 | 9/2005 | Verma et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 * | 5/2006 | Saito ............... H01L 27/14601 250/338.4 |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 * | 10/2006 | Kimura ................ G09G 3/20 315/169.3 |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0153188 | A1 | 6/2009 | Vorbach et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0148171 | A1 | 6/2010 | Hayashi et al. |
| 2011/0175646 | A1 * | 7/2011 | Takemura ........ H03K 19/17784 326/44 |
| 2011/0260671 | A1 * | 10/2011 | Jeung .................. H02P 6/08 318/701 |
| 2012/0212995 | A1 * | 8/2012 | Kurokawa ............ G11C 7/1006 365/149 |
| 2012/0268164 | A1 * | 10/2012 | Kobayashi ........ H03K 19/17796 326/40 |
| 2012/0274355 | A1 | 11/2012 | Nishijima |
| 2012/0293200 | A1 | 11/2012 | Takemura |
| 2012/0293201 | A1 | 11/2012 | Fujita et al. |
| 2012/0293202 | A1 * | 11/2012 | Nishijima .......... H03K 19/1776 326/41 |

(56) References Cited

U.S. PATENT DOCUMENTS

| | | | | |
|---|---|---|---|---|
| 2012/0293203 | A1* | 11/2012 | Ohmaru | H03K 19/1776 326/44 |
| 2012/0293206 | A1* | 11/2012 | Yoneda | H03K 19/17736 326/101 |
| 2013/0207170 | A1 | 8/2013 | Kurokawa | |
| 2013/0256762 | A1 | 10/2013 | Nishijima | |
| 2013/0285697 | A1 | 10/2013 | Kurokawa | |
| 2013/0293263 | A1 | 11/2013 | Kurokawa | |
| 2013/0314124 | A1 | 11/2013 | Ikeda et al. | |
| 2013/0321025 | A1 | 12/2013 | Kurokawa et al. | |
| 2014/0042496 | A1 | 2/2014 | Ohmaru et al. | |
| 2014/0051116 | A1 | 2/2014 | Tea et al. | |
| 2014/0225644 | A1 | 8/2014 | Aoki et al. | |
| 2014/0340117 | A1 | 11/2014 | Takemura | |

FOREIGN PATENT DOCUMENTS

| | | |
|---|---|---|
| EP | 2226847 A | 9/2010 |
| JP | 46-001767 B | 1/1971 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 08-330943 A | 12/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-115754 A | 4/2003 |
| JP | 2003-198361 A | 7/2003 |
| JP | 2004-103957 A | 4/2004 |
| JP | 2004-273614 A | 9/2004 |
| JP | 2004-273732 A | 9/2004 |
| JP | 2007-089180 A | 4/2007 |
| JP | 2008-283526 A | 11/2008 |
| JP | 2012-257217 A | 12/2012 |
| JP | 2013-009306 A | 1/2013 |
| TW | 548803 | 8/2003 |
| WO | WO-2002/101928 | 12/2002 |
| WO | WO-2004/114391 | 12/2004 |
| WO | WO-2012/157532 | 11/2012 |

OTHER PUBLICATIONS

Chun.K et al., "A 3T Gain Cell Embedded DRAM Utilizing Preferential Boosting for High Density and Low Power On-Die Caches", IEEE Journal of Solid-State Circuits, Jun. 1, 2011, vol. 46, No. 6, pp. 1495-1505.

Eslami.F et al., "Capacitive Boosting for FPGA Interconnection Networks", 21st International Conference on Field Programmable Logic and Applications, 2011, vol. 21, pp. 453-458.

Shukuri.S et al., "A Complementary Gain Cell Technology for sub-1 V Supply DRAMs", IEDM 92: Technical Digest of International Electron Devices Meeting, Dec. 13, 1992, pp. 1006-1008.

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. ( Applied Physics Letters ) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. ( Applied Physics Letters ) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

(56) References Cited

OTHER PUBLICATIONS

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. ( Journal of Applied Physics ) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW'08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. ( Japanese Journal of Applied Physics ) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. ( Applied Physics Letters ) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m < 4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. ( Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. ( Applied Physics Letters ) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission

(56) References Cited

OTHER PUBLICATIONS

AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/JP2014/052709) dated Apr. 15, 2014.

Written Opinion (Application No. PCT/JP2014/052709) dated Apr. 15, 2014.

Choi.D et al., "New Non-Volatile Memory Structures for FPGA Architectures", IEEE Transactions on Very Large Scale Integration (VLSI) Systems, Jul. 1, 2008, vol. 16, No. 7, pp. 874-881, IEEE.

\* cited by examiner

PROGRAMMABLE LOGIC DEVICE AND SEMICONDUCTOR DEVICE

CROSS-REFERENCE TO RELATED APPLICATIONS

This application is a continuation of U.S. application Ser. No. 14/725,308, filed May 29, 2015, now allowed, which is a continuation of U.S. application Ser. No. 14/170,825, filed Feb. 3, 2014, now U.S. Pat. No. 9,048,832, which claims the benefit of foreign priority applications filed in Japan as Serial No. 2013-025157 and Serial No. 2013-025221 on Feb. 13, 2013, all of which are incorporated by reference.

TECHNICAL FIELD

The present invention relates to an object, a method, or a manufacturing method. In addition, the present invention relates to a process, a machine, manufacture, or a composition of matter. In particular, the present invention relates to, for example, a semiconductor device, a display device, a light-emitting device, a power storage device, a driving method thereof, or a manufacturing method thereof. One embodiment of the present invention particularly relates to a semiconductor device. One embodiment of the present invention particularly relates to a programmable logic device in which the structure of hardware can be changed and a semiconductor device including the programmable logic device.

BACKGROUND ART

In a programmable logic device (PLD), a logic circuit is formed using adequate-scale programmable logic elements (PLE), and the functions of the PLEs and connection between the PLEs can be changed after manufacture. Specifically, the PLD includes at least a plurality of PLEs and a routing resource for controlling connection between the PLEs.

The internal circuit structure of the programmable logic device can be changed by a user after manufacture. The PLE is the minimum unit of a logic resource included in a combinational circuit, a sequential circuit, or the like.

There are a variety of PLE structures proposed by PLD vendors. A look-up table (LUT)-type PLE including an LUT that can function as a variety of logic gates with a simple circuit structure and a flip-flop required to achieve the function of a sequential circuit is advantageous over a product-term type PLE that achieves a desired logic gate with a combination of an AND circuit and an OR circuit in an increase in PLD area and comes on the market.

An LUT-type PLE often includes a multiplexer for offering an option for a signal path in addition to an LUT and a flip-flop. By providing the multiplexer in the PLE, configuration data can control not only PLE internal connection, such as selection of signals input to the flip-flop or selection of signals output from the PLE, but also direct connection between the PLEs without a routing resource switch. Thus, the use of the multiplexer can reduce the number of PLEs and achieve a variety of circuit structures in the PLD.

Patent Document 1 discloses an FPGA including a plurality of multiplexers in a logic module.

Patent Document 1: Japanese Published Patent Application No. 08-330943

DISCLOSURE OF INVENTION

To evaluate the performance of a semiconductor device such as a PLD, low power consumption and high-speed operation are important factors. However, when power supply voltage is decreased to reduce the power consumption of the PLD, the on-state current of a transistor is decreased, so that the operation speed of the PLD is also decreased. In other words, there is a tradeoff between a reduction in power consumption and an increase in operation speed. In view of the operation speed, it is impossible to decrease power supply voltage only for reducing power consumption.

A high-level potential applied to a node in the PLE through an n-channel transistor is decreased by the threshold voltage of the transistor. Thus, when the power supply voltage of the PLD is decreased to reduce power consumption, the potential of the node in the PLE becomes too low, so that a logic level of a signal output from the PLE might be changed and the PLD might not operate correctly.

In view of the above technical background, it is an object of one embodiment of the present invention to provide a low-power PLD or the like in which operation speed can be maintained. Alternatively, it is an object of one embodiment of the present invention to provide a low-power PLD or the like that can operate correctly. Alternatively, it is an object of one embodiment of the present invention to provide a semiconductor device or the like with low off-state current. Alternatively, it is an object of one embodiment of the present invention to provide a semiconductor device or the like with low flow-through current. Alternatively, it is an object of one embodiment of the present invention to provide a semiconductor device or the like in which operation speed is not decreased easily. Alternatively, it is an object of one embodiment of the present invention to provide a novel semiconductor device or the like. Note that the description of these objects does not disturb the existence of other objects. In one embodiment of the present invention, there is no need to achieve all the objects. Other objects will be apparent from and can be derived from the description of the specification, the drawings, the claims, and the like.

In the PLE circuit structure, in addition to an LUT and a register that are generally used, an arithmetic function or a combinational circuit is mounted efficiently by adding a function of a carrier chain, a register chain, or the like.

However, the number of multiplexers for selecting whether to use the added function is increased. When the number of multiplexers is increased, the circuit size is increased.

When the multiplexers are formed using logic circuits, the number of gate stages is increased; thus, gate delay and power consumption are increased. On the other hand, when the multiplexers are formed using path transistors, gate delay and power consumption are not increased much, but the amplitude voltage of signals selected by the multiplexers are decreased by the threshold voltage of the path transistors.

It is an object of one embodiment of the present invention to provide a semiconductor device with small circuit size. Alternatively, it is an object of one embodiment of the present invention to provide a semiconductor device capable of high-speed operation. Alternatively, it is an object of one embodiment of the present invention to provide a low-power semiconductor device. Alternatively, it is an object of one embodiment of the present invention to provide a high-quality semiconductor device or the like. Alternatively, it is an object of one embodiment of the present invention to provide a semiconductor device or the like with low off-state current. Alternatively, it is an object of one embodiment of the present invention to provide a semiconductor device or the like including a transparent semiconductor film. Alternatively, it is an object of one embodiment of the present invention to provide a novel semiconductor device or the like.

In one embodiment of the present invention, a multiplexer included in a PLE is formed using a plurality of switches each including at least two transistors. A first transistor of each switch has significantly lower off-state current than a second transistor of each switch. The first transistor has a function of controlling input of a signal including configuration data to a gate of the second transistor.

With such a structure, the on state and off state of the second transistor are determined in accordance with the signal including configuration data. In addition, since the off-state current of the first transistor is extremely low, the gate of the second transistor becomes floating, i.e., has extremely high insulating properties with another electrode or a wiring when the first transistor is off. Thus, the potential of the signal is held in the gate of the second transistor, so that the on state and off state of the second transistor that are determined in accordance with the signal are also held.

In addition, when the gate of the second transistor becomes floating, i.e., has extremely high insulating properties with another electrode or a wiring, the potential of the gate of the second transistor can be increased in accordance with a change in potential of a signal input to a source or a drain of the second transistor when the potential of the gate of the second transistor is high. Thus, even when the voltage of a signal input to the gate of the second transistor is decreased by decreasing power supply voltage supplied to a PLD, the second transistor can be turned on in accordance with configuration data, so that a decrease in on-state current can be prevented.

In one embodiment of the present invention, a structure in which Schmitt trigger logic gates are used in an LUT may be used in addition to the above structure. By using the Schmitt trigger logic gates in the LUT, even when power supply voltage supplied to the PLD is decreased, the multiplexer and the LUT can operate correctly, so that a decrease in operation speed of the LUT can be prevented.

Specifically, a programmable logic device according to one embodiment of the present invention includes a plurality of programmable logic elements whose electrical connection is controlled by first configuration data. The programmable logic element includes a look-up table in which a relationship between a logic level of an input signal and a logic level of an output signal is determined by second configuration data, a flip-flop to which the output signal of the look-up table is input, and a multiplexer. The multiplexer includes at least two switches each including a first transistor and a second transistor. A signal including third configuration data is input to a gate of the second transistor through the first transistor. The output signal of the look-up table or an output signal of the flip-flop is input to one of a source and a drain of the second transistor. The other of the source and the drain of the second transistor included in one of at least the two switches is electrically connected to the other of the source and the drain of the second transistor included in the other of at least the two switches.

In the programmable logic device according to one embodiment of the present invention, the LUT includes a plurality of logic gates. Each of the logic gates includes at least a plurality of third transistors for controlling electrical connection between a first wiring and a second wiring supplied with a first potential; a plurality of fourth transistors for controlling electrical connection between the first wiring and a third wiring supplied with a second potential that is higher than the first potential; a first node connected to one of a source and a drain of one of the plurality of third transistors and one of a source and a drain of another one of the third transistors; a fifth transistor for controlling electrical connection with a fourth wiring supplied with a third potential that is higher than the first potential; a second node connected to one of a source and a drain of one of the plurality of fourth transistors and one of a source and a drain of another one of the fourth transistors; and a sixth transistor for controlling electrical connection with a fifth wiring supplied with a fourth potential that is lower than the third potential in accordance with the potential of the first wiring.

A semiconductor device according to one embodiment of the present invention includes a multiplexer, a look-up table, and a memory. A first signal, a second signal, first configuration data, and second configuration data are input to the multiplexer. The second configuration data is obtained by inversion of the first configuration data. The multiplexer includes a first transistor, a second transistor, a third transistor, a fourth transistor, and an inverter. Voltage by which the first transistor can be turned on is applied to a gate of the first transistor. The first configuration data is input from the memory to one of a source and a drain of the first transistor. The other of the source and the drain of the first transistor is electrically connected to a gate of the second transistor. The first signal is input from the look-up table to one of a source and a drain of the second transistor. The first configuration data is input to the inverter. The second configuration data is output from the inverter. A gate of the third transistor is electrically connected to the gate of the first transistor. Voltage by which the third transistor can be turned on is applied to the gate of the third transistor. The second configuration data is input from the inverter to one of a source and a drain of the third transistor. The other of the source and the drain of the third transistor is electrically connected to a gate of the fourth transistor. The second signal is input to one of a source and a drain of the fourth transistor. The other of the source and the drain of the fourth transistor is electrically connected to the other of the source and the drain of the second transistor.

A semiconductor device according to one embodiment of the present invention includes a multiplexer, a look-up table, and a memory. A first signal, a second signal, first configuration data, and second configuration data are input to the multiplexer. The multiplexer includes a first transistor, a second transistor, a third transistor, and a fourth transistor. Voltage by which the first transistor can be turned on is applied to a gate of the first transistor. The first configuration data is input from the memory to one of a source and a drain of the first transistor. The other of the source and the drain of the first transistor is electrically connected to a gate of the second transistor. The first signal is input from the look-up table to one of a source and a drain of the second transistor. A gate of the third transistor is electrically connected to the gate of the first transistor. Voltage by which the third transistor can be turned on is applied to the gate of the third transistor. The second configuration data is input from the memory to one of a source and a drain of the third transistor. The other of the source and the drain of the third transistor is electrically connected to a gate of the fourth transistor. The second signal is input to one of a source and a drain of the fourth transistor. The other of the source and the drain of the fourth transistor is electrically connected to the other of the source and the drain of the second transistor.

In the semiconductor device according to one embodiment of the present invention, the first configuration data can turn on the second transistor; the second configuration data can turn on the fourth transistor; the fourth transistor is turned off when the second transistor is turned on; the second transistor is turned off when the fourth transistor is turned on; the third signal corresponding to the first signal is output from the other of the source and the drain of the second transistor when the second transistor is turned on; and the fourth signal corresponding to the second signal is output from the other of the source and the drain of the fourth transistor when the fourth transistor is turned on.

In the semiconductor device according to one embodiment of the present invention, a channel formation region of the first transistor includes an oxide semiconductor, and a channel formation region of the third transistor includes an oxide semiconductor film.

The semiconductor device according to one embodiment of the present invention can be used as a programmable logic device.

According to one embodiment of the present invention, a low-power PLD in which operation speed can be maintained is provided. Alternatively, according to one embodiment of the present invention, a low-power PLD that can operate correctly is provided.

According to one embodiment of the present invention, it is possible to provide a semiconductor device with small circuit size. Alternatively, according to one embodiment of the present invention, it is possible to provide a semiconductor device capable of high-speed operation. Alternatively, according to one embodiment of the present invention, it is possible to provide a low-power semiconductor device. Alternatively, according to one embodiment of the present invention, it is possible to provide a high-quality semiconductor device or the like. Alternatively, according to one embodiment of the present invention, it is possible to provide a semiconductor device or the like with low off-state current. Alternatively, according to one embodiment of the present invention, it is possible to provide a semiconductor device or the like including a transparent semiconductor film.

BRIEF DESCRIPTION OF DRAWINGS

In the accompanying drawings.

BEST MODE FOR CARRYING OUT THE INVENTION

Figure 1A:
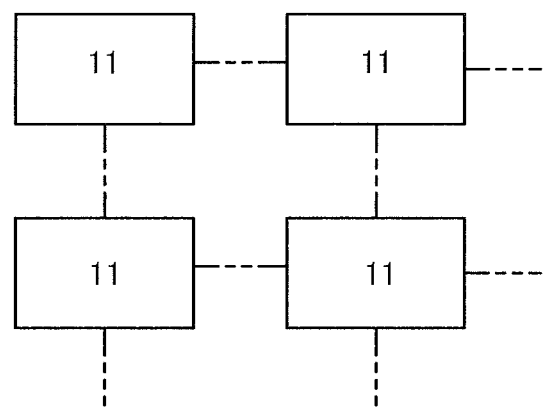
FIGS. 1A and 1B illustrate PLD and PLE structures.

Embodiments of the present invention will be described in detail below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

Note that a programmable logic device according to one embodiment of the present invention includes, in its category, a variety of semiconductor integrated circuits formed using semiconductor elements, such as microprocessors, image processing circuits, controllers for semiconductor display devices, digital signal processors (DSP), microcontrollers, control circuits for batteries such as secondary batteries, and protection circuits. The semiconductor device according to one embodiment of the present invention includes, in its category, a variety of devices such as RF tags formed using any of the semiconductor integrated circuits and semiconductor display devices. The semiconductor display device includes, in its category, liquid crystal display devices, light-emitting devices in which a light-emitting element typified by an organic light-emitting element is provided in each pixel, electronic paper, digital micromirror devices (DMD), plasma display panels (PDP), field emission displays (FED), and other semiconductor display devices in which semiconductor elements are included in driver circuits.

Note that in this specification, the term "connection" means electrical connection and corresponds to a state where current, voltage, or a potential can be supplied or transmitted. Accordingly, a connection state does not always mean a direct connection state but includes an electrical connection state through a circuit element such as a wiring, a resistor, a diode, or a transistor so that current, voltage, or a potential can be supplied or transmitted.

Although the block diagram attached to this specification shows elements classified according to their functions in independent blocks, it might be practically difficult to completely separate the elements according to their functions, and one element might be involved in a plurality of functions.

A source of a transistor means a source region that is part of a semiconductor film functioning as an active layer or a source electrode that is electrically connected to the semiconductor film. Similarly, a drain of a transistor means a drain region that is part of a semiconductor film functioning as an active layer or a drain electrode that is electrically connected to the semiconductor film. A gate means a gate electrode.

The terms "source" and "drain" of a transistor interchange with each other depending on the conductivity type of the transistor or levels of potentials applied to terminals. In general, in an n-channel transistor, a terminal to which a low potential is applied is called a source, and a terminal to which a high potential is applied is called a drain. Further, in a p-channel transistor, a terminal to which a low potential is applied is called a drain, and a terminal to which a high potential is applied is called a source. In this specification, although the connection relationship of the transistor is described assuming that the source and the drain are fixed in some cases for convenience, actually, the names of the source and the drain interchange with each other depending on the relationship of the potentials.

Embodiment 1

<PLD Structure Example>

FIG. 1A is a block diagram illustrating a structure example of a programmable logic device (PLD) according to one embodiment of the present invention.

As illustrated in FIG. 1A, a PLD 10 includes a plurality of programmable logic elements (PLE) 11. Electrical connection between the PLEs 11 is controlled in accordance with configuration data including data for specifying connection between the PLEs 11.

Specifically, the PLEs 11 can be connected to each other by a wiring element that includes a wiring group including a plurality of wirings and a switch for controlling connection between the wirings included in the wiring group in accordance with configuration data.

Figure 1B:
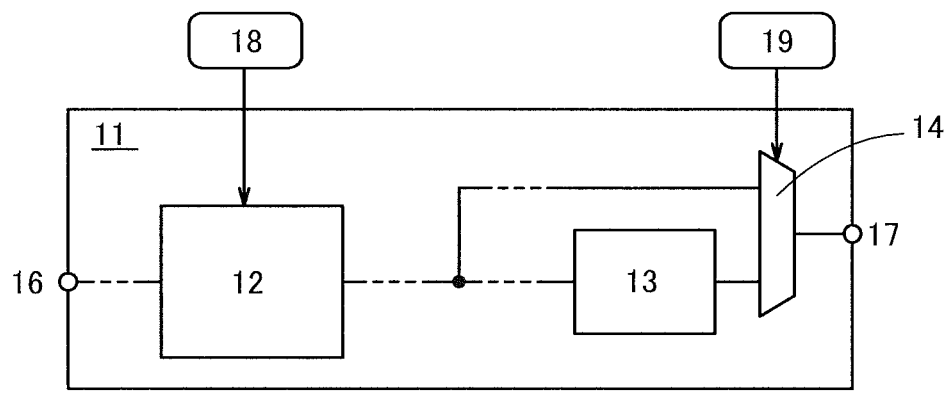

FIG. 1B is a block diagram illustrating a structure example of the PLE 11. The PLE 11 includes at least a look-up table (LUT) 12, a flip-flop (FF) 13, and a multiplexer (MUX) 14.

Configuration data 18 including data for specifying the function of the LUT 12 as a logic gate is input to the LUT 12. In other words, a relationship between a logic level of a signal input from a terminal 16 to the LUT 12 and a logic level of a signal output from the LUT 12 is determined in accordance with the configuration data 18.

The signal output from the LUT 12 is input to the FF 13. A signal output from the FF 13 included in one PLE 11 might be input to the FF 13 included in another PLE 11. The FF 13 has a function of holding these input signals.

Configuration data 19 including data for controlling the operation of the MUX 14 is input to the MUX 14. The MUX 14 has a function of selecting any one of a signal output from the LUT 12 and a signal output from the FF 13 in accordance with the configuration data 19. The signal selected by the MUX 14 is output from a terminal 17 of the PLE 11.

<Multiplexer Structure Example>

Figure 2:
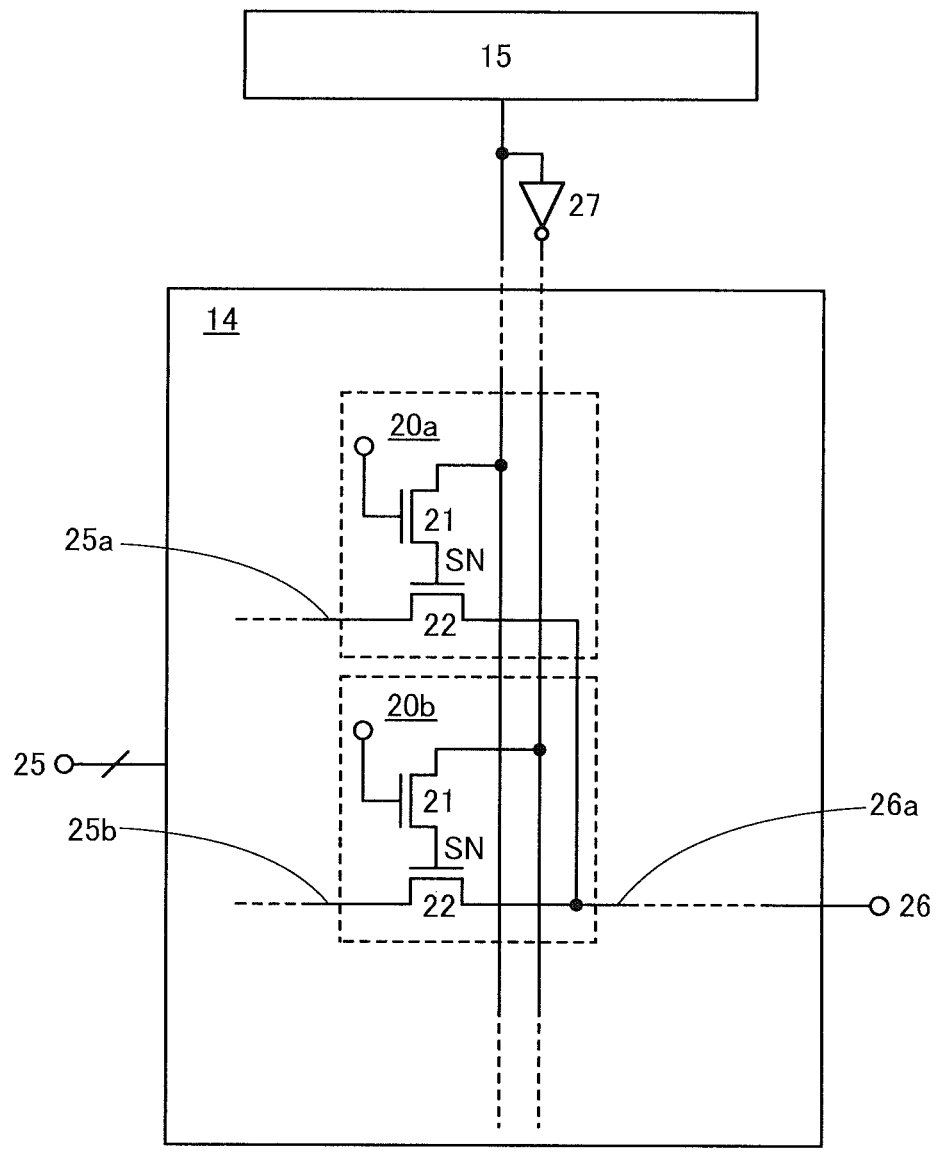
FIG. 2 illustrates a multiplexer structure.

FIG. 2 illustrates a specific structure example of the MUX 14. The MUX 14 in FIG. 2 includes at least a switch 20*a* and a switch 20*b*. The MUX 14 has a function of selecting any one of signals input to a plurality of wirings 25 by controlling the operation of the switch 20*a* and the switch 20*b* in accordance with a signal including configuration data that is input from a configuration memory (CM) 15 and a function of supplying the selected signal to a wiring 26. The configuration memory corresponds to a register for storing configuration data.

Given that a wiring 25*a* is one of the plurality of wirings 25, specifically, the switch 20*a* has a function of controlling whether to supply a signal input to the wiring 25*a* to a wiring 26*a* in response to a signal including configuration data that is input from the CM 15. Further, given that a wiring 25*b* is another one of the plurality of wirings 25, specifically, the switch 20*b* has a function of controlling whether to supply a signal input to the wiring 25*b* to a wiring 26*b* in response to a signal including configuration data that is input from the CM 15.

The switch 20*a* and the switch 20*b* each include a transistor 21 and a transistor 22. The transistor 21 has a function of controlling input of a signal including configuration data to a gate of the transistor 22. The on state or off state of the transistor 22 is determined in accordance with a signal including configuration data that is input to the gate of the transistor 22. When the transistor 22 is on, a signal input to the wiring 25*a* or the wiring 25*b* is supplied to the wiring 26*a* through the transistor 22. On the other hand, when the transistor 22 is off, a signal input to the wiring 25*a* or the wiring 25*b* is not supplied to the wiring 26*a*.

Specifically, a signal including configuration data is input to one of a source and a drain of the transistor 21, and the other of the source and the drain of the transistor 21 is connected to the gate of the transistor 22. One of a source and a drain of the transistor 22 is connected to the wiring 25*a* or the wiring 25*b*, and the other of the source and the drain of the transistor 22 is connected to the wiring 26*a*.

Logic levels of signals including configuration data that are input to the switch 20*a* and the switch 20*b* are different from each other. Specifically, FIG. 2 illustrates the case where a signal input to the switch 20*a* whose logic level is inverted by an inverter 27 is input to the switch 20*b*. Note that the signals whose logic levels are different from each other may be input to the switch 20*a* and the switch 20*b* without the use of the inverter 27.

Note that although FIG. 2 illustrates the case where the MUX 14 does not include the inverter 27, the MUX 14 may include the inverter 27.

With such a structure, the transistor 22 is turned on in one of the switch 20*a* and the switch 20*b*, and the transistor 22 is turned off in the other of the switch 20*a* and the switch 20*b*. In other words, only one of the signals input to the wiring 25*a* and the wiring 25*b* is selected by the switch 20*a* and the switch 20*b* to be supplied to the wiring 26*a*.

Note that depending on the number of the plurality of wirings 25, the plurality of switches 20*a* and the plurality of switches 20*b* are provided in the MUX 14. In such a case, the plurality of wirings 26*a* to which signals selected by the plurality of switches 20*a* and the plurality of switches 20*b* are input are provided in the MUX 14. The MUX 14 in the above case further includes one or more switches 20*a* and one or more switches 20*b* for selecting the signals input to the plurality of wirings 26*a*. By selecting signals with the plurality of switches 20*a* and the plurality of switches 20*b* repeatedly, one signal is supplied to the wiring 26 eventually.

In one embodiment of the present invention, the transistor 21 has significantly lower off-state current than the transistor 22. A transistor in which a channel formation region is formed in a film of a semiconductor with a wider bandgap and lower intrinsic carrier density than silicon can have extremely low off-state current and thus is preferably used as the transistor 21. Examples of such a semiconductor are an oxide semiconductor and gallium nitride whose bandgap is 2 or more times that of silicon. A transistor including the semiconductor can have significantly lower off state current than a transistor including a normal semiconductor such as silicon or germanium.

The transistor 21 with such a structure can prevent leakage of electric charge held in a node SN connected to the gate of the transistor 22 when the transistor 21 is off. When the electric charge is held in the node SN, the on state or off state of the transistor 22 is kept; thus, signals are selected continuously by the switch 20a and the switch 20b.

Since the node SN becomes floating in the switch 20a and the switch 20b when the transistor 21 is off, a boosting effect described below can be expected. In other words, when the node SN is floating in the switch 20a and the switch 20b, the potential of the node SN is increased by capacitance Cgs generated between the source and the gate of the transistor 22 as the potential of the wiring 25a or the wiring 25b is changed from a low level to a high level. The increase in potential of the node SN depends on the logic level of configuration data input to the gate of the transistor 22. Specifically, when configuration data written to the switch 20a and the switch 20b is "0", the transistor 22 is in a weak inversion mode, so that the capacitance Cgs that contributes to the increase in potential of the node SN includes capacitance Cos that is independent of the potential of the gate electrode, that is, the potential of the node SN. Specifically, the capacitance Cos includes overlap capacitance generated in a region where the gate electrode and the source region overlap with each other, and parasitic capacitance generated between the gate electrode and the source electrode, for example. On the other hand, when configuration data written to the switch 20a and the switch 20b is "1", the transistor 22 is in a strong inversion mode, so that the capacitance Cgs that contributes to the increase in potential of the node SN includes, in addition to the capacitance Cos, capacitance Cod generated between the gate electrode and the drain electrode and part of capacitance Cox generated between the channel formation region and the gate electrode. Thus, the capacitance Cgs that contributes to the increase in potential of the node SN at the time when the configuration data is "1" is larger than the capacitance Cgs at the time when the configuration data is "0". Consequently, the switch 20a and the switch 20b can obtain a boosting effect such that the potential of the node SN at the time when the configuration data is "1" becomes higher than the potential of the node SN at the time when the configuration data is "0" with a change in the potential of the wiring 25a or the wiring 25b. Accordingly, the transistor 22 can be turned on reliably and the switching speed of the switch 20a and the switch 20b can be increased because the potential of the node SN can be increased by the boosting effect even when the potential of the node SN is decreased by the threshold voltage of the transistor 21 in the case where the configuration data is "1". The transistor 22 can be turned off reliably in the case where the configuration data is "0".

In one embodiment of the present invention, by lowering power supply voltage supplied to the PLD, even when the voltage of a signal input to the gate of the transistor 22 is lowered, that is, even when a potential applied to the gate is lowered, the switch MUX 14 can correctly operate by the boosting effect. Thus, even when power supply voltage supplied to the PLD is lowered, it is possible to prevent a change in logic level of a signal output from the PLE and to prevent malfunction of the PLD.

<Switch Operation Example>

Figure 3A:
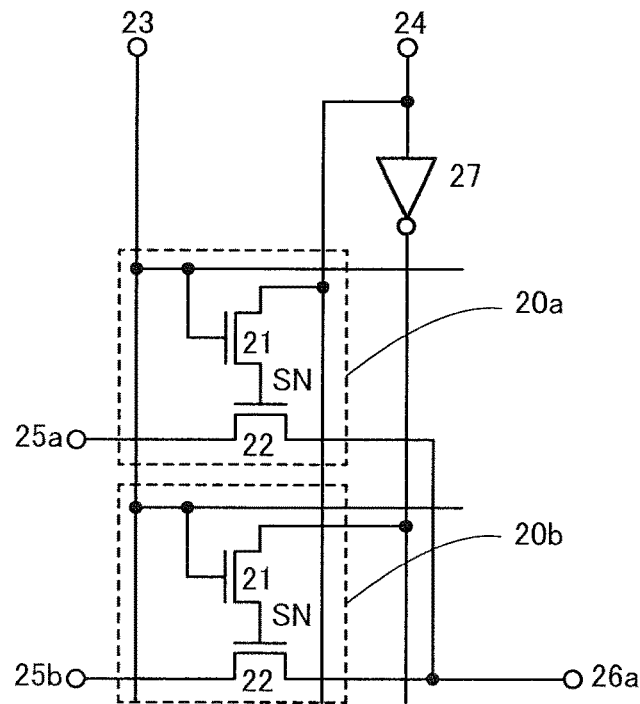
FIGS. 3A and 3B illustrate a structure and a timing chart of the multiplexer.
Figure 3B:
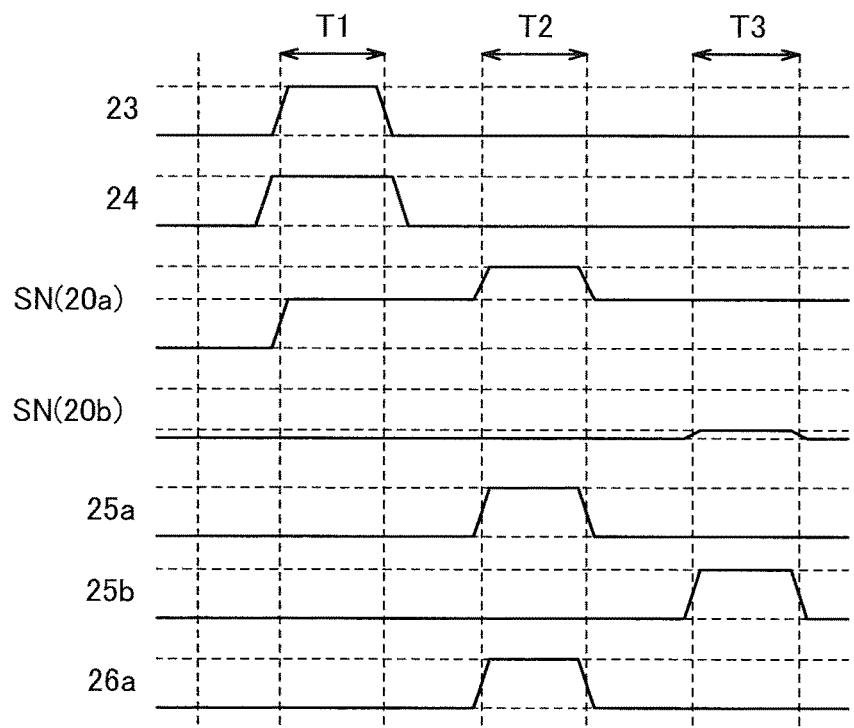

Next, an operation example of the switch 20a and the switch 20b in FIG. 2 is described. FIG. 3A illustrates a connection example of the switch 20a, the switch 20b, and the wirings in FIG. 2. FIG. 3B is a timing chart example of signals input to the wirings and the potential of the node SN connected to the gate of the transistor 22.

In each of the switch 20a and the switch 20b in FIG. 3A, the gate of the transistor 21 is connected to a wiring 23. One of the source and the drain of the transistor 21 in the switch 20a is connected to a wiring 24. One of the source and the drain of the transistor 21 in the switch 20b is connected to an output terminal of the inverter 27. An input terminal of the inverter 27 is connected to the wiring 24.

As illustrated in FIG. 3B, when a high-level potential is applied to the wiring 23 in a period T1, the transistor 21 in each of the switch 20a and the switch 20b is turned on. When a high-level potential corresponding to a logic level "1" is applied to the wiring 24, the high-level potential corresponding to the logic level "1" is applied to the node SN in the switch 20a through the transistor 21. A low-level potential corresponding to a logic level "0" is applied to the node SN in the switch 20b through the transistor 21. Note that the potential applied to the node SN in the switch 20a is lower than the potential of the wiring 24 by the threshold voltage of the transistor 21.

After the period T1, a low-level potential is applied to the wiring 23. Then, the transistor 21 in each of the switch 20a and the switch 20b is turned off. Thus, the potential of the node SN is held in each of the switch 20a and the switch 20b.

Next, in a period T2, the potential of the wiring 25a is changed from a low level to a high level, and a low-level potential is applied to the wiring 25b. The node SN in the switch 20a is floating and the transistor 22 is in a strong inversion mode; thus, the potential of the node SN is further increased as the potential of the wiring 25a is changed from a low level to a high level by the boosting effect. On the other hand, in the switch 20b, a low-level potential is applied to the wiring 25b and the transistor 22 is in a weak inversion mode; thus, the potential of the node SN is kept at a low level. Accordingly, the transistor 22 in the switch 20a is on and the transistor 22 in the switch 20b is off, so that the potential of the wiring 25a is applied to the wiring 26a through the switch 20a and the potential of the wiring 26a is set to a high level.

Next, in a period T3, a low-level potential is applied to the wiring 25a, and the potential of the wiring 25b is changed from a low level to a high level. The node SN in the switch 20a is floating and the transistor 22 is in a strong inversion mode. However, the potential of the wiring 25a is at a low level; thus, the node SN holds the potential applied in the period T1, i.e., the potential that is lower than the potential of the wiring 24 by the threshold voltage of the transistor 21. On the other hand, the node SN in the switch 20b is floating; thus, the potential of the node SN is increased as the potential of the wiring 25b is changed from a low level to a high level by the boosting effect. Note that in the switch 20b, the transistor 22 is in a weak inversion mode; thus, the increase in potential of the node SN is smaller than the increase in potential of the node SN in the switch 20a in the period T2. Thus, the transistor 22 in the switch 20b is kept off. Accordingly, the potential of the wiring 25a is at a low level and the transistor 22 in the switch 20b is off, so that the potential of the wiring 26a is set to a low level.

Figure 4:
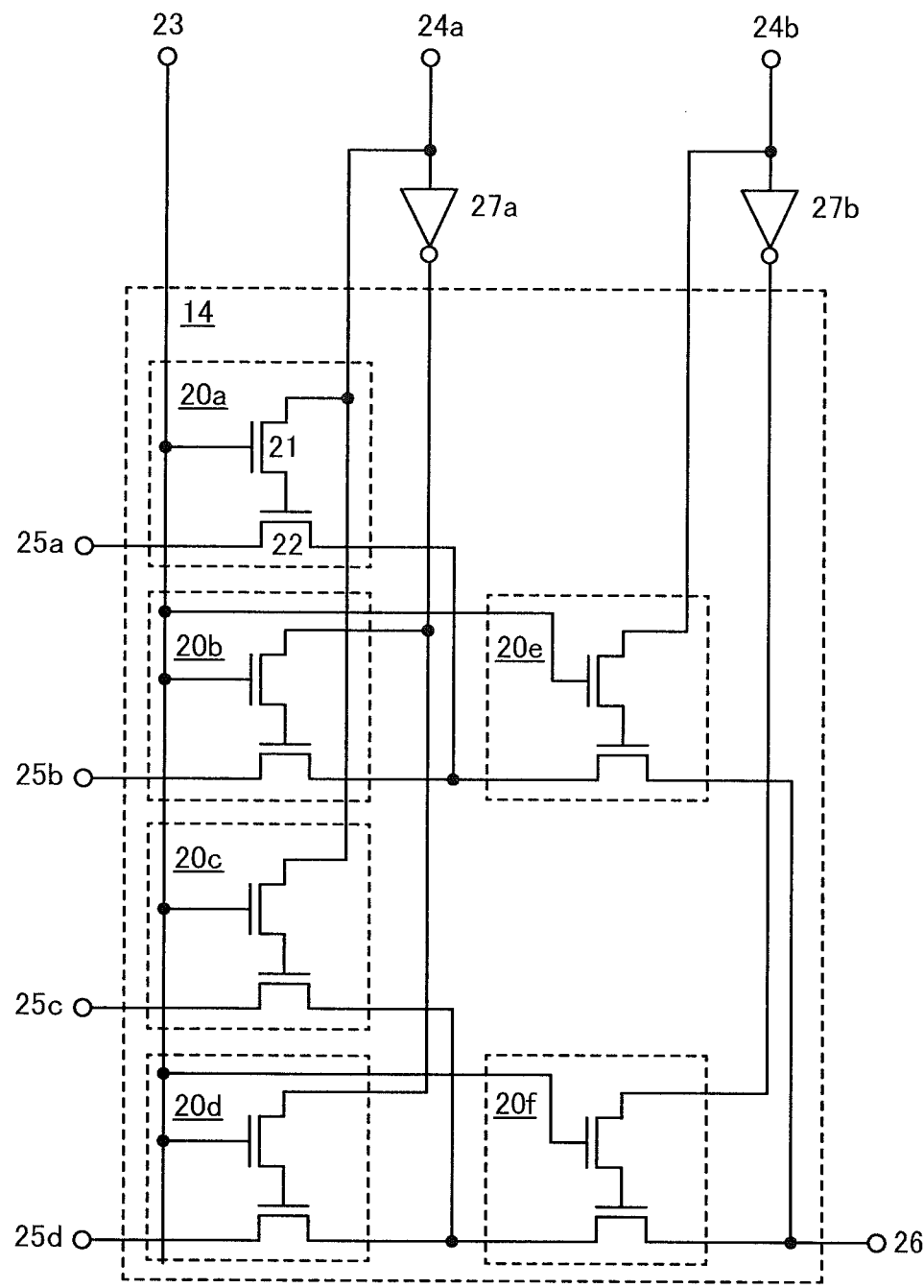
FIG. 4 illustrates a multiplexer structure.

Then, FIG. 4 illustrates a structure example of the MUX 14 to which a 2-bit signal is input. The MUX 14 in FIG. 4 includes six switches 20a to 20f. The switches 20a to 20f each include the transistor 21 and the transistor 22. Connection between the transistor 21 and the transistor 22 is the same as that of the MUX 14 in FIG. 2.

Note that in the MUX 14 in FIG. 4, one of the source and the drain of the transistor 21 included in each of the switch 20a and the switch 20c is connected to a wiring 24a to which a signal including configuration data is input. One of the source and the drain of the transistor 21 in each of the switch 20b and the switch 20d is connected to an output terminal of an inverter 27a. An input terminal of the inverter 27a is connected to the wiring 24a. Further, one of the source and the drain of the transistor 21 included in the switch 20e is connected to a wiring 24b to which a signal including configuration data is input. One of the source and the drain of the transistor 21 in the switch 20f is connected to an output terminal of an inverter 27b. An input terminal of the inverter 27b is connected to the wiring 24b.

In addition, in the MUX 14 in FIG. 4, one of the source and the drain of the transistor 22 in each of the switches 20a to 20d is connected to the wirings 25a and 25b and wirings 25c and 25d. The other of the source and the drain of the transistor 22 in each of the switch 20a and the switch 20b is connected to one of the source and the drain of the transistor 22 in the switch 20e. The other of the source and the drain of the transistor 22 in each of the switch 20c and the switch 20d is connected to one of the source and the drain of the transistor 22 in the switch 20f. The other of the source and the drain of the transistor 22 in each of the switch 20e and the switch 20f is connected to the wiring 26.

In the MUX 14 in FIG. 4, the on state and off state of the transistor 22 are determined in accordance with signals including configuration data that are input from the wiring 24a and the wiring 24b. Any one of signals input to the wirings 25a to 25d is selected by the switches 20a to 20f in accordance with configuration data and is input to the wiring 26.

Figure 5:
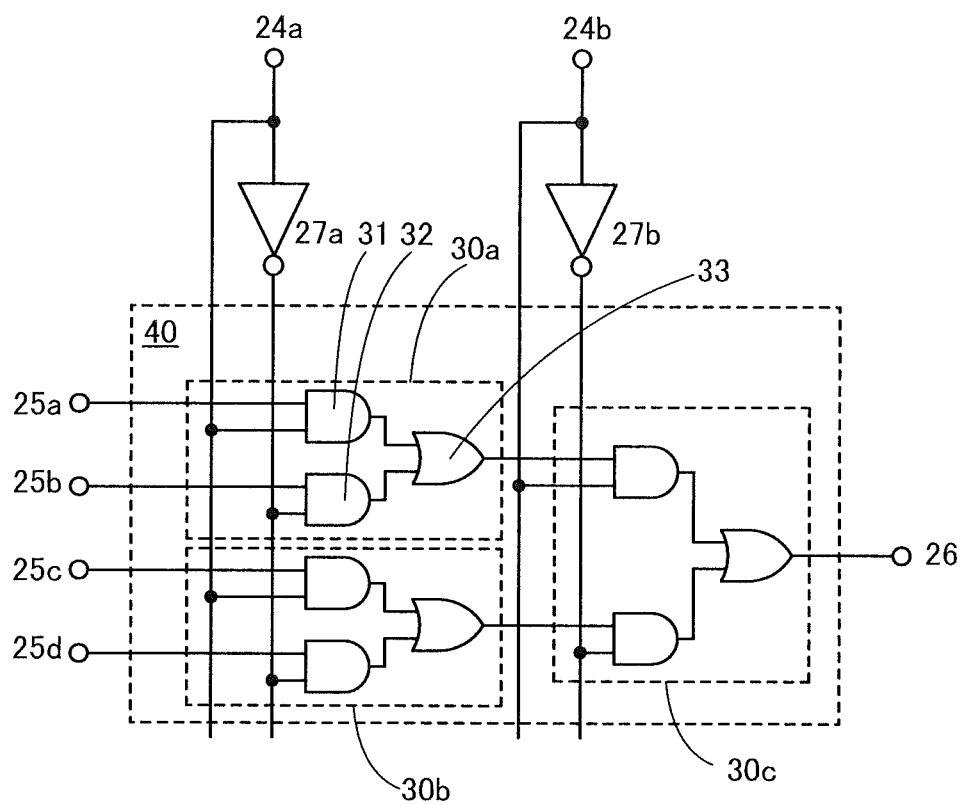
FIG. 5 illustrates a multiplexer structure.

FIG. 5 illustrates the structure of an MUX 40 that includes AO gates and is supplied with 2-bit signals like the MUX 14 in FIG. 4.

The MUX 40 in FIG. 5 includes three AO gates 30 (AO gates 30a to 30c). The AO gates 30a to 30c each include an AND circuit 31, an AND circuit 32, and an OR circuit 33. An output terminal of the AND circuit 31 is connected to a first input terminal of the OR circuit 33. An output terminal of the AND circuit 32 is connected to a second input terminal of the OR circuit 33.

In the AO gate 30a, a first input terminal of the AND circuit 31 is connected to the wiring 25a, and a second input terminal of the AND circuit 31 is connected to the wiring 24a. In the AO gate 30a, a first input terminal of the AND circuit 32 is connected to the wiring 25b, and a second input terminal of the AND circuit 32 is connected to the output terminal of the inverter 27a. The input terminal of the inverter 27 is connected to the wiring 24a.

In the AO gate 30b, the first input terminal of the AND circuit 31 is connected to the wiring 25c, and the second input terminal of the AND circuit 31 is connected to the wiring 24a. In the AO gate 30b, the first input terminal of the AND circuit 32 is connected to the wiring 25d, and the second input terminal of the AND circuit 32 is connected to the output terminal of the inverter 27a.

In the AO gate 30c, the first input terminal of the AND circuit 31 is connected to an output terminal of the OR circuit 33 in the AO gate 30a, and the second input terminal of the AND circuit 31 is connected to the wiring 24b. In the AO gate 30c, the first input terminal of the AND circuit 32 is connected to the output terminal of the OR circuit 33 in the AO gate 30b, and the second input terminal of the AND circuit 32 is connected to the output terminal of the inverter 27b. The input terminal of the inverter 27b is connected to the wiring 24b. The output terminal of the OR circuit 33 in the AO gate 30c is connected to the wiring 26.

In the MUX 40 in FIG. 5, a plurality of logic gates (e.g., the AND circuit 31, the AND circuit 32, and the OR circuit 33) are connected between each of the wirings 25a to 25d and the wiring 26. On the other hand, in the MUX 14 in FIG. 4, two transistors 22 are connected to each other in series between each of the wirings 25a to 25d and the wiring 26. Note that the AND circuit is a combination of a NAND circuit and an inverter, and the OR circuit is a combination of a NOR circuit and an inverter. Thus, the number of gate stages, i.e., the number of signal transmissions between a gate and a source or a drain of a transistor is 0 in the switch 20 of the MUX 14, whereas the number of gate stages, i.e., the number of signal transmissions is 4 in the AO gate 30 of the MUX 40. In the MUX 14, voltage drops of signals input to the wiring 26 through the two transistors 22 due to the threshold voltage of the transistors 22 hardly occur by the boosting effect. Consequently, signal delay time of the MUX 14 according to one embodiment of the present invention is shorter than that of the MUX 40 including the plurality of logic gates.

Note that in this specification, a state in which transistors are connected to each other in series means, for example, a state in which only one of a source and a drain of a first transistor is connected to only one of a source and a drain of a second transistor. In addition, a state in which transistors are connected to each other in parallel means a state in which one of a source and a drain of a first transistor is connected to one of a source and a drain of a second transistor and the other of the source and the drain of the first transistor is connected to the other of the source and the drain of the second transistor.

Circuit dynamic power consumption P is represented by Expression 1. Note that a, f, n, $C_{load}$, and Vd mean an activation rate, operating frequency, the number of elements, element load capacitance, and power supply voltage, respectively.

$$P = a \times f \times C_{load} \times Vd^2 \times n \qquad \text{(Expression 1)}$$

In the MUX 40, the AO gates 30a to 30c each include the AND circuit 31, the AND circuit 32, and the OR circuit 33. A signal input to one of the wirings 25a and 25b is input to the wiring 26 through the OR circuit 33 and one of the AND circuits 31 and 32. Thus, in the case where the logic levels of signals input from the wirings 24a and 24b are fixed, the number of gate stages in each of the AO gates 30a to 30c is 4 and the activation rate of each stage is ½; thus, the activation rate α is 2.

Even when the AND circuit 31 and the AND circuit 32 in FIG. 5 are replaced with NAND circuits and the OR circuit 33 is replaced with a NAND circuit, their logic gate functions are the same as those of the AO gates 30. In the case where the MUX 40 includes logic gates of three NAND circuits, the number of gate stages in each logic gate is 2 and the activation rate of each stage is ½; thus, the activation rate α is 1.

On the other hand, in the MUX 14, the number of elements n is smaller than that of the MUX 40 with two gate stages in each logic gate. Thus, Expression 1 indicates that the power consumption P of the MUX 14 can be significantly lower than that of the MUX 40 with two gate stages in each logic gate.

The MUX 40 with two gate stages in each logic gate has many paths for leakage current or flow-through current, and the number of paths for leakage current or flow-through current of the MUX 14 is smaller than that of the MUX 40 with two gate stages in each logic gate. Thus, power consumption caused by leakage current or flow-through current in the MUX 14 is lower than that in the MUX 40.

<LUT Structure Example>

Figure 6:
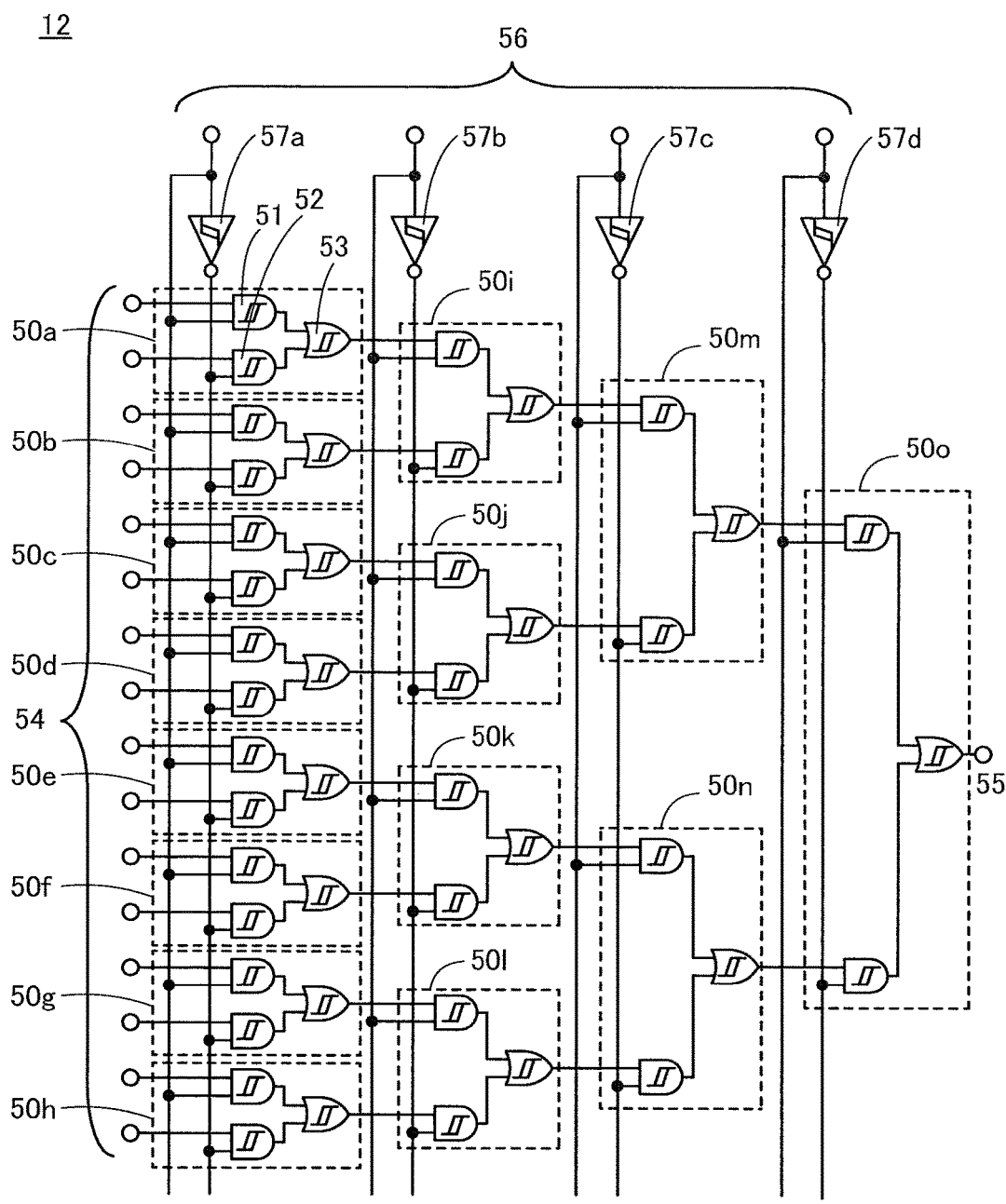
FIG. 6 illustrates a look-up table structure.

Next, FIG. 6 illustrates a structure example of the LUT 12. The LUT 12 in FIG. 6 includes a plurality of AO gates 50 in which output terminals of two AND circuits are connected to two input terminals of an OR circuit.

Specifically, the LUT 12 in FIG. 6 includes the plurality of AO gates 50 (AO gates 50a to 50o). Specifically, in the LUT 12, the AO gate 50i is connected to a subsequent stage of the AO gates 50a and 50b. The AO gate 50j is connected to a subsequent stage of the AO gates 50c and 50d. The AO gate 50k is connected to a subsequent stage of the AO gates 50e and 50f. The AO gate 50l is connected to a subsequent stage of the AO gates 50g and 50h. The AO gate 50m is connected to a subsequent stage of the AO gates 50i and 50j. The AO gate 50n is connected to a subsequent stage of the AO gates 50k and 50l. The AO gate 50o is connected to a subsequent stage of the AO gates 50m and 50n.

Each AO gate 50 includes an AND circuit 51, an AND circuit 52, and an OR circuit 53. An output terminal of the AND circuit 51 and an output terminal of the AND circuit 52 are connected to two input terminals of the OR circuit 53. In each AO gate 50, a first input terminal of the AND circuit 51 and a first input terminal of the AND circuit 52 are connected to one of a plurality of wirings 54 or an output terminal of the OR circuit 53 included in the AO gate 50 in a preceding stage. A second input terminal of the AND circuit 51 is connected to one of a plurality of wirings 56 to which a signal including configuration data is input. A second input terminal of the AND circuit 52 is connected to an output terminal of any one of a plurality of inverters 57 (inverters 57a to 57d). Input terminals of the inverters 57a to 57d are connected to the plurality of wirings 56. An output terminal of the OR circuit 53 included in the AO gate 50o in the final stage is connected to a wiring 55.

In one embodiment of the present invention, the AND circuit 51, the AND circuit 52, the OR circuit 53, and the inverters 57a to 57d are Schmitt trigger logic gates. By using the Schmitt trigger logic gates in the LUT 12, even when power supply voltage supplied to the PLD is decreased, the multiplexer and the LUT 12 can operate correctly, so that a decrease in operation speed of the LUT 12 can be prevented.

<Schmitt Trigger Logic Gate Structure Example>

Figures 7A, 7B:
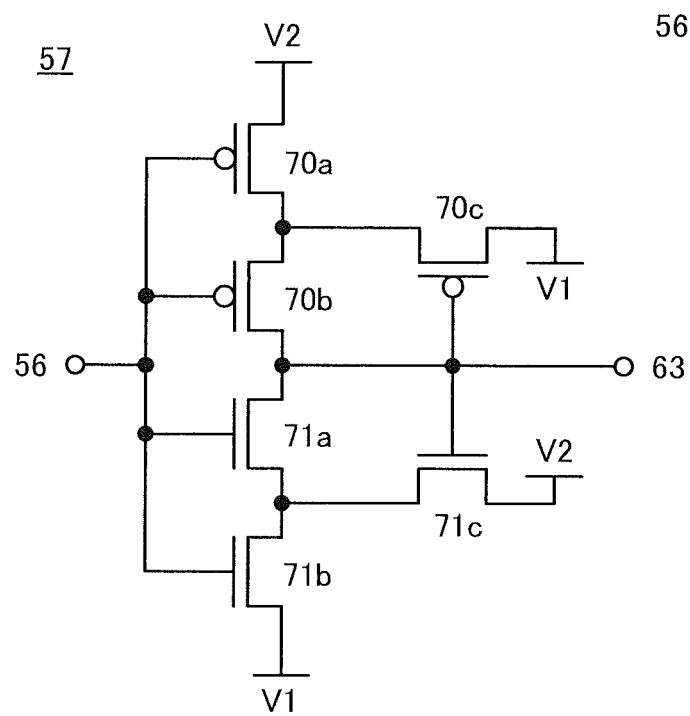
FIGS. 7A and 7B illustrate an inverter structure.

FIG. 7A illustrates a structure example of the inverter 57. Note that an input terminal and an output terminal of the inverter 57 in FIG. 7A are connected to the wiring 56 and a wiring 63, respectively, as illustrated in FIG. 7B.

The inverter 57 in FIG. 7A includes p-channel transistors 70a to 70c and n-channel transistors 71a to 71c. The transistors 71a and 71b are connected to each other in series between the wiring 63 and a wiring to which a potential V1 is applied. The transistor 71c has a function of controlling electrical connection between a node to which one of a source and a drain of the transistor 71a and one of a source and a drain of the transistor 71b are connected and a wiring to which a potential V2 higher than the potential V1 is applied, in accordance with the potential of the wiring 63. The transistors 70a and 70b are connected to each other in series between the wiring 63 and a wiring to which the potential V2 is applied. The transistor 70c has a function of controlling electrical connection between a node to which one of a source and a drain of the transistor 70a and one of a source and a drain of the transistor 70b are connected and a wiring to which the potential V1 is applied, in accordance with the potential of the wiring 63. Gates of the transistors 70a and 70b and the transistors 71a and 71b are connected to the wiring 56.

When power supply voltage applied to the PLD is decreased, a difference between a low-level potential and a high-level potential applied to the wiring 56 is decreased. In that case, depending on the threshold voltage of the transistor included in the inverter 57, the transistor 71a and the transistor 71b cannot be turned off completely even when the potential of the wiring 56 is at a low level, or the transistor 70a and the transistor 70b cannot be turned off completely even when the potential of the wiring 56 is at a high level. Thus, the potential of the wiring 63 might be decreased when the potential should be at a high level, or the potential of the wiring 63 might be increased when the potential should be at a low level.

However, in the Schmitt trigger inverter 57 as illustrated in FIG. 7A, not only the transistor 70a and the transistor 70b but also the transistor 71c is turned on when a low-level potential is applied to the wiring 56, for example. Thus, the potential V2 can be applied to the source and the drain of the transistor 71a. Accordingly, the drain current of the transistor 71a is almost zero, so that a decrease in potential of the wiring 63 can be prevented. In contrast, not only the transistor 71a and the transistor 71b but also the transistor 70c is turned on when a high-level potential is applied to the wiring 56, for example. Thus, the potential V1 can be applied to the source and the drain of the transistor 70b. Accordingly, the drain current of the transistor 70b is made close to zero, so that an increase in potential of the wiring 63 can be prevented.

Figure 8A:
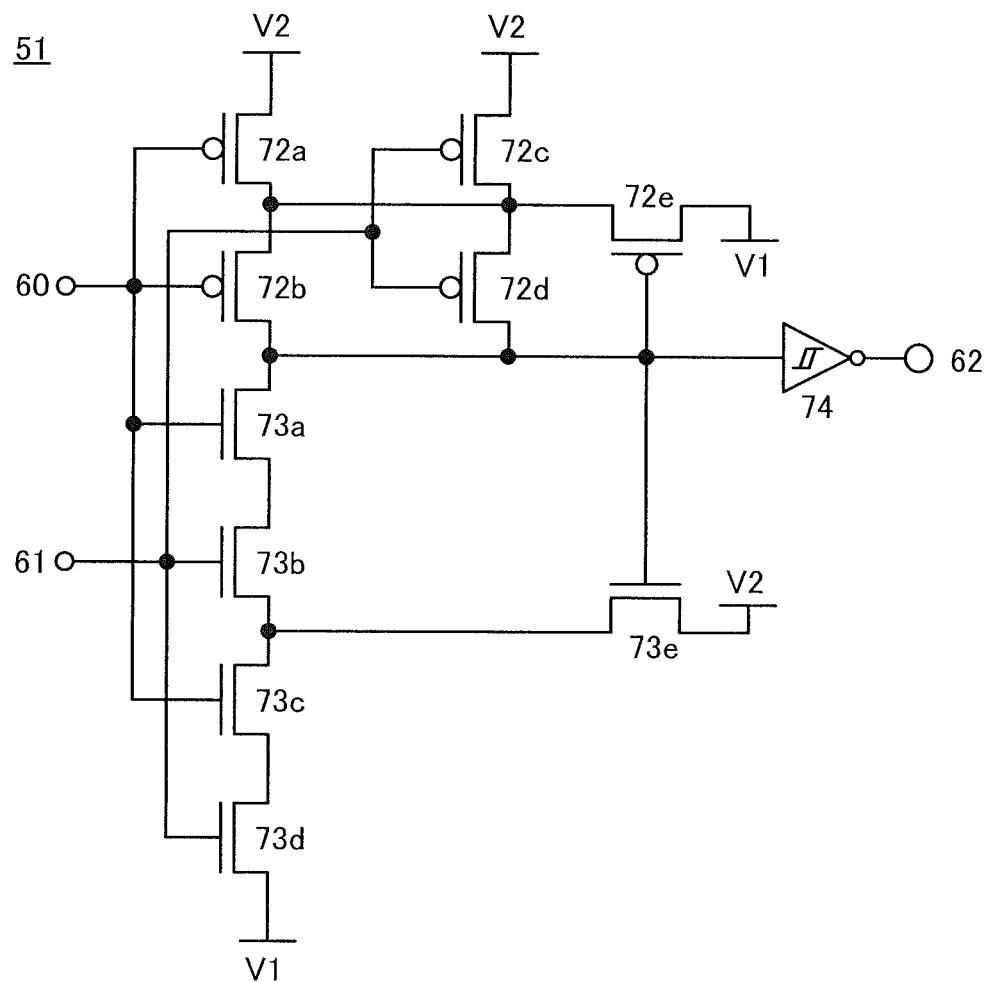
FIGS. 8A and 8B illustrate an AND circuit structure.
Figure 8B:
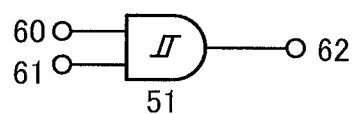

Next, FIG. 8A illustrates a structure example of the AND circuit 51. Note that a first input terminal, a second input terminal, and an output terminal of the AND circuit 51 in FIG. 8A are connected to a wiring 60, a wiring 61, and a wiring 62, respectively, as illustrated in FIG. 8B. The AND circuit 52 may have the same structure as the AND circuit 51 in FIG. 8A.

The AND circuit 51 in FIG. 8A includes p-channel transistors 72a to 72e, n-channel transistors 73a to 73e, and a Schmitt trigger inverter 74. FIG. 7A can be referred to for the specific structure of the inverter 74.

The transistors 72a and 72b are connected to each other in series between a wiring to which the potential V2 is applied and an input terminal of the inverter 74. The transistors 72c and 72d are connected to each other in series between a wiring to which the potential V2 is applied and the input terminal of the inverter 74. The transistor 72e has a function of controlling electrical connection between a node to which one of a source and a drain of the transistor 72a, one of a source and a drain of the transistor 72b, one of a source and a drain of the transistor 72c, and one of a source and a drain of the transistor 72d are connected and a wiring to which the potential V1 is applied, in accordance with the potential of the input terminal of the inverter 74. The transistors 73a to 73d are connected to each other in series between the input terminal of the inverter 74 and a wiring to which the potential V1 is applied. The transistor 73e has a function of controlling electrical connection between a node to which one of a source and a drain of the transistor 73b and one of a source and a drain of the transistor 73c are connected and a wiring to which the potential V2 is applied, in accordance with the potential of the input terminal of the inverter 74. An output terminal of the inverter 74 is connected to the wiring 62. Gates of the transistors 72a and 72b and the transistors 73a and 73c are connected to the wiring

60. Gates of the transistors 72c and 72d and the transistors 73b and 73d are connected to the wiring 61.

Like the inverter 57 in FIG. 7A, even when power supply voltage applied to the PLD is decreased, the AND circuit 51 in FIG. 8A can prevent a decrease in potential of the wiring 62 when the potential should be at a high level or an increase in potential of the wiring 62 when the potential should be at a low level.

Figure 9A:
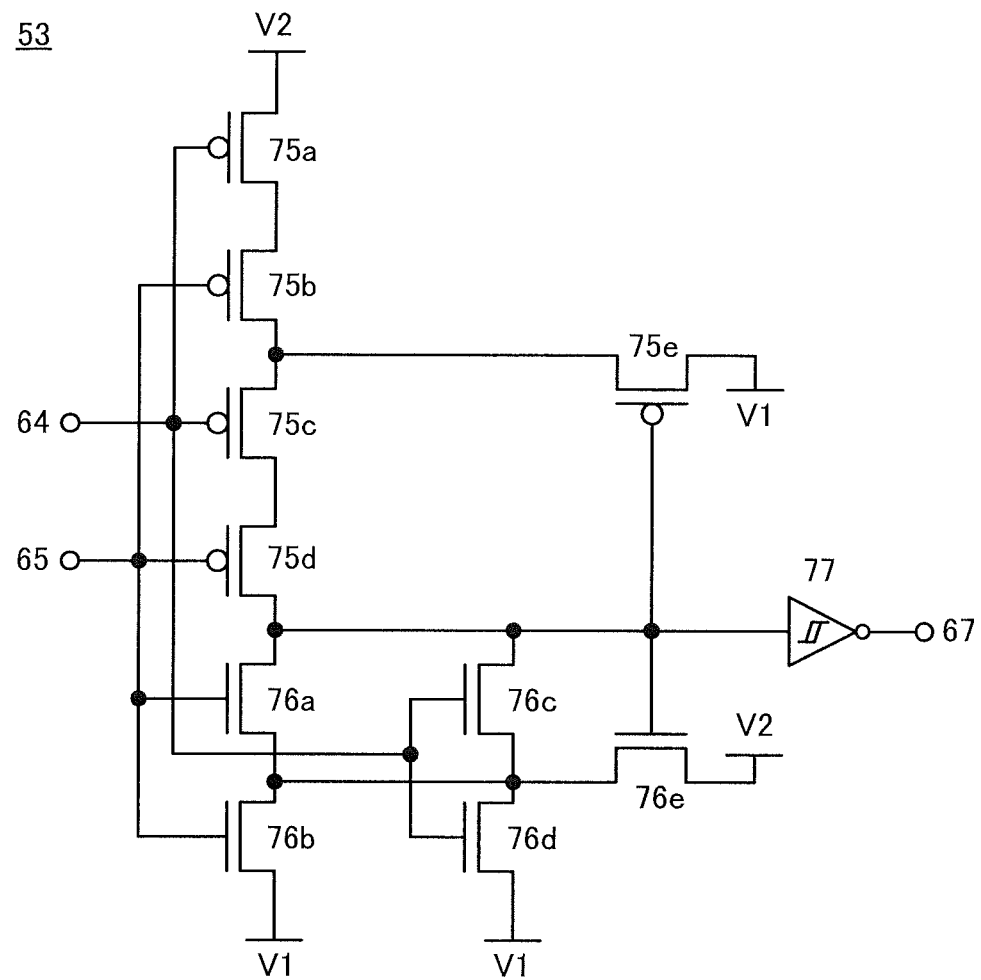
FIGS. 9A and 9B illustrate an OR circuit structure.
Figure 9B:
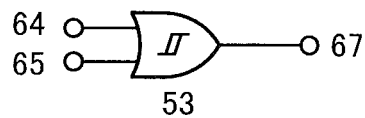

Next, FIG. 9A illustrates a structure example of the OR circuit 53. Note that a first input terminal, a second input terminal, and an output terminal of the OR circuit 53 in FIG. 9A are connected to a wiring 64, a wiring 65, and a wiring 67, respectively, as illustrated in FIG. 9B.

The OR circuit 53 in FIG. 9A includes p-channel transistors 75a to 75e, n-channel transistors 76a to 76e, and a Schmitt trigger inverter 77. FIG. 7A can be referred to for the specific structure of the inverter 77.

The transistors 75a to 75d are connected to each other in series between a wiring to which the potential V2 is applied and an input terminal of the inverter 77. The transistor 75e has a function of controlling electrical connection between a node to which one of a source and a drain of the transistor 75b and one of a source and a drain of the transistor 75c are connected and a wiring to which the potential V1 is applied, in accordance with the potential of the input terminal of the inverter 77. The transistors 76a and 76b are connected to each other in series between the input terminal of the inverter 77 and a wiring to which the potential V1 is applied. The transistors 76c and 76d are connected to each other in series between the input terminal of the inverter 77 and a wiring to which the potential V1 is applied. The transistor 76e has a function of controlling electrical connection between a node to which one of a source and a drain of the transistor 76a, one of a source and a drain of the transistor 76b, one of a source and a drain of the transistor 76c, and one of a source and a drain of the transistor 76d are connected and a wiring to which the potential V2 is applied, in accordance with the potential of the input terminal of the inverter 77. An output terminal of the inverter 77 is connected to the wiring 67. Gates of the transistors 75a and 75c and the transistors 76c and 76d are connected to the wiring 64. Gates of the transistors 75b and 75d and the transistors 76a and 76b are connected to the wiring 65.

Like the inverter 57 in FIG. 7A, even when power supply voltage applied to the PLD is decreased, the OR circuit 53 in FIG. 9A can prevent a decrease in potential of the wiring 67 when the potential should be at a high level or an increase in potential of the wiring 67 when the potential should be at a low level.

As described above, the Schmitt trigger logic gate has an advantage of preventing a change in logic level of a signal output from the logic gate even when the power supply voltage of the PLD is low. However, the Schmitt trigger logic gate has a disadvantage of higher power consumption than that of a normal CMOS logic gate. For example, in the case of the inverter 57 in FIG. 7A, while the transistor 71c is on, power consumption is increased due to leakage current that always flows between the wiring to which the potential V1 is applied and the wiring to which the potential V2 is applied through the transistor 71b. On the other hand, in the case of a logic gate including the switch 20 (e.g., the switch 20a or the switch 20b in FIG. 3A), the logic gate has an advantage of preventing a change in logic level of a signal output from the logic gate even when the power supply voltage of the PLD is low, like the Schmitt trigger logic gate, and has an advantage of lower power consumption than that of the Schmitt trigger logic gate or the normal CMOS logic gate.

Note that in the case of the logic gate including the switch 20, the boosting effect can be obtained as long as the logic level of a potential in the node SN is held. By giving the switch 20a in FIG. 3A as an example, if the frequency of rewriting the potential in the node SN of the switch 20a is higher than the frequency of changing the logic level of a signal input to the wiring 25a, it is difficult to obtain the boosting effect. In the case where the logic gate including the switch 20 is used in the MUX 14 as in one embodiment of the present invention, the frequency of rewriting the potential in the node SN of the switch 20 depends on the frequency of rewriting configuration data in the switch 20. Thus, the frequency of rewriting the potential in the node SN of the switch 20 is significantly lower than the frequency of changing the logic level of a signal input to the wiring 25, so that the boosting effect can be obtained.

However, in the case where the logic gate including the switch 20 is used in the LUT 12, a signal including configuration data is input to the wiring 25, and an input signal of the PLE 11 is input from the wiring 24. Thus, the frequency of rewriting the potential in the node SN of the switch 20 is higher than the frequency of changing the logic level of a signal input to the wiring 25, so that it is difficult to obtain the boosting effect. In the PLD according to one embodiment of the present invention, a Schmitt trigger logic gate is used as the minimum circuit that hardly obtains the boosting effect even when the logic gate including the switch 20 is used, such as the LUT 12, and the logic gate including the switch 20 is used in a circuit that can obtain the boosting effect, such as the MUX 14. With such a structure, even when power supply voltage supplied to the PLD is decreased, it is possible to prevent a change in logic level of a signal output from the PLE and to prevent malfunction of the PLD.

<LUT Structure Example 2>

Figure 10:
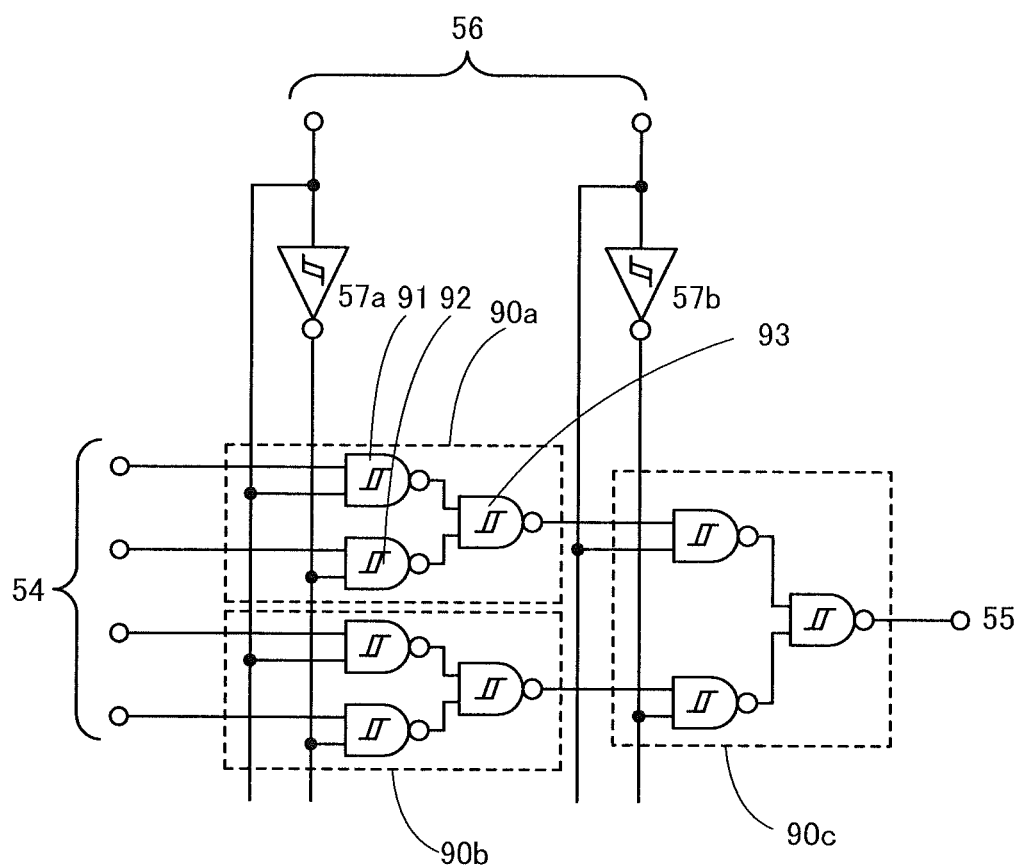
FIG. 10 illustrates a look-up table structure.

Next, FIG. 10 illustrates another structure example of the LUT 12. The LUT 12 in FIG. 10 includes a plurality of gates 90 each including three NAND circuits. FIG. 10 illustrates the structure of the LUT 12 including three gates 90 (gates 90a to 90c) as a specific example.

Each gate 90 includes a NAND circuit 91, a NAND circuit 92, and a NAND circuit 93. An output terminal of the NAND circuit 91 and an output terminal of the NAND circuit 92 are connected to two input terminals of the NAND circuit 93. In each gate 90, a first input terminal of the NAND circuit 91 and a first input terminal of the NAND circuit 92 are connected to one of the plurality of wirings 54 or an output terminal of the NAND circuit 93 included in the gate 90 in a preceding stage. A second input terminal of the NAND circuit 91 is connected to one of the plurality of wirings 56 to which a signal including configuration data is input. A second input terminal of the NAND circuit 92 is connected to the output terminal of any one of the plurality of inverters 57 (inverters 57a and 57b). The input terminals of the inverters 57a and 57b are connected to the plurality of wirings 56. An output terminal of the NAND circuit 93 included in the gate 90c in the final stage is connected to the wiring 55.

In one embodiment of the present invention, the NAND circuit 91, the NAND circuit 92, the NAND circuit 93, and the inverters 57a and 57b are Schmitt trigger logic gates. By using the Schmitt trigger logic gates in the LUT 12, even when power supply voltage supplied to the PLD is decreased, the LUT 12 can operate correctly.

<PLE Structure Example>

Figure 11A:
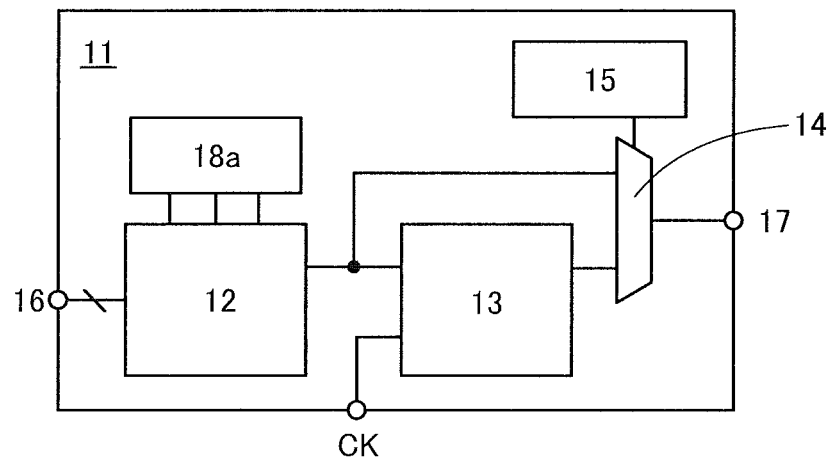
FIGS. 11A and 11B illustrate programmable logic element structure examples.

Next, FIG. 11A illustrates a specific structure example of the PLE 11 in FIG. 1B. The PLE 11 in FIG. 11A includes the LUT 12, the FF 13, the MUX 14, a CM 18a for storing the configuration data 18 of the LUT 12, and the CM 15 for storing configuration data 19 of the MUX 14.

Logical operation executed by the LUT 12 varies depending on configuration data stored in the CM 18a. When the logical operation executed by the LUT 12 is determined by the configuration data, the LUT 12 generates an output signal corresponding to a plurality of input signals supplied to the terminal 16. The FF 13 holds the output signal generated in the LUT 12 and outputs an output signal corresponding to the output signal of the LUT 12 in synchronization with a signal CK.

Signals output from the LUT 12 and the FF 13 are input to the MUX 14. The MUX 14 has a function of selecting and outputting one of these two output signals in accordance with configuration data stored in the CM 15. A signal output from the MUX 14 is input to the terminal 17.

Figure 11B:
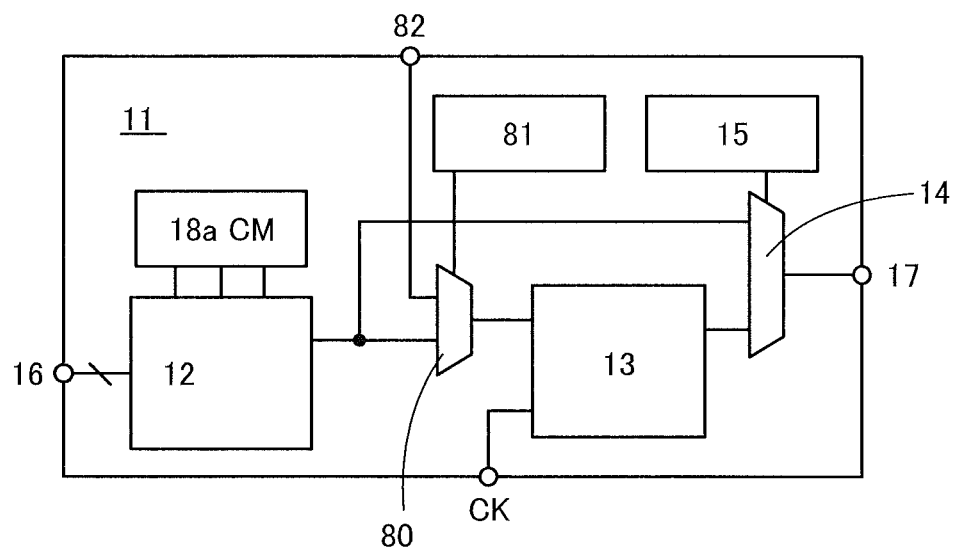

Next, FIG. 11B illustrates another specific structure example of the PLE 11 in FIG. 1B. The PLE 11 in FIG. 11B differs from the PLE 11 in FIG. 11A in that an MUX 80 and a CM 81 for storing configuration data of the MUX 80 are provided.

A signal output from the LUT 12 and a signal output from the FF 13 included in another PLE 11 are input to the MUX 80. The signal output from the FF 13 is input from a terminal 82. The MUX 80 has a function of selecting and outputting one of these two output signals in accordance with configuration data stored in the CM 81.

In the PLE 11 in FIG. 11B, the FF 13 holds the signal output from the MUX 80 and outputs an output signal corresponding to the signal output from the LUT 12 in synchronization with the signal CK.

Note that in the PLE 11 in FIG. 11A or FIG. 11B, configuration data may deter mine the kind of the FF 13. Specifically, the FF 13 may function as any of a D flip-flop, a T flip-flop, a JK flip-flop, and an RS flip-flop depending on the configuration data.

<PLD Structure Example 2>

Figure 12A:
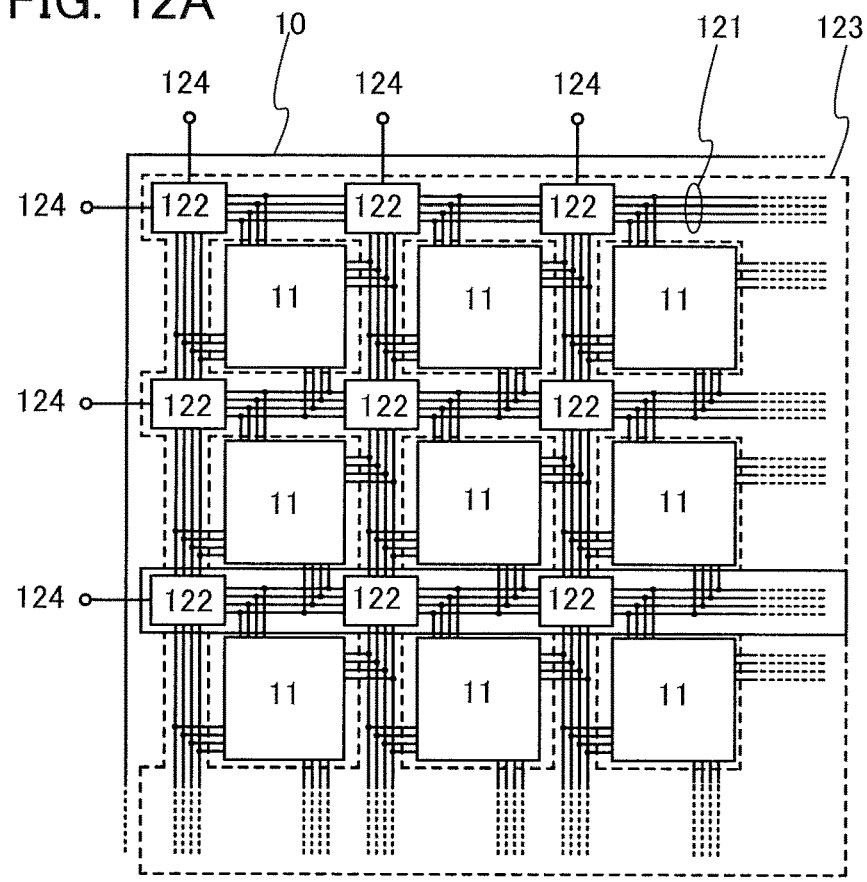
FIGS. 12A and 12B illustrate PLD and switch structures.

FIG. 12A schematically illustrates part of the structure of the PLD 10. The PLD 10 in FIG. 12A includes the plurality of PLEs 11, a wiring group 121 connected to any of the plurality of PLEs 11, and switches 122 for controlling connection between the wirings included in the wiring group 121. The wiring group 121 and the switches 122 correspond to a routing resource 123. The connection between the wirings controlled by the switches 122 are determined by the configuration data.

Figure 12B:
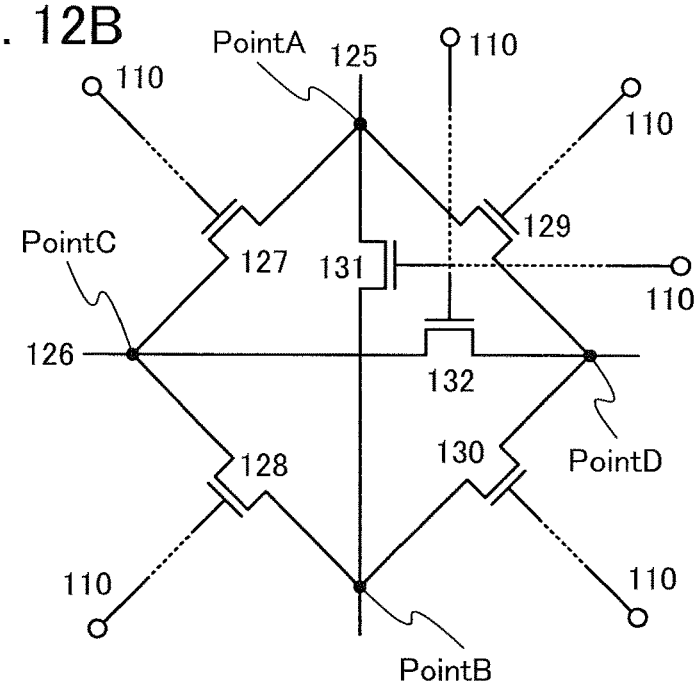

FIG. 12B illustrates a structure example of the switch 122. The switch 122 in FIG. 12B has a function of controlling connection between a wiring 125 and a wiring 126 included in the wiring group 121. Specifically, the switch 122 includes transistors 127 to 132. The transistor 127 has a function of controlling electrical connection between a point A of the wiring 125 and a point C of the wiring 126. The transistor 128 has a function of controlling electrical connection between a point B of the wiring 125 and the point C of the wiring 126. The transistor 129 has a function of controlling electrical connection between the point A of the wiring 125 and a point D of the wiring 126. The transistor 130 has a function of controlling electrical connection between the point B of the wiring 125 and the point D of the wiring 126. The transistor 131 has a function of controlling electrical connection between the point A and the point B of the wiring 125. The transistor 132 has a function of controlling electrical connection between the point C and the point D of the wiring 126.

Selection (switching) of the on state or off state of each of the transistors 127 to 132 is determined by configuration data. Specifically, in the case of the PLD 10, the potentials of signals input to gates of the transistors 127 to 132 are determined by configuration data.

The switches 122 also have a function of controlling electrical connection between the wiring group 121 and output terminals 124 of the PLD 10.

Figure 13:
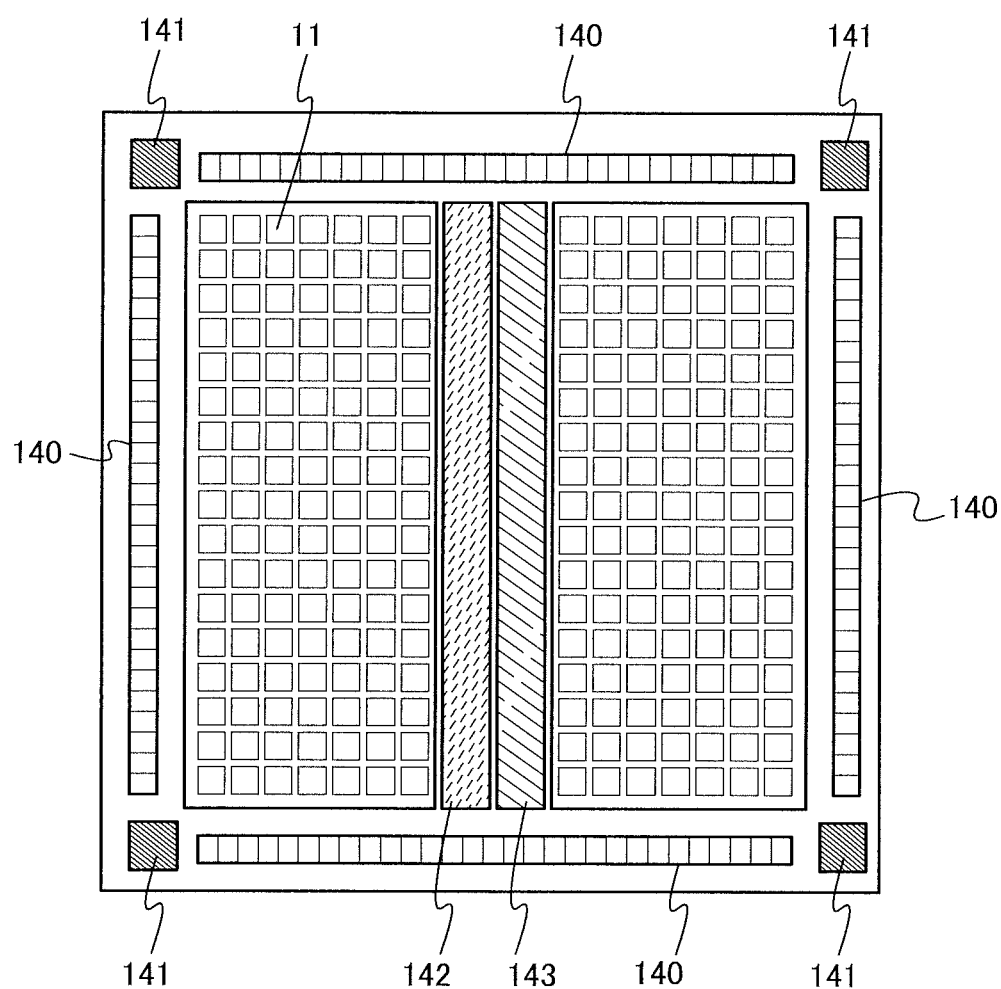
FIG. 13 illustrates a PLD entire structure.

FIG. 13 illustrates a structure example of the entire PLD 10. In FIG. 13, I/O elements 140, phase lock loops (PLL) 141, a RAM 142, and a multiplier 143 are provided in the PLD 10. The I/O element 140 functions as an interface that controls input and output of signals from and to an external circuit of the PLD 10. The PLL 141 has a function of generating the signal CK. The RAM 142 has a function of storing data used for logical operation. The multiplier 143 corresponds to a logic circuit for multiplication. When the PLD 10 has a function of executing multiplication, the multiplier 143 is not necessarily provided.

<PLD Cross-Sectional Structure Example>

Figure 14:
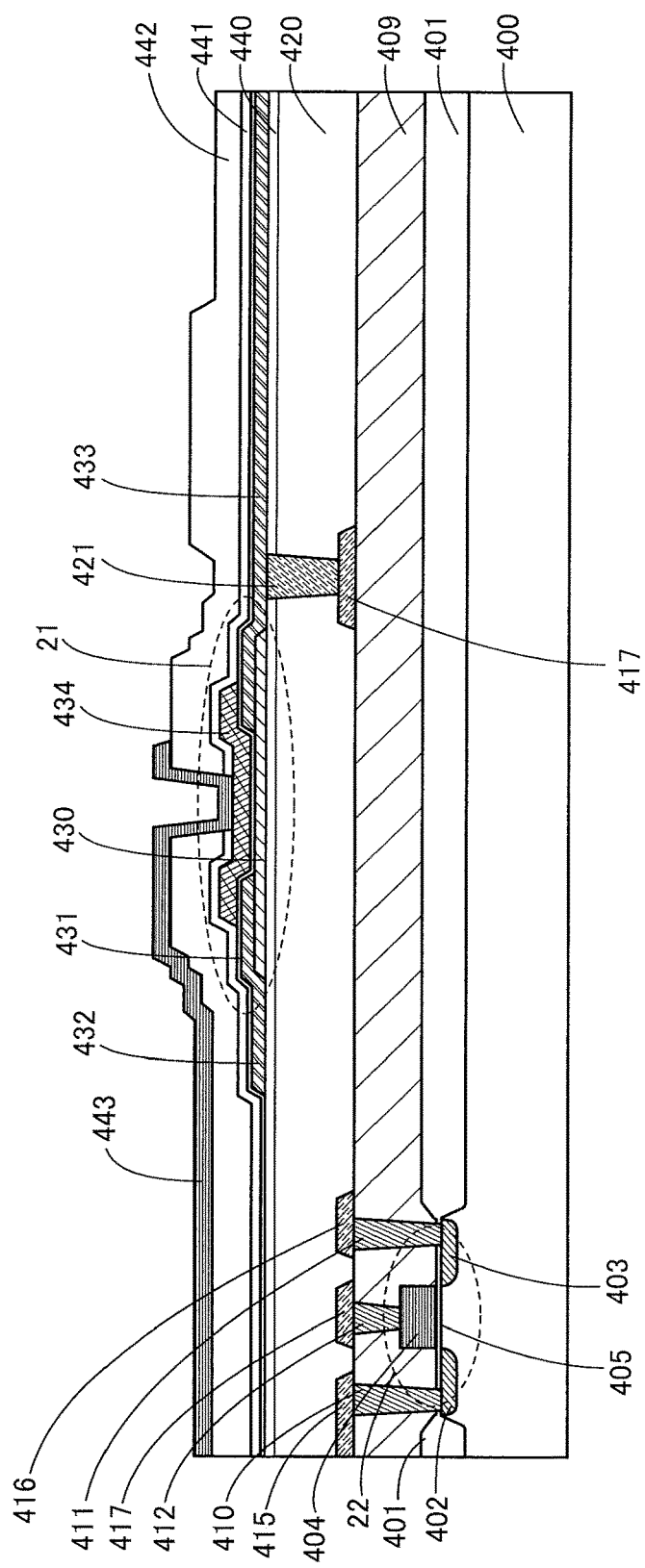
FIG. 14 illustrates a PLD cross-sectional structure.

FIG. 14 illustrates a cross-sectional structure example of a PLD according to one embodiment of the present invention. In FIG. 14, the transistor 21 including a channel formation region in an oxide semiconductor film is formed over the transistor 22 including a channel formation region in a single crystal silicon substrate.

Note that the transistor 22 can include a semiconductor film of silicon, germanium, or the like in an amorphous, microcrystalline, polycrystalline, or signal crystal state for an active layer. Alternatively, the transistor 22 may include a channel formation region in an oxide semiconductor film. In the case where the transistors each include a channel formation region in an oxide semiconductor film, the transistor 21 is not necessarily stacked over the transistor 22, and the transistors 21 and 22 may be formed in the same layer.

In the case where the transistor 22 is formed using a silicon thin film, any of the following can be used: amorphous silicon formed by sputtering or vapor phase growth such as plasma-enhanced CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A semiconductor substrate 400 where the transistor 22 is formed can be, for example, an n-type or p-type silicon substrate, germanium substrate, silicon germanium substrate, or compound semiconductor substrate (e.g., GaAs substrate, InP substrate, GaN substrate, SiC substrate, GaP substrate, GaInAsP substrate, or ZnSe substrate). In FIG. 14, a single crystal silicon substrate having n-type conductivity is used.

The transistor 22 is electrically isolated from another transistor by an element isolation insulating film 401. The element isolation insulating film 401 can be formed by a local oxidation of silicon (LOCOS) method, a trench isolation method, or the like.

Specifically, the transistor 22 includes impurity regions 402 and 403 that are formed in the semiconductor substrate 400 and function as a source region and a drain region, a gate electrode 404, and a gate insulating film 405 provided between the semiconductor substrate 400 and the gate electrode 404. The gate electrode 404 overlaps with a channel formation region formed between the impurity regions 402 and 403 with the gate insulating film 405 positioned between the gate electrode 404 and the channel formation region.

An insulating film 409 is provided over the transistor 22. Openings are formed in the insulating film 409. Wirings 410 and 411 that are in contact with the impurity regions 402 and 403, respectively, and a wiring 412 that is electrically connected to the gate electrode 404 are formed in the openings.

The wiring 410 is electrically connected to a wiring 415 formed over the insulating film 409. The wirings 411 and 412 are electrically connected to a wiring 416 formed over the insulating film 409. The wiring 412 is electrically connected to a wiring 417 formed over the insulating film 409.

An insulating film 420 and an insulating film 440 are stacked in that order over the wirings 415 to 417. An opening is formed in the insulating film 420 and the insulating film 440. In the opening, a wiring 421 electrically connected to the wiring 417 is formed.

In FIG. 14, the transistor 21 is formed over the insulating film 440.

The transistor 21 includes, over the insulating film 440, a semiconductor film 430 containing an oxide semiconductor, conductive films 432 and 433 that are positioned over the semiconductor film 430 and function as a source electrode and a drain electrode, a gate insulating film 431 over the semiconductor film 430 and the conductive films 432 and 433, and a gate electrode 434 that is positioned over the gate insulating film 431 and overlaps with the semiconductor film 430 between the conductive films 432 and 433.

An insulating film 441 and an insulating film 442 are stacked in that order over the transistor 21. An opening is formed in the insulating films 441 and 442. A conductive film 443 that is in contact with the gate electrode 434 in the opening is provided over the insulating film 441.

Note that in FIG. 14, the transistor 21 includes the gate electrode 434 on at least one side of the semiconductor film 430. Alternatively, the transistor 21 may include a pair of gate electrodes with the semiconductor film 430 positioned therebetween.

When the transistor 21 includes a pair of gate electrodes with the semiconductor film 430 positioned therebetween, a signal for controlling an on state or an off state may be supplied to one of the gate electrodes, and the other of the gate electrodes may be supplied with a potential from another element. In that case, potentials at the same level may be supplied to the pair of gate electrodes, or a fixed potential such as a ground potential may be supplied only to the other of the gate electrodes. By controlling the level of a potential applied to the other of the gate electrodes, the threshold voltage of the transistor can be controlled.

In FIG. 14, the transistor 21 has a single-gate structure where one channel formation region corresponding to one gate electrode 434 is provided. However, the transistor 21 may have a multi-gate structure where a plurality of channel formation regions are formed in one active layer by providing a plurality of gate electrodes electrically connected to each other.

<Semiconductor Film>

A highly-purified oxide semiconductor (purified oxide semiconductor) obtained by reduction of impurities such as moisture or hydrogen that serve as electron donors (donors) and reduction of oxygen vacancies is an intrinsic (i-type) semiconductor or a substantially intrinsic semiconductor. Thus, a transistor including a channel formation region in a highly-purified oxide semiconductor film has extremely low off-state current and high reliability.

Specifically, various experiments can prove low off-state current of a transistor including a channel formation region in a highly-purified oxide semiconductor film. For example, even when an element has a channel width of $1\times10^6$ µm and a channel length of 10 µm, off-state current can be lower than or equal to the measurement limit of a semiconductor parameter analyzer, i.e., lower than or equal to $1\times10^{-13}$ A, at a voltage (drain voltage) between a source electrode and a drain electrode of 1 to 10 V. In that case, it can be seen that off-state current standardized on the channel width of the transistor is lower than or equal to 100 zA/µm. In addition, a capacitor and a transistor were connected to each other and off-state current was measured using a circuit in which electric charge flowing to or from the capacitor is controlled by the transistor. In the measurement, a highly-purified oxide semiconductor film was used in the channel formation region of the transistor, and the off-state current of the transistor was measured from a change in the amount of electric charge of the capacitor per unit hour. As a result, it can be seen that, in the case where the voltage between the source electrode and the drain electrode of the transistor is 3 V, a lower off-state current of several tens of yoctoamperes per micrometer is obtained. Accordingly, the transistor including the highly-purified oxide semiconductor film in the channel formation region has much lower off-state current than a crystalline silicon transistor.

Note that unless otherwise specified, in this specification, off-state current of an n-channel transistor is current that flows between a source and a drain when the potential of the drain is higher than that of the source or that of a gate while the potential of the gate is 0 V or lower in the case of the potential of the source used as a reference. Alternatively, in this specification, off-state current of a p-channel transistor is current that flows between a source and a drain when the potential of the drain is lower than that of the source or that of a gate while the potential of the gate is 0 V or higher in the case of the potential of the source used as a reference.

In the case where an oxide semiconductor film is used as the semiconductor film, an oxide semiconductor preferably contains at least indium (In) or zinc (Zn). As a stabilizer for reducing variations in electrical characteristics of a transistor including the oxide semiconductor film, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among the oxide semiconductors, unlike silicon carbide, gallium nitride, or gallium oxide, an In—Ga—Zn-based oxide, an In—Sn—Zn-based oxide, or the like has an advantage of high mass productivity because a transistor with favorable electrical characteristics can be formed by sputtering or a wet process. Further, unlike silicon carbide, gallium nitride, or gallium oxide, with the use of the In—Ga—Zn-based oxide, a transistor with favorable electrical characteristics can be formed over a glass substrate. Furthermore, a larger substrate can be used.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, indium oxide, gallium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used as an oxide semiconductor.

Note that, for example, an In—Ga—Zn-based oxide means an oxide containing In, Ga, and Zn, and there is no limitation on the ratio of In, Ga, and Zn. In addition, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

For example, an In—Ga—Zn-based oxide with an atomic ratio of In:Ga:Zn=1:1:1 (=$\frac{1}{3}$:$\frac{1}{3}$:$\frac{1}{3}$) or In:Ga:Zn=2:2:1 (=$\frac{2}{5}$:$\frac{2}{5}$:$\frac{1}{5}$), or an oxide whose composition is in the neighborhood of the above composition can be used. Alternatively, an In—Sn—Zn-based oxide with an atomic ratio of In:Sn:Zn=1:1:1 (=$\frac{1}{3}$:$\frac{1}{3}$:$\frac{1}{3}$), In:Sn:Zn=2:1:3 (=$\frac{1}{3}$:$\frac{1}{6}$:$\frac{1}{2}$), or In:Sn:Zn=2:1:5 (=$\frac{1}{4}$:$\frac{1}{8}$:$\frac{5}{8}$), or an oxide whose composition is in the neighborhood of the above composition is preferably used.

For example, with an In—Sn—Zn-based oxide, high mobility can be comparatively easily obtained. However, even with an In—Ga—Zn-based oxide, mobility can be increased by lowering defect density in a bulk.

The structure of the oxide semiconductor film is described below.

An oxide semiconductor film is roughly classified into a single-crystal oxide semiconductor film and a non-single-crystal oxide semiconductor film. The non-single-crystal oxide semiconductor film means any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example of the amorphous oxide semiconductor film is an oxide semiconductor film in which no crystal part exists even in a microscopic region, and the whole of the film is amorphous.

The microcrystalline oxide semiconductor film includes a microcrystal (also referred to as nanocrystal) of greater than or equal to 1 nm and less than 10 nm, for example. Thus, the microcrystalline oxide semiconductor film has higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit into a cube whose one side is less than 100 nm. Thus, there is a case where a crystal part included in the CAAC-OS film fits into a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In this specification, the term "parallel" indicates that an angle formed between two straight lines is −10 to 10°, and accordingly includes the case where the angle is −5 to 5°. In addition, the term "perpendicular" indicates that an angle formed between two straight lines is 80 to 100°, and accordingly includes the case where the angle is 85 to 95°.

On the other hand, according to the TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

From the results of the cross-sectional TEM image and the planar TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer which is arranged in a layered manner and observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

Further, the crystallinity in the CAAC-OS film is not necessarily uniform. For example, in the case where crystal growth leading to the CAAC-OS film occurs from the vicinity of the top surface of the film, the crystallinity in the vicinity of the top surface is higher than that in the vicinity of the formation surface in some cases. Further, when an impurity is added to the CAAC-OS film, the crystallinity in a region to which the impurity is added is changed, and the crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor including the CAAC-OS film, changes in electrical characteristics of the transistor due to irradiation with visible light or ultraviolet light are small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

For example, a CAAC-OS film is deposited by sputtering with a polycrystalline metal oxide target. When ions collide with the target, a crystal region included in the target might be separated from the target along the a-b plane, and a sputtered particle having a plane parallel to the a-b plane (flat-plate-like or pellet-like sputtered particle) might be separated from the target. In that case, the flat-plate-like or pellet-like sputtered particle reaches a substrate while maintaining its crystal state, so that the CAAC-OS film can be deposited.

For the deposition of the CAAC-OS film, the following conditions are preferably employed.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a treatment chamber may be reduced. Further, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle occurs after the sputtered particle reaches the substrate. Specifically, the substrate heating temperature during the deposition is 100 to 740° C., preferably 200 to 500° C. By increasing the substrate heating temperature during the deposition, when the flat-plate-like or pellet-like sputtered particle reaches the substrate, migration occurs on the substrate, so that a flat plane of the sputtered particle is attached to the substrate.

Further, it is preferable to reduce plasma damage during the deposition by increasing the proportion of oxygen in the deposition gas and optimizing power. The proportion of oxygen in the deposition gas is 30 vol % or higher, preferably 100 vol %.

As an example of the target, an In—Ga—Zn-based oxide target is described below.

A polycrystalline In—Ga—Zn-based oxide target is made by mixing InO$_X$ powder, GaO$_Y$ powder, and ZnO$_Z$ powder in a predetermined mole ratio, applying pressure, and performing heat treatment at 1000 to 1500° C. Note that X, Y, and Z are each a given positive number. Here, the predetermined mole ratio of the InO$_X$ powder, the GaO$_Y$ powder, and the ZnO$_Z$ powder is, for example, 2:2:1, 8:4:3, 3:1:1, 1:1:1, 4:2:3, or 3:1:2. The kinds of powder and the mole ratio for mixing powder may be changed as appropriate depending on a target to be formed.

Alkali metal is not an element included in an oxide semiconductor and thus is an impurity. Alkaline earth metal is also an impurity in the case where alkaline earth metal is not included in an oxide semiconductor. Alkali metal, in particular, Na becomes Na$^+$ when an insulating film that is in contact with an oxide semiconductor film is an oxide and Na diffuses into the insulating film. In addition, in the oxide semiconductor film, Na cuts or enters a bond between metal and oxygen that are included in an oxide semiconductor. As a result, for example, degradation in transistor electrical characteristics, such as a normally on state of the transistor due to a shift in the threshold voltage in a negative direction, or a decrease in mobility, occurs. Specifically, the measurement value of a Na concentration by secondary ion mass spectrometry is preferably 5×10$^{16}$/cm$^3$ or less, more preferably 1×10$^{16}$/cm$^3$ or less, still more preferably 1×10$^{15}$/cm$^3$ or less. Similarly, the measurement value of a Li concentration is preferably 5×10$^{15}$/cm$^3$ or less, more preferably 1×10$^{15}$/cm$^3$ or less. Similarly, the measurement value of a K concentration is preferably 5×10$^{15}$/cm$^3$ or less, more preferably 1×10$^{15}$/cm$^3$ or less.

In the case where a metal oxide containing indium is used, silicon or carbon having higher bond energy with oxygen than indium might cut the bond between indium and oxygen, so that an oxygen vacancy is formed. Accordingly, when silicon or carbon is contained in the oxide semiconductor film, the transistor electrical characteristics are likely to be degraded as in the case of alkali metal or alkaline earth metal. Thus, the concentration of silicon and carbon in the oxide semiconductor film is preferably low. Specifically, the measurement value of a C concentration or the measurement value of a Si concentration by secondary ion mass spectrometry is preferably 1×10$^{18}$/cm$^3$ or less. In that case, the degradation in transistor electrical characteristics can be prevented, so that the reliability of the PLD or the semiconductor device can be increased.

Metal in the source electrode and the drain electrode extracts oxygen from the oxide semiconductor film depending on a conductive material used for the source electrode and the drain electrode. In that case, a region in the oxide semiconductor film that is in contact with the source electrode and the drain electrode has n-type conductivity due to generation of oxygen vacancies.

Since the region having n-type conductivity functions as a source region or a drain region, contact resistance between the oxide semiconductor film and the source electrode and the drain electrode can be lowered. Thus, by forming the region having n-type conductivity, the mobility and on-state current of the transistor can be increased, so that a switch circuit including the transistor can operate at high speed.

Note that metal in the source electrode and the drain electrode might extract oxygen when the source electrode and the drain electrode are formed by sputtering or the like or might extract oxygen by heat treatment performed after the source electrode and the drain electrode are formed.

Further, the region having n-type conductivity is easily formed by using a conductive material that is easily bonded to oxygen for the source electrode and the drain electrode. The conductive material can be, for example, Al, Cr, Cu, Ta, Ti, Mo, or W.

The oxide semiconductor film is not limited to a single-layer metal oxide film and may have a layered structure of a plurality of metal oxide films. In a semiconductor film in which first to third metal oxide films are stacked sequentially, for example, each of the first and third metal oxide films is an oxide film that contains at least one of metal elements contained in the second metal oxide film and in which energy at the bottom of the conduction band is closer to the vacuum level than that in the second metal oxide film by higher than or equal to 0.05 eV, 0.07 eV, 0.1 eV, or 0.15 eV and lower than or equal to 2 eV, 1 eV, 0.5 eV, or 0.4 eV. The second metal oxide film preferably contains at least indium because carrier mobility is increased.

In the case where the transistor has the above semiconductor film, when an electric field is applied to the semiconductor film by application of voltage to a gate electrode, a channel region is formed in the second metal oxide film whose energy at the bottom of the conduction band is low in the semiconductor film. In other words, the third metal oxide film is provided between the second metal oxide film and the gate insulating film, so that a channel region can be formed in the second metal oxide film spaced from the gate insulating film.

Since the third metal oxide film contains at least one of the metal elements contained in the second metal oxide film, interface scattering hardly occurs at an interface between the second metal oxide film and the third metal oxide film. Thus, carriers are not easily inhibited from moving at the interface, which results in an increase in field-effect mobility of the transistor.

When an interface state is formed at an interface between the second metal oxide film and the first metal oxide film, a channel region is also formed in a region close to the interface; thus, the threshold voltage of the transistor varies. However, since the first metal oxide film contains at least one of the metal elements contained in the second metal oxide film, an interface state is hardly formed at the interface between the second metal oxide film and the first metal oxide film. As a result, such a structure can reduce variations in transistor electrical characteristics (e.g., threshold voltage).

The plurality of oxide semiconductor films are preferably stacked so that impurities between the metal oxide films do not form an interface state that inhibits carriers from moving at an interface of each film. If impurities exist between the plurality of stacked metal oxide films, the continuity of energy at the bottom of the conduction band between the metal oxide films is lost, and carriers are trapped or lost due to recombination around the interface. A continuous bond (especially, a bond having a U-shaped and well-shaped structure where energy at the bottom of the conduction band is continuously changed between the films) is more likely to be formed in the plurality of metal oxide films containing at least one metal element (main component) in which impurities between the films are reduced than in the plurality of metal oxide films that contain at least one metal element (main component) and are simply stacked.

In order to form such a continuous bond, it is necessary to form films continuously without being exposed to the atmosphere with the use of a multi-chamber deposition apparatus (sputtering apparatus) including a load lock chamber. Each chamber of the sputtering apparatus is preferably evacuated to a high vacuum (to about $5 \times 10^{-7}$ to $1 \times 10^{-4}$ Pa) by an adsorption vacuum pump such as a cryopump so that water and the like, which are impurities for an oxide semiconductor, are removed as much as possible. Alternatively, a turbo molecular pump and a cold trap are preferably used in combination to prevent backflow of gas into the chamber through an evacuation system.

To obtain a highly-purified intrinsic oxide semiconductor, not only high vacuum evacuation of the chambers but also high purification of a sputtering gas is important. An oxygen gas or an argon gas used as the gas is highly purified to have a dew point of $-40°$ C. or lower, preferably $-80°$ C. or lower, more preferably $-100°$ C. or lower, so that entry of moisture or the like into the oxide semiconductor film can be prevented as much as possible.

The first or third metal oxide film may be, for example, an oxide film containing aluminum, silicon, titanium, gallium, germanium, yttrium, zirconium, tin, lanthanum, cerium, or hafnium at a higher atomic ratio than the second metal oxide film. Specifically, an oxide film containing the above element at an atomic ratio 1.5 or more times, preferably 2 or more times, more preferably 3 or more times that in the second metal oxide film is preferably used as the first or third metal oxide film. The above element is strongly bonded to oxygen, and thus has a function of inhibiting generation of oxygen vacancies in the oxide film. Accordingly, with such a structure, the first or third metal oxide film can be an oxide film in which oxygen vacancies are less likely to be generated than in the second metal oxide film.

Specifically, in the case where the second metal oxide film and the first or third metal oxide film are formed using an In-M-Zn-based oxide, if the atomic ratio of the first or third metal oxide film is In:M:Zn=$x_1$:$y_1$:$z_1$ and the atomic ratio of the second metal oxide film is In:M:Zn=$x_2$:$y_2$:$z_2$, the atomic ratios may be set so that $y_1/x_1$ is larger than $y_2/x_2$. Note that the element M is a metal element whose bonding strength to oxygen is larger than that of In, and can be Al, Ti, Ga, Y, Zr, Sn, La, Ce, Nd, or Hf, for example. Preferably, the atomic ratios may be set so that $y_1/x_1$ is 1.5 or more times $y_2/x_2$. More preferably, the atomic ratios may be set so that $y_1/x_1$ is 2 or more times $y_2/x_2$. Still more preferably, the atomic ratios may be set so that $y_1/x_1$ is 3 or more times $y_2/x_2$. In the second metal oxide film, $y_2$ is preferably larger than or equal to $x_2$ because the transistor can have stable electrical characteristics. Note that $y_2$ is preferably less than 3 times $x_2$ because the field-effect mobility of the transistor is lowered if $y_2$ is 3 or more times $x_2$.

The first metal oxide film and the third metal oxide film each have a thickness of 3 to 100 nm, preferably 3 to 50 nm. The second metal oxide film has a thickness of 3 to 200 nm, preferably 3 to 100 nm, and more preferably 3 to 50 nm.

The three oxide semiconductor films (first to third metal oxide films) can be either amorphous or crystalline. Note that the second metal oxide film in which a channel region is formed is preferably crystalline because the transistor can have stable electrical characteristics.

Note that a channel formation region means a region of a semiconductor film of a transistor that overlaps with a gate electrode and is between a source electrode and a drain electrode. Further, a channel region means a region through which current mainly flows in the channel formation region.

For example, in the case where an In—Ga—Zn-based oxide film formed by sputtering is used as each of the first and third metal oxide films, a target of an In—Ga—Zn-based oxide (In:Ga:Zn=1:3:2 [atomic ratio]) can be used for deposition of the first and third metal oxide films. The deposition conditions can be, for example, as follows: an argon gas (flow rate: 30 sccm) and an oxygen gas (flow rate: 15 sccm) are used as a deposition gas; pressure is 0.4 Pa; substrate temperature is 200° C.; and DC power is 0.5 kW.

In the case where the second metal oxide film is a CAAC-OS film, a target containing a polycrystalline In—Ga—Zn-based oxide (In:Ga:Zn=1:1:1 [atomic ratio]) is preferably used for the deposition. The deposition conditions can be, for example, as follows: an argon gas (flow rate: 30 sccm) and an oxygen gas (flow rate: 15 sccm) are used as a deposition gas; pressure is 0.4 Pa; substrate temperature is 300° C.; and DC power is 0.5 kW.

Note that the transistor may have a structure where the end portion of the semiconductor film is steep or a structure where the end portion of the semiconductor film is rounded.

Also in the case where a semiconductor film including stacked metal oxide films is used in the transistor, regions that are in contact with the source electrode and the drain electrode may have n-type conductivity. With such a structure, the mobility and on-state current of the transistor can be increased, so that a PLD or a semiconductor device including the transistor can operate at high speed. Further, in the case where the semiconductor film including the stacked metal oxide films is used in the transistor, the regions having n-type conductivity preferably extend to the second metal oxide film serving as a channel region in order that the mobility and on-state current of the transistor can be further increased and the PLD or the semiconductor device can operate at higher speed.

Figure 17A:
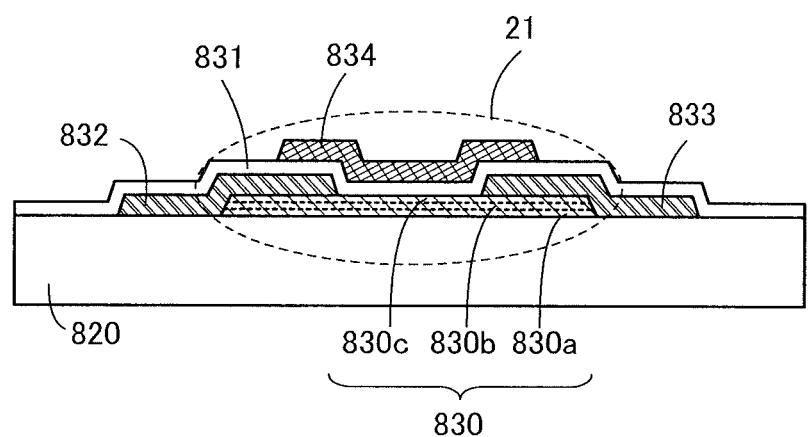
FIGS. 17A and 17B illustrate transistor cross-sectional structures.
Figure 17B:
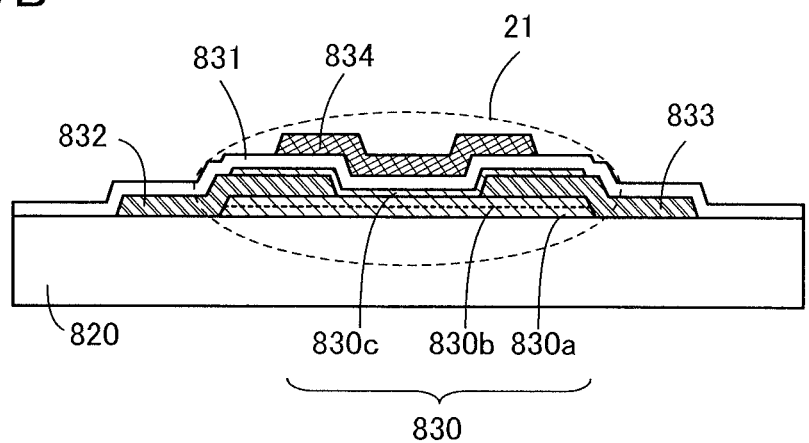

FIGS. 17A and 17B illustrate other cross-sectional structure examples of the transistor 21. The transistor 21 in FIG. 17A includes a semiconductor film 830 provided over an insulating film 820 and the like, conductive films 832 and 833 electrically connected to the semiconductor film 830, a gate insulating film 831, and a gate electrode 834 that is provided over the gate insulating film 831 to overlap with the semiconductor film 830.

The semiconductor film 830 is not necessarily a single oxide semiconductor film, but may be a stack of a plurality of oxide semiconductor films. FIG. 17A illustrates an example in which the semiconductor film 830 is formed using a stack of three oxide semiconductor films. Specifically, in the transistor 21 in FIG. 17A, oxide semiconductor films 830a to 830c are stacked sequentially from the insulating film 820 side as the semiconductor film 830.

Each of the oxide semiconductor films 830a and 830c is an oxide film that contains at least one of metal elements contained in the oxide semiconductor film 830b and in which energy at the bottom of the conduction band is closer to the vacuum level than that in the oxide semiconductor film 830b by higher than or equal to 0.05 eV, 0.07 eV, 0.1 eV, or 0.15 eV and lower than or equal to 2 eV, 1 eV, 0.5 eV, or 0.4 eV. The oxide semiconductor film 830b preferably contains at least indium because carrier mobility is increased.

Note that as illustrated in FIG. 17B, the oxide semiconductor film 830c may be provided over the conductive films 832 and 833 to overlap with the gate insulating film 831.

<Chip Structure>

Figure 15A:
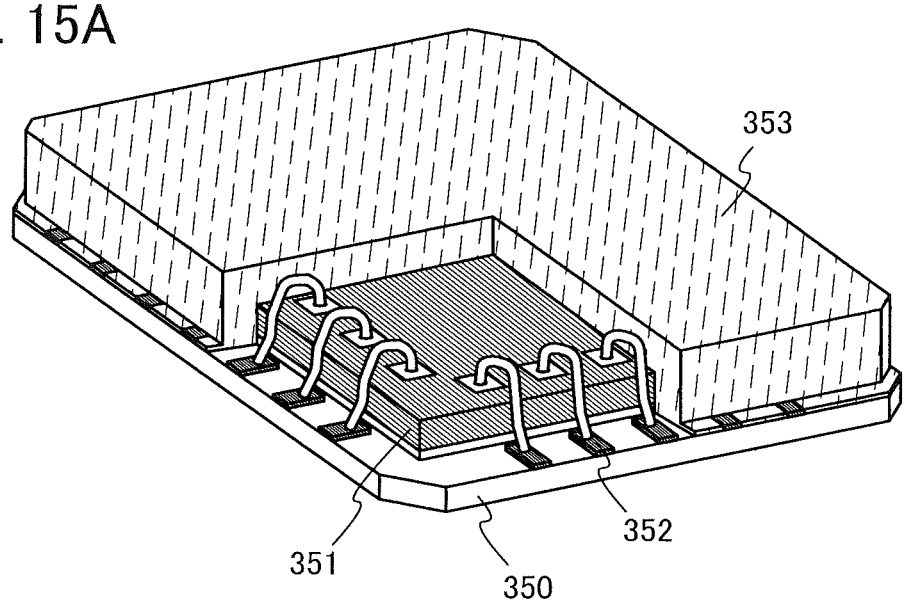
FIGS. 15A and 15B illustrate a chip and a module.

FIG. 15A is a perspective view illustrating a cross-sectional structure of a package including a lead frame interposer.

In the package in FIG. 15A, a chip 351 corresponding to the semiconductor device according to one embodiment of the present invention is connected to terminals 352 over an interposer 350 by wire bonding. The terminals 352 are placed on a surface of the interposer 350 on which the chip 351 is mounted. The chip 351 can be sealed by a mold resin 353 in which case the chip 351 is sealed so that part of each of the terminals 352 is exposed.

Figure 15B:
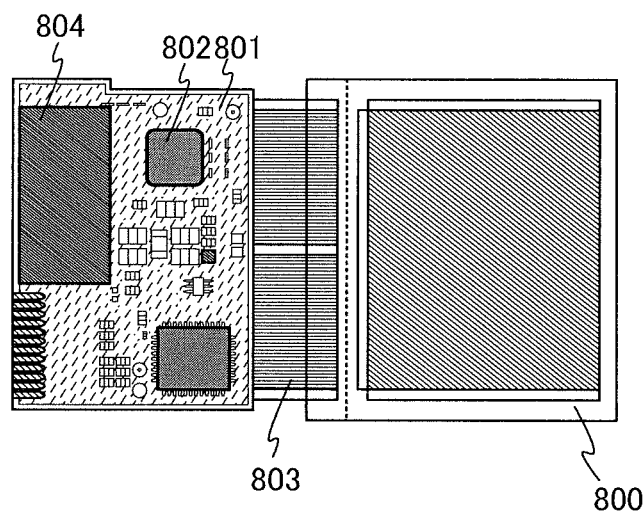

FIG. 15B illustrates the structure of a module of an electronic device in which the package is mounted on a circuit board.

In the module of a cellular phone in FIG. 15B, a package 802 and a battery 804 are mounted on a printed wiring board 801. In addition, the printed wiring board 801 is mounted on a panel 800 including display elements by an FPC 803.

<Electronic Device Examples>

A semiconductor device or programmable logic device according to one embodiment of the present invention can be used for display devices, personal computers, or image reproducing devices provided with recording media (typically, devices that reproduce the content of recording media such as digital versatile discs (DVD) and have displays for displaying the reproduced images). Further, as electronic devices that can include the semiconductor device or programmable logic device according to one embodiment of the present invention, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 16A to 16F illustrate specific examples of these electronic devices.

Figure 16A:
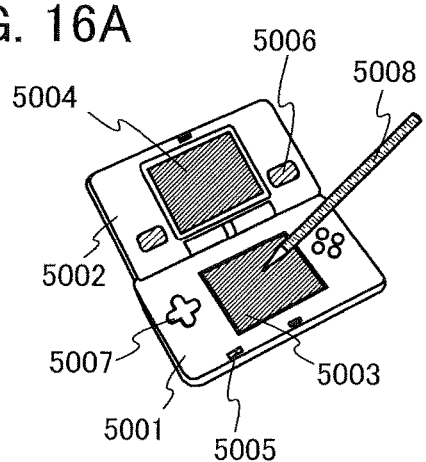
FIGS. 16A to 16F illustrate electronic devices.

FIG. 16A illustrates a portable game machine, which includes a housing 5001, a housing 5002, a display portion 5003, a display portion 5004, a microphone 5005, speakers 5006, an operation key 5007, a stylus 5008, and the like. Note that although the portable game machine in FIG. 16A has the two display portions 5003 and 5004, the number of display portions included in the portable game machine is not limited thereto.

Figure 16B:
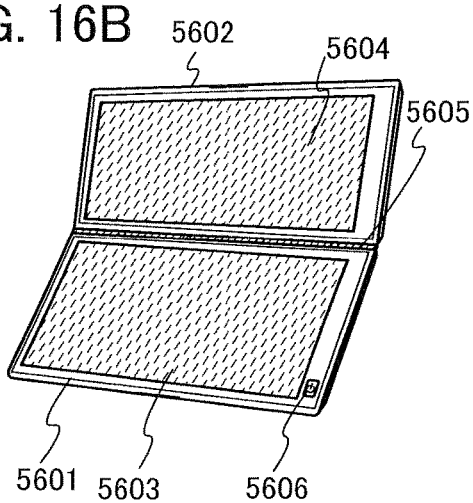

FIG. 16B illustrates a portable information terminal, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. An image on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added by providing a touch panel in a display device. Alternatively, the position input function can be added by providing a photoelectric conversion element called a photosensor in a pixel portion of a display device.

Figure 16C:
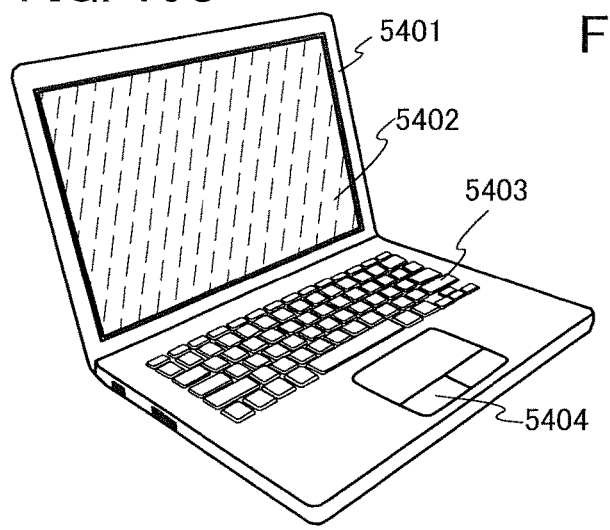

FIG. 16C illustrates a laptop, which includes a housing 5401, a display portion 5402, a keyboard 5403, a pointing device 5404, and the like.

Figure 16D:
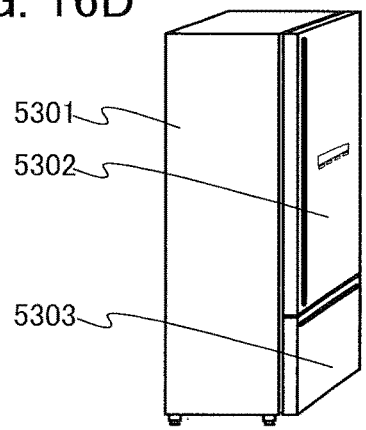

FIG. 16D illustrates an electric refrigerator-freezer, which includes a housing 5301, a refrigerator door 5302, a freezer door 5303, and the like.

Figure 16E:
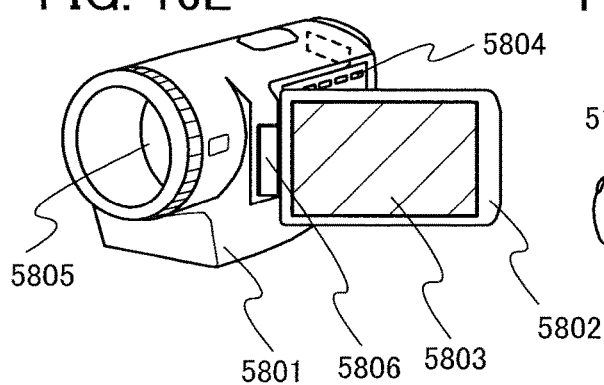

FIG. 16E illustrates a video camera, which includes a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and an angle between the first housing 5801 and the second housing 5802 can be changed with the joint 5806. An image on the display portion 5803 may be switched depending on the angle between the first housing 5801 and the second housing 5802 at the joint 5806.

Figure 16F:
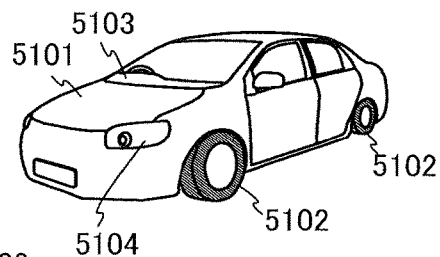

FIG. 16F illustrates an ordinary motor vehicle, which includes a car body 5101, wheels 5102, a dashboard 5103, lights 5104, and the like.

Embodiment 2

<Semiconductor Device 1101>

Figure 18:
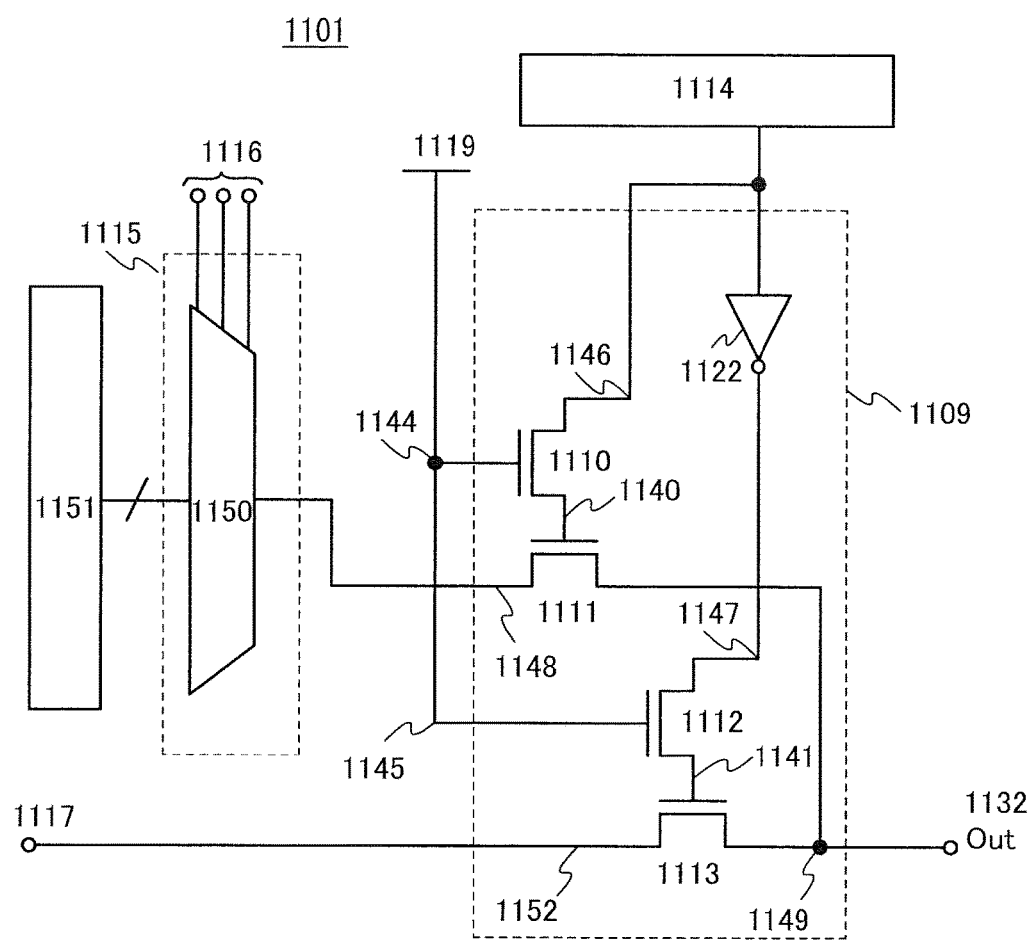
FIG. 18 is a semiconductor device circuit diagram.

FIG. 18 illustrates a semiconductor device 1101. The semiconductor device 1101 can function as part of a programmable logic element in a programmable logic device.

The semiconductor device 1101 includes at least a multiplexer (MUX) 1109, a look-up table (LUT) 1115, and a memory 1114.

The MUX 1109 includes at least a transistor 1110, a transistor 1111, a transistor 1112, a transistor 1113, and an inverter 1122. The transistor 1110 and the transistor 1112 can function as boost transistors. The transistor 1111 and the transistor 1113 can function as path transistors.

The LUT 1115 includes at least an MUX 1150. A memory 1151 includes a memory element and stores configuration data. A plurality of signals 1116 are input to the MUX 1150. The memory 1151 is connected to the MUX 1150 through a bus line. The MUX 1150 selects data stored in the memory 1151 and outputs a signal to the MUX 1109.

A signal is input from the LUT 1115 to the MUX 1109. A signal 1117 is input to the MUX 1109. Note that the signal 1117 may also be input to the LUT 1115, and a signal from the LUT 1115 may be input to the MUX 1109.

The MUX 1109 is electrically connected to the memory 1114. The memory 1114 includes a memory element and stores configuration data.

The MUX 1109 selects the transistor 1111 or the transistor 1113 in accordance with configuration data.

Figure 19:
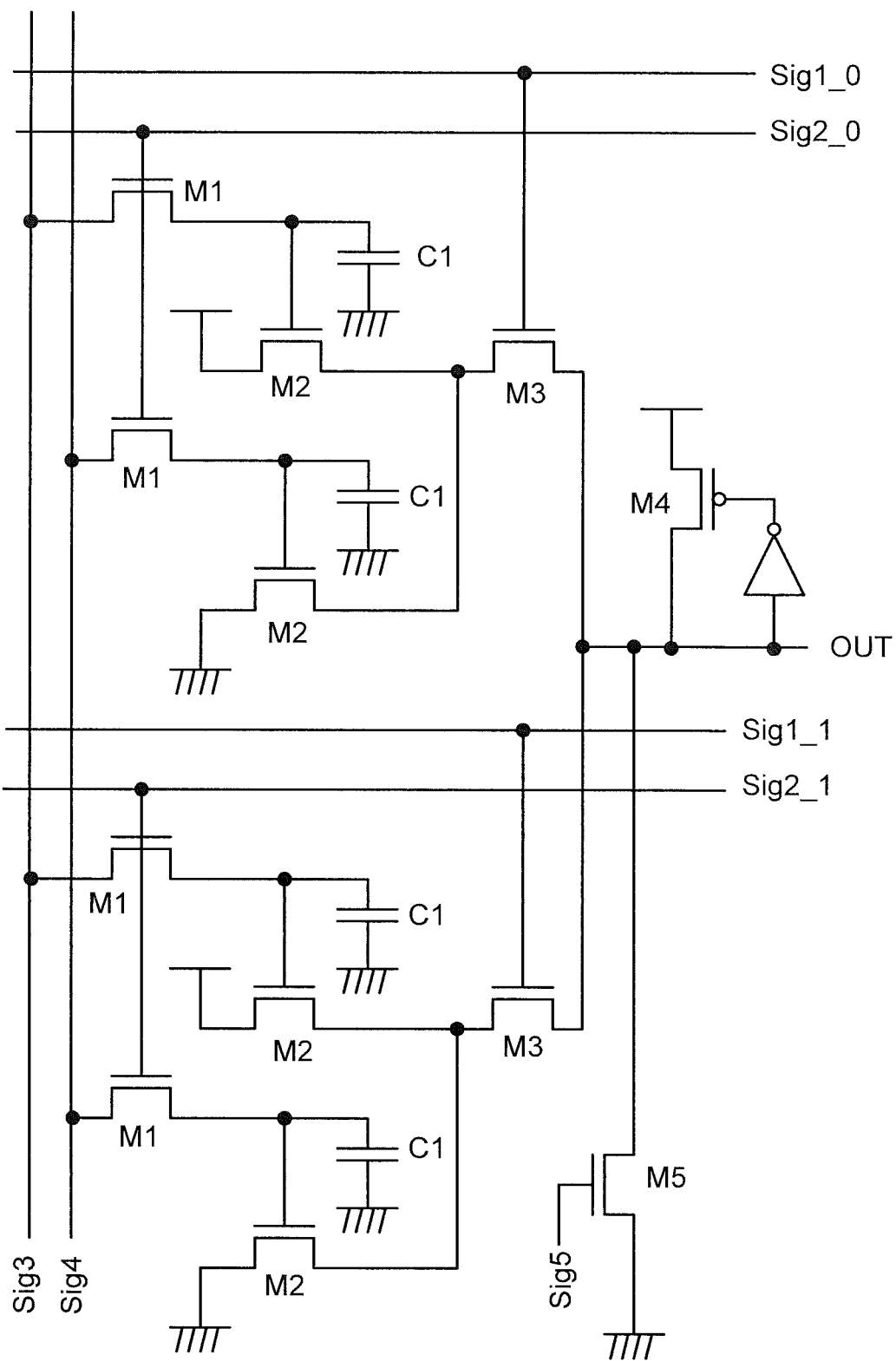
FIG. 19 is a memory circuit diagram.

FIG. 19 is a circuit diagram example of the memory 1114 and the memory 1151. The memory 1114 and the memory 1151 each include transistors M1 to M5 and a capacitor C1. Signals Sig1_0, Sig1_1, Sig2_0, Sig2_1, Sig3, Sig4, and Sig5 are input.

When the transistor M5 is turned on by the signal Sig5, configuration is performed and configuration data is stored in the capacitor C1 in response to the signals Sig3, Sig4, Sig2_0, and Sig2_1.

On the other hand, when the transistor M5 is turned off, configuration data retained in the capacitor C1 is output to OUT through the transistor M3 for selecting context. The configuration data is output to one of a source and a drain of the transistor 1110 and the inverter 1122 in FIG. 18.

Next, the transistors 1110 to 1113 and the inverter 1122 included in the MUX 1109 are described.

A power supply line 1119 is electrically connected to a gate of the transistor 1110. Power supply voltage VDD may be applied to the power supply line 1119. Note that VDD is high power supply voltage. Low power supply voltage is VSS; however, the low power supply voltage might be GND. Here, the voltage of each wiring or each terminal is relative voltage, and whether the voltage is higher or lower than reference voltage is important. Thus, GND does not necessarily mean 0 V. The same applies to the drawings, and GND in the drawings does not necessarily mean 0 V. Note that one terminal of a capacitor is connected to GND in some of the drawings; however, one terminal of the capacitor may be connected to a power supply line VSS or VDD as long as the voltage can be held. In addition, the voltage applied to the power supply line may be any voltage as long as the transistor 1110 can be turned on.

One of the source and the drain of the transistor 1110 is electrically connected to the memory 1114.

The other of the source and the drain of the transistor 1110 is electrically connected to a gate of the transistor 1111.

One of a source and a drain of the transistor 1111 is electrically connected to an output of the LUT 1115.

The other of the source and the drain of the transistor 1111 is electrically connected to an output of the MUX 1109.

An input of the inverter 1122 is electrically connected to the memory 1114. An output of the inverter 1122 is electrically connected to one of a source and a drain of the transistor 1112.

The inverter 1122 inverts configuration data from the memory 1114. The inverted configuration data is input to one of the source and the drain of the transistor 1112.

A gate of the transistor 1112 is electrically connected to the power supply line 1119. The voltage applied to the power supply line 1119 may be any voltage as long as the transistor 1112 can be turned on. Note that the gate of the transistor 1112 is also electrically connected to the gate of the transistor 1110.

The other of the source and the drain of the transistor 1112 is electrically connected to a gate of the transistor 1113.

The signal 1117 is input to one of a source and a drain of the transistor 1113.

The other of the source and the drain of the transistor 1113 is electrically connected to the output of the MUX 1109. Note that the other of the source and the drain of the transistor 1113 is also electrically connected to the other of the source and the drain of the transistor 1111.

The transistors 1110 to 1113 included in the semiconductor device 1101 can be formed using a variety of materials. In the case where an oxide semiconductor film is used in a channel formation region of the transistor, an effect of extremely low off-state current of the transistor can be obtained.

The semiconductor device 1101 may further include another circuit component such as a transistor, a diode, a resistor, a capacitor, or an inductor as needed.

<Boosting Effect>

When the transistors 1110 and 1112 in the MUX 1109 are off, nodes 1140 and 1141 become floating; thus, the MUX 1109 has the following boosting effect.

When the nodes 1140 and 1141 are floating, the potential of an input node 1148 or 1152 is changed from a low level to a high level. Then, capacitance Cgs formed among sources, drains, and gates of the transistors 1111 and 1113 increases the potentials of the nodes 1140 and 1141.

The increase in potentials of the nodes 1140 and 1141 depends on the logic level of configuration data input to the gates of the transistors 1111 and 1113.

For example, in the case where the configuration data is "0" (L potential), the transistors 1111 and 1113 are in a weak inversion mode. Thus, the capacitance Cgs that contributes to the increase in potentials of the nodes 1140 and 1141 includes the capacitance Cos that is independent of the potential of the gate electrode, i.e., the potentials of the nodes 1140 and 1141.

Note that the capacitance Cos includes overlap capacitance generated in a region where the gate electrode and the source region overlap with each other, and parasitic capacitance generated between the gate electrode and the source electrode, for example.

On the other hand, in the case where the configuration data is "1" (H potential), the transistors 1111 and 1113 are in a strong inversion mode. Thus, the capacitance Cgs that contributes to the increase in potentials of the nodes 1140 and 1141 includes, in addition to the capacitance Cos, part of the capacitance Cox generated between the channel formation region and the gate electrode. Accordingly, the capacitance Cgs that contributes to the increase in potentials of the nodes 1140 and 1141 at the time when the configuration data is "1" is larger than the capacitance Cgs at the time when the configuration data is "0".

The potentials of the nodes 1140 and 1141 at the time when the configuration data is "1" can be higher than the potentials of the nodes 1140 and 1141 at the time when the configuration data is "0" with a change in potential of the input node 1148 or 1152 (boosting effect).

The potentials of the nodes 1140 and 1141 can be increased by the boosting effect even when the potentials of the nodes 1140 and 1141 are decreased by the threshold voltage of the transistors 1110 and 1112 in the case where the configuration data is "1". Consequently, the transistors 1111 and 1113 can be turned on reliably.

The transistors 1111 and 1113 can be turned off reliably in the case where the configuration data is "0".

Note that in the case where the channel formation region of the transistor 1110 includes an oxide semiconductor, the off state current of the transistor 1110 can be extremely low. Thus, the use of an oxide semiconductor film can prevent a decrease in gate potential of the transistor 1111 when the transistor 1110 is off. Further, the use of an oxide semiconductor film in the channel formation region of the transistor 1112 can prevent a decrease in gate potential of the transistor 1113 when the transistor 1112 is off.

Figure 23:
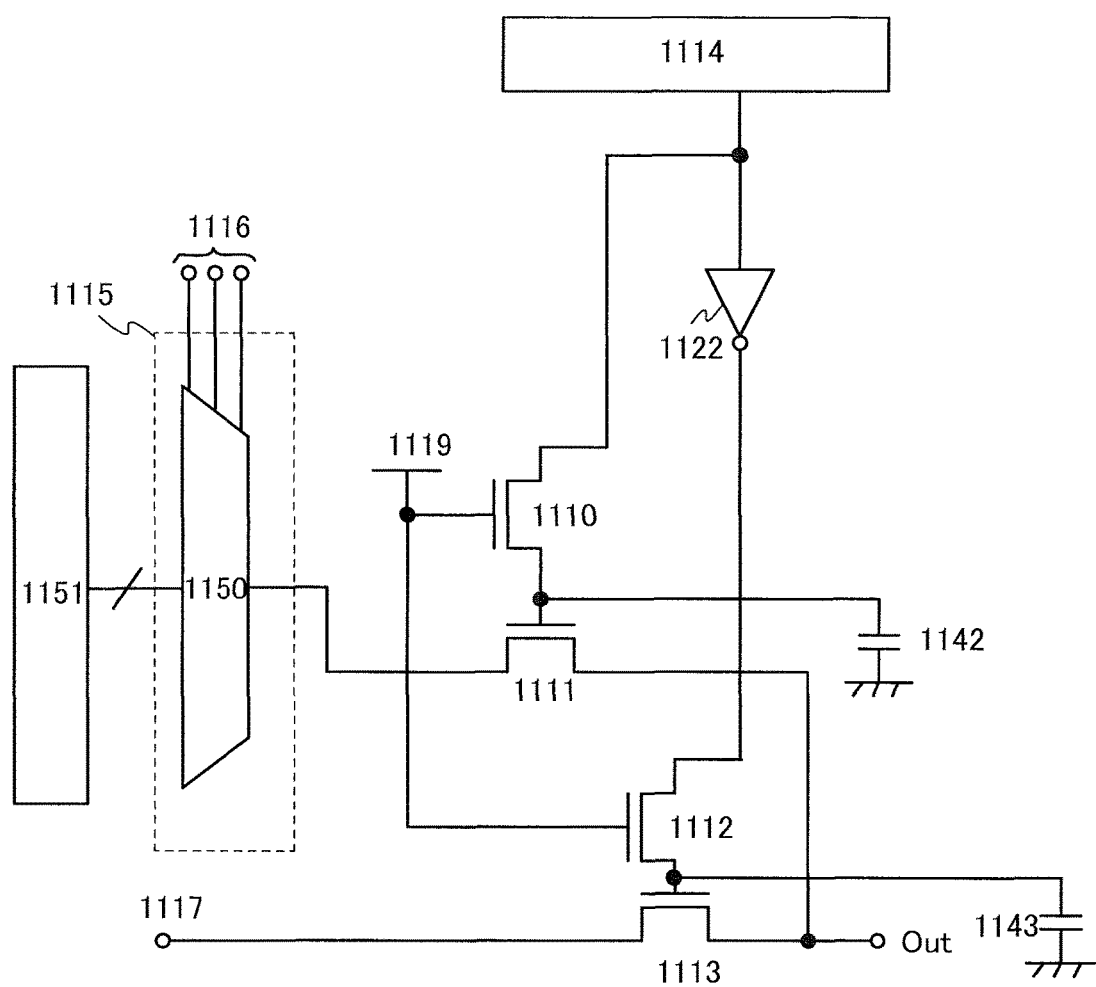
FIG. 23 is a semiconductor device circuit diagram.

It might be impossible to obtain the boosting effect when one electrode of the capacitor 1142 is electrically connected between the transistors 1110 and 1111 or one electrode of the capacitor 1143 is electrically connected between the transistors 1112 and 1113, as illustrated in FIG. 23. Thus, the capacitor 1142 or the capacitor 1143 is not necessarily provided.

<Semiconductor Device 1101 Operation>

Figure 20:
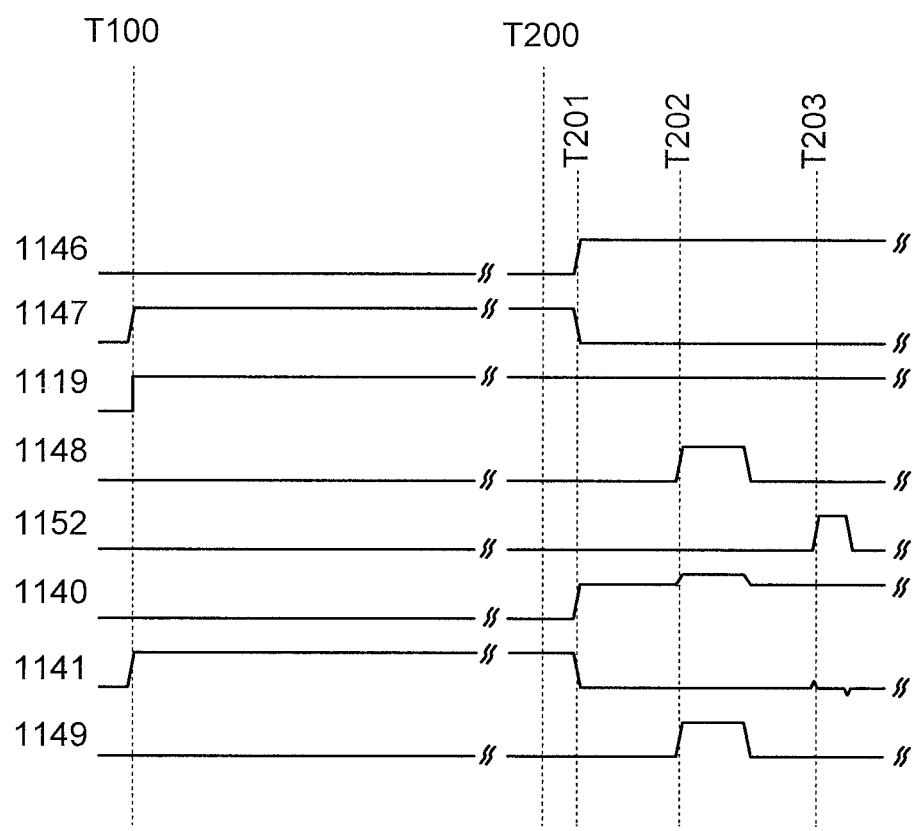
FIG. 20 is a timing chart.

Next, the operation of the semiconductor device 1101 is described. FIG. 20 is a timing chart.

At time T100, the semiconductor device 1101 is powered on, the potential of the power supply line 1119 is set to VDD, and the nodes 1144 and 1145 are set to VDD.

At the same time, configuration is started.

At this time, a node 1146 is fixed to GND. The transistor 1110 is turned on, and the node 1140 is set to "L" (low potential).

The transistor 1112 is turned on, the potential of a node 1147 is propagated to the node 1141, and the potential of the node 1141 is set to "H" (high potential). When the node 1141 is set to "H" (the threshold voltage of the transistor 1112 is (VDD–"H")), the transistor 1112 is turned off.

Since the node 1140 is at "L", the transistor 1111 is off. On the other hand, since the node 1141 is at "H", the transistor 1113 is on.

As a result, the input node 1148 of the multiplexer 1109 and an output node 1149 are out of conduction. The input node 1152 and an output (Out) are brought into conduction. During the configuration, the output (Out) always outputs "L" because the input signal 1117 is "L".

At time T200, the configuration is terminated.

At time T201, the potentials of the nodes 1146 and 1147 are not fixed, and voltage based on the value of a configuration memory is applied to the nodes 1146 and 1147.

In FIG. 20, "H" (high potential) and "L" (low potential) are applied to the nodes 1146 and 1147, respectively.

Since the transistor 1110 has been turned on, the potential of the node 1146 is propagated to the node 1140, and the potential of the node 1140 is increased from "L". When the node 1140 is set to "H" (the threshold voltage of the transistor 1110 is (VDD–"H")), the transistor 1110 is turned off.

On the other hand, the transistor 1112 is turned on, the potential of the node 1141 is set to "L", and the transistor 1113 is turned off.

As a result, the transistor 1111 is turned on, and the transistor 1113 is turned off.

Consequently, the input node 1148 and the output node 1149 are brought into conduction, and the input node 1152 and the output node 1149 are brought out of conduction. In other words, a signal input from the LUT 1115 is selected.

At the same time, a user can use the semiconductor device 1101.

At time T202 in which the user uses the semiconductor device 1101, the input node 1148 is set to "H".

Since the transistor 1111 is on, the capacitance Cgs (Cgs=Cos+Cox) is formed.

When "H" is input to the input node 1148, the potential of the floating node 1140 is increased to "H+$\Delta$V" by the capacitance. Thus, the potential of the output (Out) is not decreased by the threshold voltage of the transistor 1111, but is propagated while the input node 1148 is kept at the "H" potential (boosting effect).

On the other hand, at time T203, the input node 1152 is set to "H".

Since the transistor 1113 is off, capacitance Cgs=Cos is formed.

When "H" is input to the input node 1152, the potential of the node 1141 is increased slightly by the capacitance. However, the capacitance at the time when the potential of the node 1141 is increased slightly is lower than the capacitance at the time when the potential of the node 1141 is "H"; thus, the increase in potential is small.

As a result, the transistor 1113 is not turned on; thus, the potential of the output node 1149 is equal to the potential of an output signal 1132.

<Effect>

The MUX 1109 has significant function effects in addition to the boosting effect. The function effects are described in terms of circuit size, power consumption, and delay time.

First, the function effect is described in terms of circuit size. Here, the MUX 1109 is compared to an MUX 200 including logic circuits.

Figure 21:
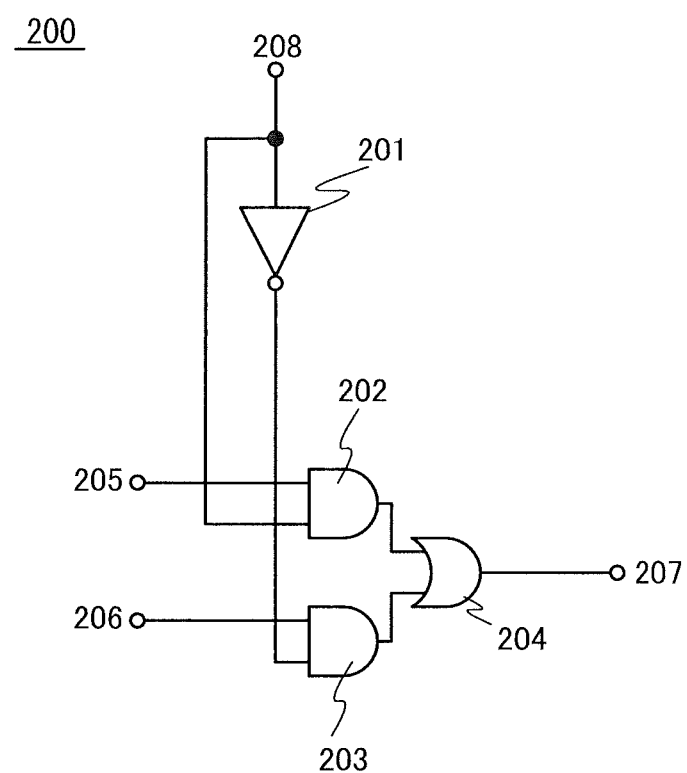
FIG. 21 illustrates a multiplexer including logic circuits.

FIG. 21 illustrates the MUX 200 including logic circuits. The MUX 200 includes an inverter 201, an AND circuit 202, an AND circuit 203, and an OR circuit 204.

A signal 205 and a signal 208 are input to the AND circuit 202.

A signal 206 and a signal output from the inverter 201, i.e., a signal obtained by inversion of the signal 208 are input to the AND circuit 203.

A signal output from the AND circuit 202 and a signal output from the AND circuit 203 are input to the OR circuit 204, and a signal 207 is output from the OR circuit 204.

Figure 22A:
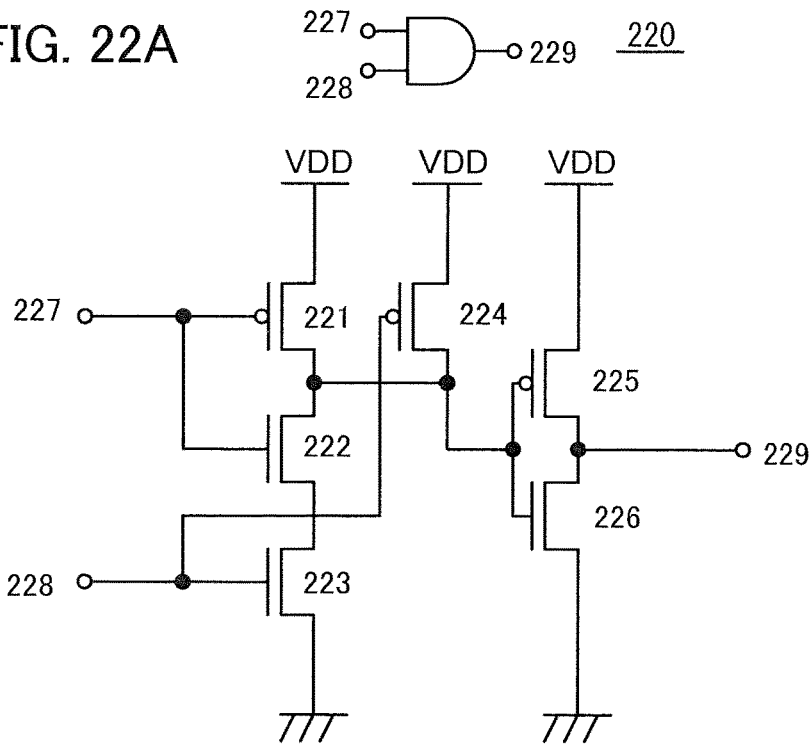
FIGS. 22A and 22B illustrate multiplexers including logic circuits.

FIG. 22A illustrates a CMOS AND circuit 220. The AND circuit 220 includes a transistor 221, a transistor 222, a transistor 223, a transistor 224, a transistor 225, and a transistor 226. A signal 227 and a signal 228 are input to the AND circuit 220, and a signal 229 is output from the AND circuit 220.

Figure 22B:
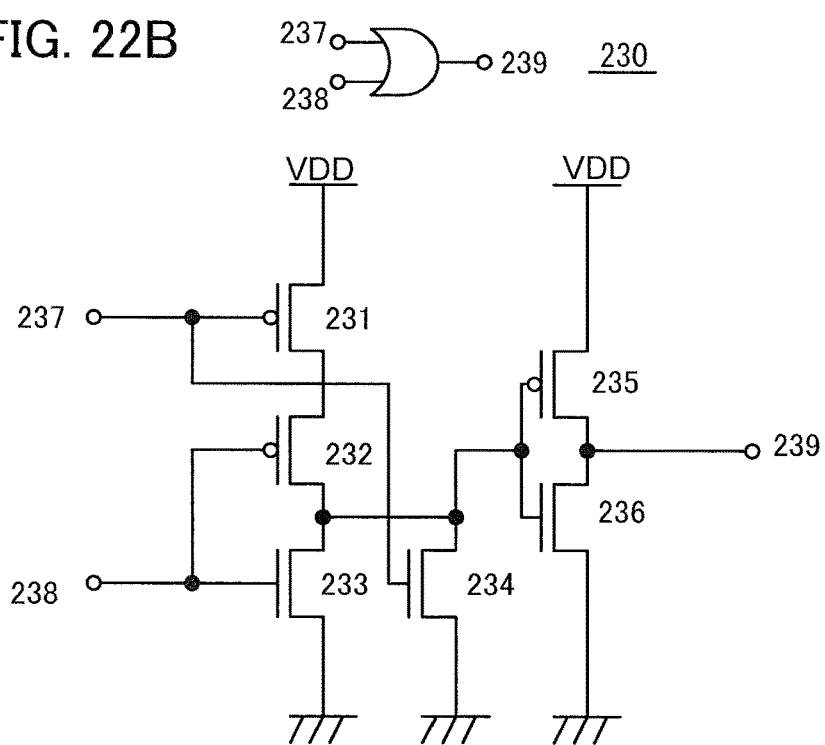

FIG. 22B illustrates a CMOS OR circuit 230. The OR circuit 230 includes a transistor 231, a transistor 232, a transistor 233, a transistor 234, a transistor 235, and a transistor 236. A signal 237 and a signal 238 are input to the OR circuit 230, and a signal 239 is output from the OR circuit 230.

The MUX 1109 includes the transistor 1110, the transistor 1111, the transistor 1112, and the transistor 1113. Thus, the number of transistors included in the MUX 1109 is smaller than the number of transistors included in the MUX 200.

Thus, the semiconductor device 1101 including the MUX 1109 has an advantage of a decrease in circuit size.

Next, the function effects are described in terms of power consumption and delay time.

The signal 205 and the signal 206 are input to the MUX 200, and the signal 207 is output from the MUX 200.

The AND circuit 202 is similar to the AND circuit 220, the signal 205 corresponds to the signal 227, and the signal 208 corresponds to the signal 228. The OR circuit 204 is similar to the OR circuit 230, the signal 229 from the AND circuit 220 corresponds to the signal 237, and the signal 207 corresponds to the signal 239.

After the signal 205 is input to the AND circuit 220, the signal 205 is input to gates of the transistor 221 and the transistor 222 (corresponding to a first gate stage).

Then, outputs from the transistor 221 and the transistor 222 are input to gates of the transistor 225 and the transistor 226 (corresponding to a second gate stage).

Next, the transistor 225 and the transistor 226 output the signal 229.

Then, the signal 229 is input to gates of the transistor 231 and the transistor 234 (corresponding to a third gate stage).

After that, an output from the transistor 234 is input to gates of the transistor 235 and the transistor 236 (corresponding to a fourth gate stage).

The power consumption of a semiconductor device is classified into dynamic power consumption and static power consumption. The dynamic power consumption depends on the amount of electric charge accumulated in gate capacitance of a transistor. The static power consumption is the product of static power consumption and power supply voltage.

Accordingly, as the number of gate stages increases, dynamic power consumption increases. If dynamic power consumption per gate stage is denoted by p, the dynamic power consumption of the MUX 200 is 4p.

In addition, as the number of gate stages increases, static power consumption also increases.

If gate delay time per gate stage is denoted by t, the delay time of the MUX 200 is 4t.

On the other hand, neither a signal from the LUT 1115 nor the signal 1117 is input to gate stages in the MUX 1109, but the signal 1132 is output from the MUX 1109. Thus, power consumption due to the use of gate stages is not generated. Further, operation speed can be increased because gate delay is not generated.

<PLE 911 and PLD 910>

Figure 24:
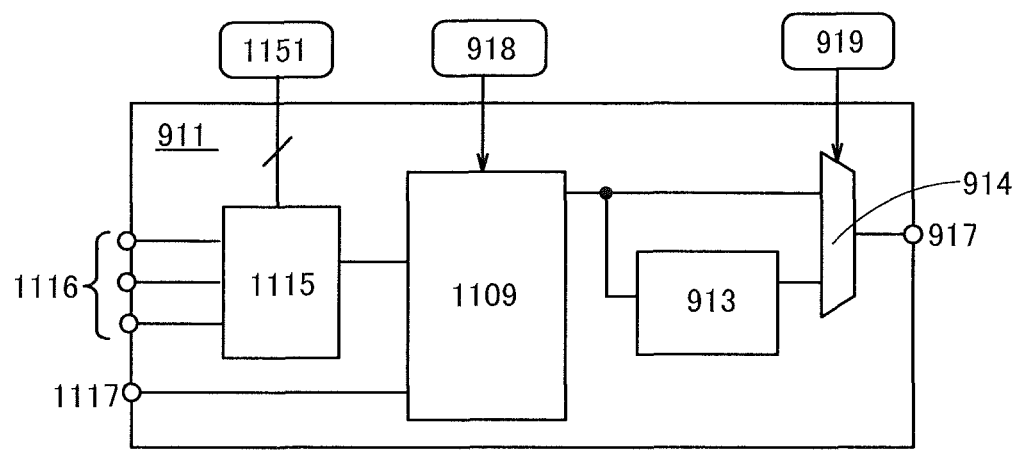
FIG. 24 is a block diagram of a logic element.

Next, FIG. 24 is a block diagram illustrating a structure example of a PLE 911 including the semiconductor device 1101. The PLE 911 includes at least the LUT 1115, the MUX 1109, a flip-flop (FF) 913, and an MUX 914.

The LUT 1115 includes at least the MUX 1150, as illustrated in FIG. 18. The plurality of signals 1116 are input to the MUX 1150. The MUX 1150 selects data stored in the memory 1151 and outputs a signal to the MUX 1109.

A signal is input from the LUT 1115 to the MUX 1109. The signal 1117 is also input to the MUX 1109. Configuration data 918 including data for controlling the operation of the MUX 1109 is also input from the memory 1114 to the MUX 1109. The MUX 1109 outputs a signal from the LUT 1115 or the signal 1117 in accordance with the configuration data 918.

A signal output from the MUX 1109 is input to the FF 913. The FF 913 has a function of holding an input signal.

Configuration data 919 including data for controlling the operation of the MUX 914 is input to the MUX 914. The configuration data 919 may be output from the memory 1114 or may be output from another memory.

The MUX 914 has a function of selecting any one of a signal output from the MUX 1109 and a signal output from the FF 913 in accordance with the configuration data 919. The MUX 914 outputs a signal 917.

Like the PLE 11 in FIG. 1B, the PLE 911 in FIG. 24 can be used in the PLD 10 in FIG. 1A.

Embodiment 3

Figure 25:
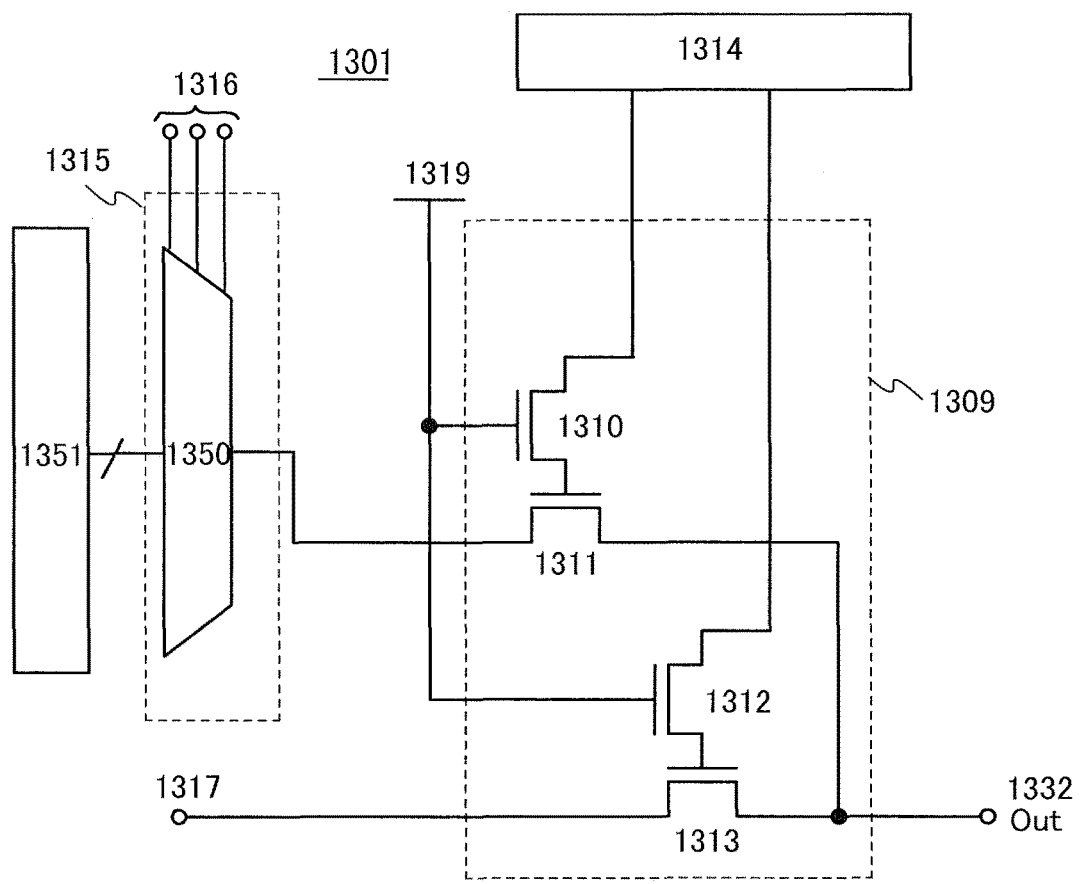
FIG. 25 is a semiconductor device circuit diagram.

A semiconductor device 1301 in FIG. 25 can function as part of a PLE and includes at least an MUX 1309, an LUT 1315, and a memory 1314.

A signal is input from the LUT 1315 to the MUX 1309.

The LUT 1315 includes at least an MUX 1350. A memory 1351 includes a memory element and stores configuration data. A plurality of signals 1316 are input to the MUX 1350. The memory 1351 is connected to the MUX 1350 through a bus line. The MUX 1350 selects data stored in the memory 1351 and outputs a signal to the MUX 1309.

A signal is input from the LUT 1315 to the MUX 1309. A signal 1317 is input to the MUX 1309. Note that the signal 1317 may also be input to the LUT 1315, and a signal from the LUT 1315 may be input to the MUX 1309.

The MUX 1309 is electrically connected to the memory 1314.

The memory 1314 includes a memory element and stores configuration data. The memory 1314 and the memory 1351 can be any of the memories described in Embodiment 2.

The MUX 1309 selects the transistor 1311 or the transistor 1313 in accordance with configuration data and outputs a signal 1332.

The MUX 1309 includes at least a transistor 1310, a transistor 1311, a transistor 1312, and a transistor 1313. The transistor 1310 and the transistor 1312 can function as boost transistors. The transistor 1311 and the transistor 1313 can function as path transistors.

A gate of the transistor 1310 is electrically connected to a power supply line 1319. VDD is applied to the gate of the transistor 1310. The voltage applied to the power supply line 1319 may be any voltage as long as the transistor 1310 can be turned on.

One of a source and a drain of the transistor 1310 is electrically connected to the memory 1314.

The other of the source and the drain of the transistor 1310 is electrically connected to a gate of the transistor 1311.

One of a source and a drain of the transistor 1311 is electrically connected to an output of the LUT 1315.

The other of the source and the drain of the transistor 1311 is electrically connected to an output of the MUX 1309.

A gate of the transistor 1312 is electrically connected to the power supply line 1319. The voltage applied to the power supply line 1319 may be any voltage as long as the transistor 1312 can be turned on. Note that the gate of the transistor 1312 is also electrically connected to the gate of the transistor 1310.

One of a source and a drain of the transistor 1312 is electrically connected to the memory 1314.

The other of the source and the drain of the transistor 1312 is electrically connected to a gate of the transistor 1313.

The signal 1317 is input to one of a source and a drain of the transistor 1313.

The other of the source and the drain of the transistor 1313 is electrically connected to the output of the MUX 1309. Note that other of the source and the drain of the transistor 1313 is also electrically connected to the other of the source and the drain of the transistor 1311.

Note that since the structure of the MUX 1309 is similar to that of the MUX 1109, the MUX 1309 has effects similar to those of the MUX 1109.

The transistors included in the semiconductor device 1301 can be formed using a variety of materials. In the case where an oxide semiconductor film is used in a channel formation region of the transistor, an effect of extremely low off-state current of the transistor can be obtained.

The semiconductor device 1301 can operate like the semiconductor device 1101.

Embodiment 4

Figure 26:
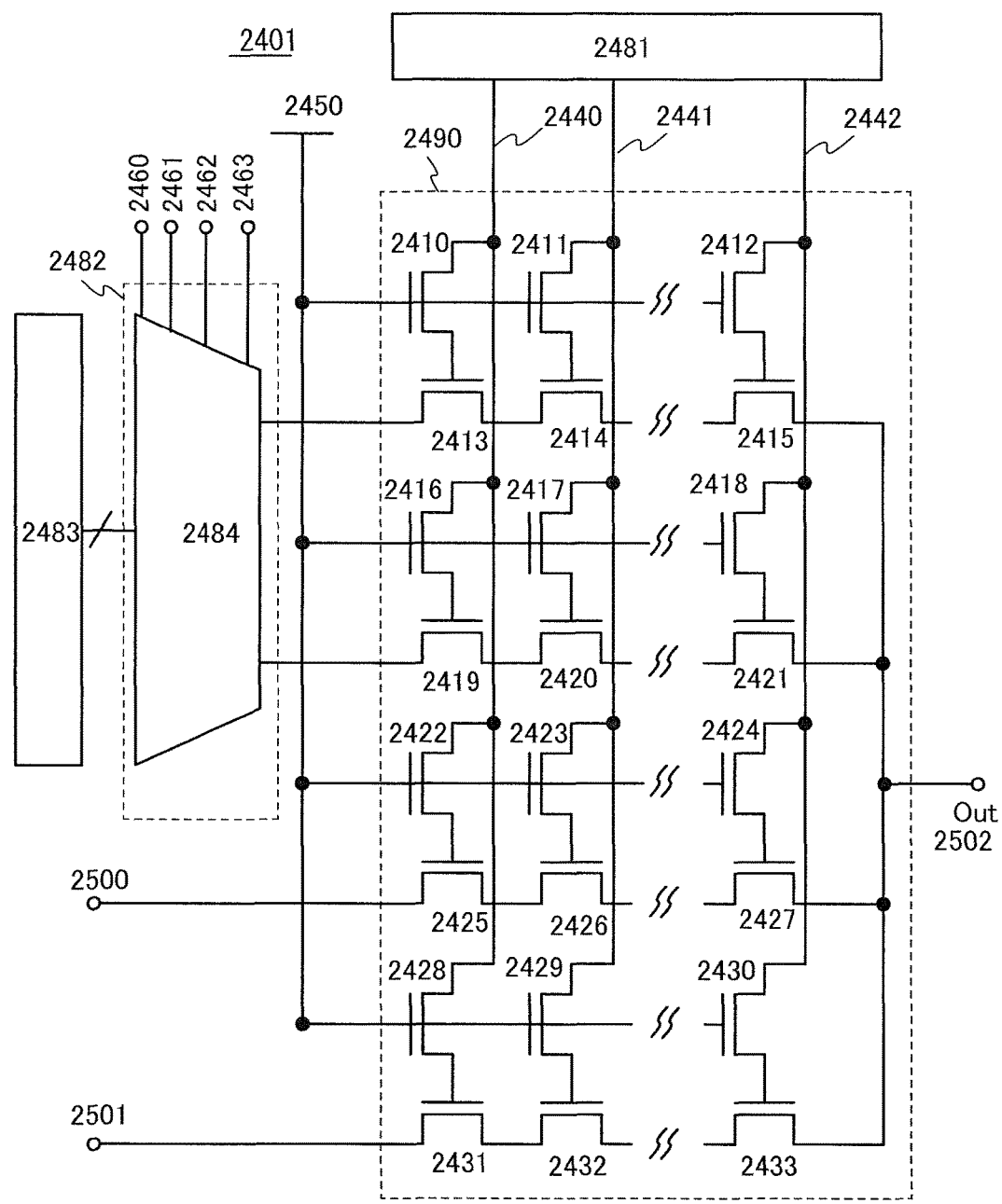
FIG. 26 is a semiconductor device circuit diagram.

In the semiconductor device 1101 described in Embodiment 2, the multiplexer 1109 includes four transistors (the transistor 1110, the transistor 1111, the transistor 1112, and the transistor 1113). However, one embodiment of the present invention is not limited thereto, and transistors may be arranged in matrix (see FIG. 26).

A semiconductor device 2401 can function as part of a programmable logic element and includes at least an MUX 2490 and an LUT 2482.

The MUX 2490 is electrically connected to an output of the LUT 2482.

The LUT 2482 includes at least an MUX 2484. A memory 2483 includes a memory element and stores configuration data. A signal 2460, a signal 2461, a signal 2462, and a signal 2463 are input to the MUX 2484. The memory 2483 is connected to the MUX 2484 through a bus line. The MUX 2484 selects data and outputs a signal to the MUX 2490. A plurality of signals may also be input to the MUX 2490.

A signal 2500 and a signal 2501 are also input to the MUX 2490. Note that the signal 2500 and the signal 2501 may also be input to the LUT 2482, and a signal may be input from the LUT 2482 to the MUX 2490.

The LUT 2482 can be any of the LUTs described in Embodiments 2 and 3.

Configuration data is input from a memory 2481 to the MUX 2490 through a wiring 2440, a wiring 2441, and a wiring 2442. The memory 2481 stores configuration data or the like. Note that a plurality of wirings may be provided between the wiring 2441 and the wiring 2442, and configuration data may be input to the MUX 2490.

The memory 2481 can be any of the memories described in Embodiment 2.

The MUX 2490 selects transistors 2413 to 2415, transistors 2419 to 2421, transistors 2425 to 2427, and transistors 2431 to 2433 in accordance with configuration data, and outputs a signal 2502.

The MUX 2490 includes at least transistors 2410 to 2433.

The transistors 2410 to 2412, the transistors 2416 to 2418, the transistors 2422 to 2424, and the transistors 2428 to 2430 can function as boost transistors. Note that a plurality of transistors may be provided between the transistors 2411 and 2412, between the transistors 2417 and 2418, between the transistors 2423 and 2424, or between the transistors 2429 and 2430. A signal is input from a wiring provided between the wirings 2441 and 2442 to one of a source and a drain of each of the plurality of transistors. Gates of the plurality of transistors are electrically connected to a power supply line 2450.

The transistors 2413 to 2415, the transistors 2419 to 2421, the transistors 2425 to 2427, and the transistors 2431 to 2433 can function as path transistors. A plurality of path transistors are electrically connected to each other in series with respect to one input signal. For example, the transistors 2425 to 2427 are electrically connected to each other in series with respect to the signal 2500. Note that a plurality of transistors may be provided between the transistors 2414 and 2415, between the transistors 2420 and 2421, between the transistors 2426 and 2427, or between the transistors 2432 and 2433.

Gates of the transistors 2410 to 2412, the transistors 2416 to 2418, the transistors 2422 to 2424, and the transistors 2428 to 2430 are electrically connected to the power supply line 2450 and are supplied with VDD. The voltage applied to the power supply line 2450 may be any voltage as long as the transistors 2410 to 2412, the transistors 2416 to 2418, the transistors 2422 to 2424, and the transistors 2428 to 2430 can be turned on.

In the MUX 2490, one boost transistor (e.g., the transistor 2410) is provided with respect to one path transistor (e.g., the transistor 2413). The MUX 2490 has the boosting effect like the MUX 1109. Accordingly, a signal passing through the transistor 2413 is not attenuated by the threshold voltage of the transistor 2413. For example, a signal input to a source and a drain of the transistor 2413 passes through the transistors 2413 to 2415 to be output as the signal 2502 without attenuation.

Further, the MUX 2490 has effects similar to those of the MUX 1109.

Embodiment 5

Figure 33:
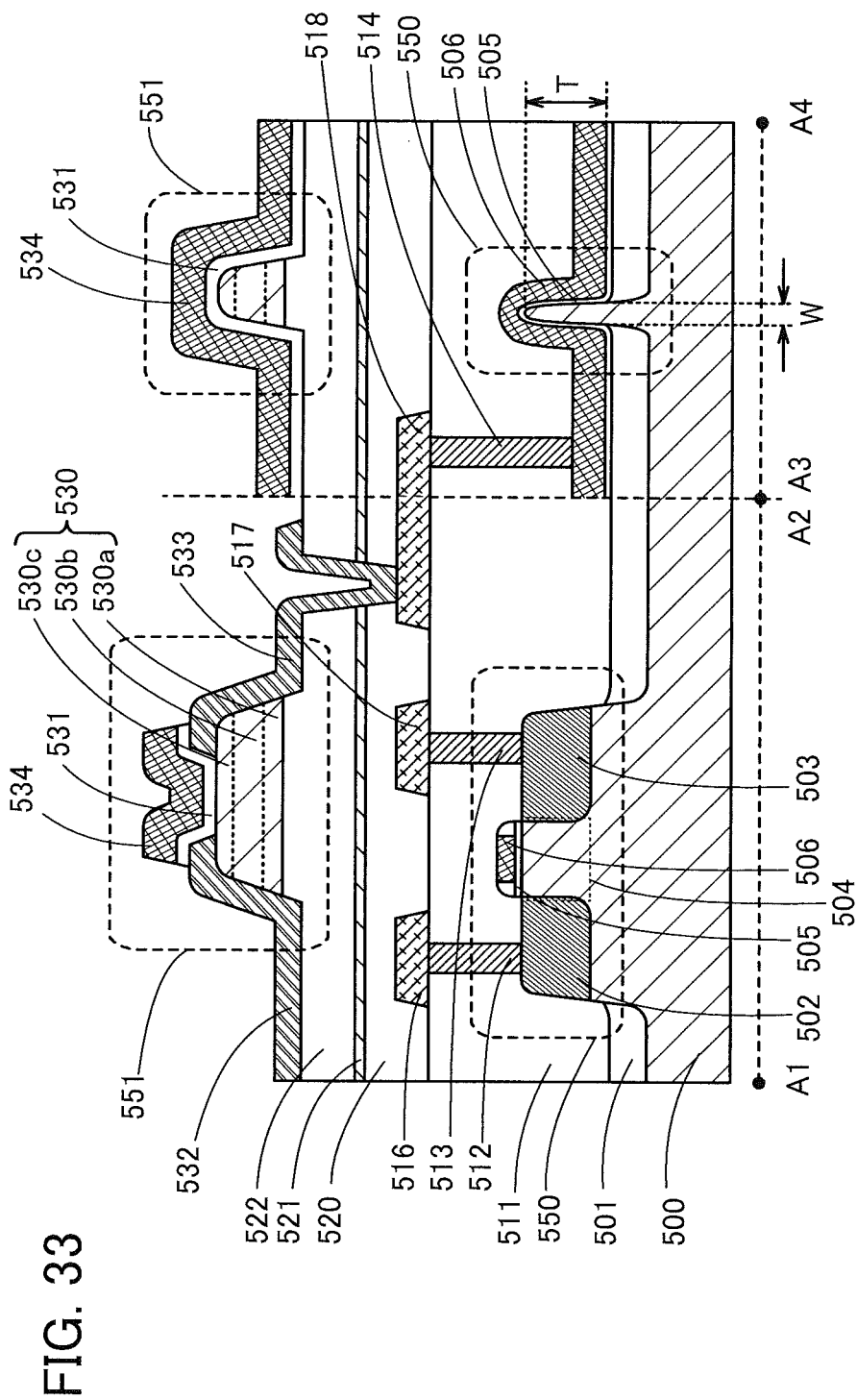
FIG. 33 is a semiconductor device cross-sectional view.

FIG. 33 illustrates a cross-sectional structure example of a semiconductor device according to one embodiment of the present invention. Note that the structures of transistors 550 and 551 in a channel length direction are shown in a region indicated by broken line A1-A2, and the structures of the transistors 550 and 551 in a channel width direction are shown in a region indicated by broken line A3-A4. In one embodiment of the present invention, the channel length direction of the transistor 550 is not necessarily aligned with the channel length direction of the transistor 551.

Note that the channel length direction means a direction in which a carrier moves between a pair of impurity regions functioning as a source region and a drain region by the most direct way, and the channel width direction means a direction perpendicular to the channel length direction.

In FIG. 33, the transistor 551 including a channel formation region in an oxide semiconductor film is formed over the transistor 550 including a channel formation region in a single crystal silicon substrate.

The transistor 550 may include a channel formation region in a semiconductor film or a semiconductor substrate of silicon, germanium, or the like in an amorphous, microcrystalline, polycrystalline, or signal crystal state. Alternatively, the transistor 550 may include a channel formation region in an oxide semiconductor film or an oxide semiconductor substrate. In the case where the transistors each include a channel formation region in an oxide semiconductor film or an oxide semiconductor substrate, the transistor 551 is not necessarily stacked over the transistor 550, and the transistors 551 and 550 may be formed in the same layer.

In the case where the transistor 550 is formed using a silicon thin film, any of the following can be used for the thin film: amorphous silicon formed by sputtering or vapor phase growth such as plasma-enhanced CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A substrate 500 where the transistor 550 is formed can be, for example, a silicon substrate, a germanium substrate, or a silicon germanium substrate. In FIG. 33, a single crystal silicon substrate is used as the substrate 500.

The transistor 550 is electrically isolated by element isolation. Trench isolation (e.g., shallow trench isolation (STI)) or the like can be used as the element isolation. In FIG. 33, the transistor 550 is electrically isolated by trench isolation. Specifically, in FIG. 33, the transistor 550 is electrically isolated by element isolation using an element isolation region 501 formed in such a manner that an insulator including silicon oxide or the like is buried in a trench formed in the substrate 500 by etching or the like and then the insulator is removed partly by etching or the like.

On a projection of the substrate 500 in a region other than the trench, impurity regions 502 and 503 of the transistor 550 and a channel formation region 504 positioned between the impurity regions 502 and 503 are provided. The transistor 550 includes an insulating film 505 covering the channel formation region 504 and a gate electrode 506 overlapping with the channel formation region 504 with the insulating film 505 positioned therebetween.

In the transistor 550, a side portion and an upper portion of the projection in the channel formation region 504 overlaps with the gate electrode 506 with the insulating film 505 positioned therebetween, so that carriers flow in a wide area (including a side portion and an upper portion of the channel formation region 504). Thus, the area of the transistor 550 in the substrate can be small, and the amount of transfer of carriers in the transistor 550 can be increased. As a result, the on-state current and field-effect mobility of the transistor 550 are increased. In particular, if the width (surrounded channel width) of the projection in the channel formation region 504 in a channel width direction is denoted by W and the film thickness of the projection in the channel formation region 504 is denoted by T, carriers flow in a wider area when the aspect ratio that corresponds to the ratio of the film thickness T to the channel width W is high. Consequently, the on-state current and field-effect mobility of the transistor 550 can be further increased.

Note that in the case of the transistor 550 formed using a bulk semiconductor substrate, the aspect ratio is preferably 0.5 or higher, more preferably 1 or higher.

An insulating film 511 is provided over the transistor 550. Openings are formed in the insulating film 511. In the openings, conductive films 512 and 513 electrically connected to the impurity regions 502 and 503, respectively, and a conductive film 514 electrically connected to the gate electrode 506 are formed.

The conductive film 512 is electrically connected to a conductive film 516 formed over the insulating film 511. The conductive film 513 is electrically connected to a conductive film 517 formed over the insulating film 511. The conductive film 514 is electrically connected to a conductive film 518 formed over the insulating film 511.

An insulating film 520 is provided over the conductive films 516 to 518. An insulating film 521 having an effect of blocking diffusion of oxygen, hydrogen, and water is provided over the insulating film 520. As the insulating film 521 has higher density and becomes denser or has a fewer dangling bonds and becomes more chemically stable, the insulating film 521 has a higher blocking effect. The insulating film 521 having an effect of blocking diffusion of oxygen, hydrogen, and water can be forming using, for example, aluminum oxide, aluminum oxynitride, gallium oxide, gallium oxynitride, yttrium oxide, yttrium oxynitride, hafnium oxide, or hafnium oxynitride. The insulating film 521 having an effect of blocking diffusion of hydrogen and water can be formed using, for example, silicon nitride or silicon nitride oxide.

An insulating film 522 is provided over the insulating film 521. The transistor 551 is provided over the insulating film 522.

The transistor 551 includes, over the insulating film 522, a semiconductor film 530 including an oxide semiconductor; conductive films 532 and 533 that are electrically connected to the semiconductor film 530 and function as a source electrode and a drain electrode; a gate insulating film 531 covering the semiconductor film 530; and a gate electrode 534 overlapping with the semiconductor film 530 with the gate insulating film 531 positioned therebetween. Note that an opening is provided in the insulating films 520 to 522, and the conductive film 533 is connected to the conductive film 518 through the opening.

Note that in FIG. 33, the transistor 551 includes at least the gate electrode 534 on one side of the semiconductor film 530, and may further include a gate electrode overlapping with the semiconductor film 530 with the insulating film 522 positioned therebetween.

When the transistor 551 includes a pair of gate electrodes, a signal for controlling an on state or an off state may be supplied to one of the gate electrodes, and the other of the gate electrodes may be supplied with a potential from another element. In that case, potentials at the same level may be supplied to the pair of gate electrodes, or a fixed potential such as a ground potential may be supplied only to the other of the gate electrodes. By controlling the level of a potential applied to the other of the gate electrodes, the threshold voltage of the transistor can be controlled.

In FIG. 33, the transistor 551 has a single-gate structure where one channel formation region corresponding to one gate electrode 534 is provided. However, the transistor 551 may have a multi-gate structure where a plurality of channel formation regions are formed in one active layer by providing a plurality of gate electrodes electrically connected to each other.

As illustrated in FIG. 33, in the transistor 551, the semiconductor film 530 includes oxide semiconductor films 530a to 530c stacked sequentially over the insulating film 522. Note that in one embodiment of the present invention, the semiconductor film 530 of the transistor 551 may be formed using a single-layer metal oxide film.

Example

The verification results of an advantage of a multiplexer in a programmable logic element of a PLD according to one embodiment of the present invention and a comparison example that are obtained by circuit calculation are described.

An analog circuit simulator SmartSpice produced by Silvaco Data Systems Inc. was used for the circuit calculation, and power consumption and delay time of output with respect to input of multiplexers with different circuit structures were compared and evaluated.

Figure 27:
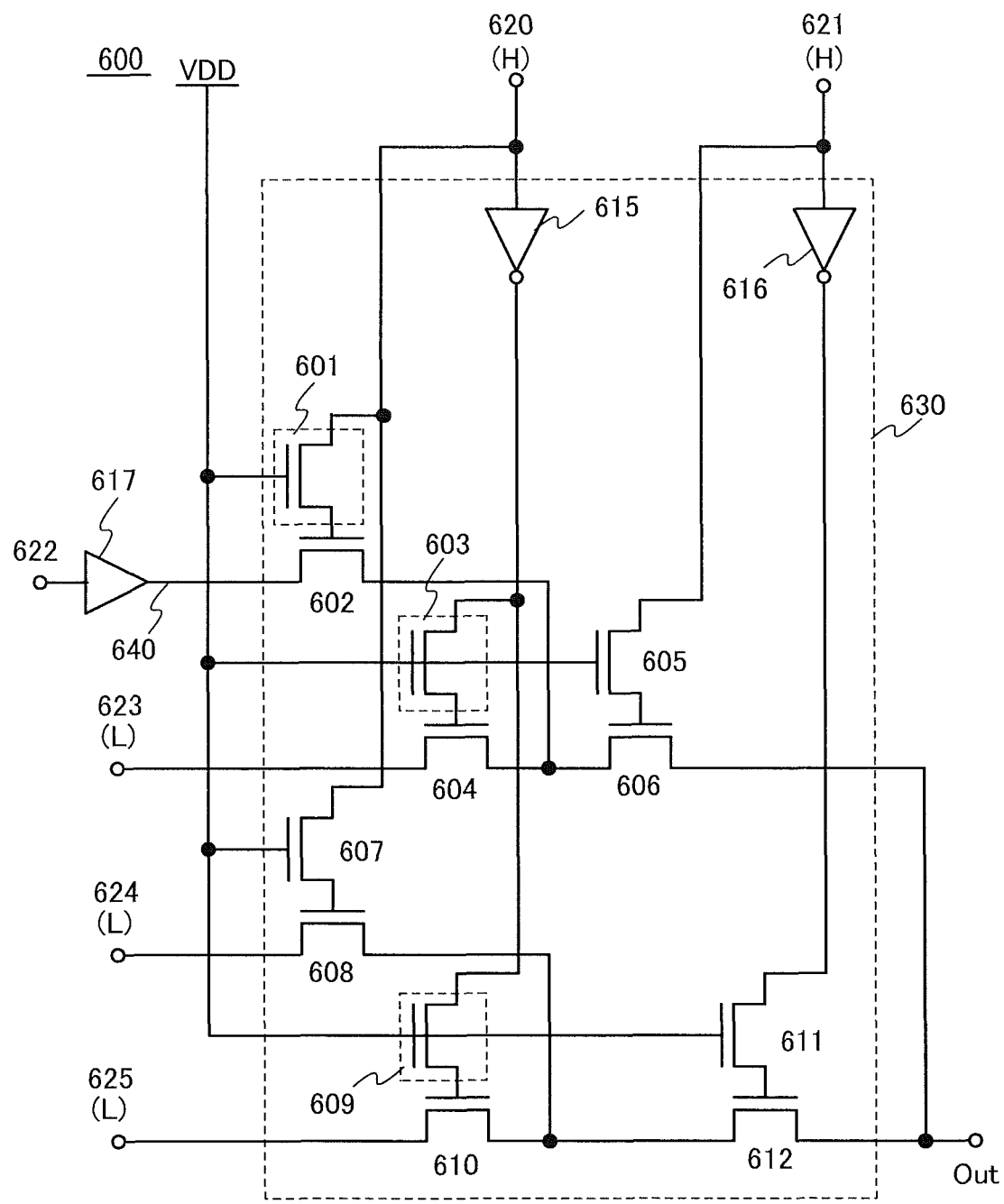
FIG. 27 illustrates a multiplexer according to one embodiment of the present invention.

FIG. 27 illustrates a device 600 used for the verification. The device 600 includes an MUX 630 and a buffer 617.

The MUX 630 includes transistors 601 to 612 and inverters 615 and 616.

Here, "OS" is written beside the transistors 601, 603, 605, 607, 609, and 611 to indicate that the transistors 601, 603, 605, 607, 609, and 611 are each a transistor including an oxide semiconductor film as a semiconductor film (hereinafter also referred to as an OS transistor).

Note that the other transistors, i.e., the transistors 602, 604, 606, 608, 610, and 612 are each a transistor including silicon in a semiconductor film (hereinafter also referred to as a Si transistor).

The power supply voltage VDD is applied to gates of the transistors 601, 603, 605, 607, 609, and 611.

A signal 620 is input to one of a source and a drain of the transistor 601. The other of the source and the drain of the transistor 601 is electrically connected to a gate of the transistor 602.

One of a source and a drain of the transistor 602 is electrically connected to the output of the buffer 617. The other of the source and the drain of the transistor 602 is electrically connected to one of a source and a drain of the transistor 606.

One of a source and a drain of the transistor 603 is electrically connected to the output of the inverter 615. The signal 620 is input to the inverter 615. The other of the source and the drain of the transistor 603 is electrically connected to a gate of the transistor 604.

A signal 623 is input to one of a source and a drain of the transistor 604. The other of the source and the drain of the transistor 604 is electrically connected to one of the source and the drain of the transistor 606.

A signal 621 is input to one of a source and a drain of the transistor 605. The other of the source and the drain of the transistor 605 is electrically connected to a gate of the transistor 606.

A signal 622 or the signal 623 is input to one of the source and the drain of the transistor 606. A signal output from the other of the source and the drain of the transistor 606 corresponds to a signal output from the MUX 630.

The signal 620 is input to one of a source and a drain of the transistor 607. The other of the source and the drain of the transistor 607 is electrically connected to a gate of the transistor 608.

A signal 624 is input to one of a source and a drain of the transistor 608. The other of the source and the drain of the transistor 608 is electrically connected to one of a source and a drain of the transistor 612.

One of a source and a drain of the transistor 609 is electrically connected to the output of the inverter 615. The other of the source and the drain of the transistor 609 is electrically connected to a gate of the transistor 610.

A signal 625 is input to one of a source and a drain of the transistor 610. The other of the source and the drain of the transistor 610 is electrically connected to one of the source and the drain of the transistor 612.

One of a source and a drain of the transistor 611 is electrically connected to the output of the inverter 616. The signal 621 is input to the inverter 616. The other of the source and the drain of the transistor 611 is electrically connected to a gate of the transistor 612.

The signal 624 or the signal 625 is input to one of the source and the drain of the transistor 612. A signal output from the other of the source and the drain of the transistor 612 corresponds to a signal output from the MUX 630.

Note that the transistors 601, 603, 605, 607, 609, and 611 can function as boost transistors.

The transistors 602, 604, 606, 608, 610, and 612 can function as path transistors.

Parameters for calculation of the device 600 in FIG. 27 are as follows.

Input voltage conditions are an H-level potential of 2.5 V and an L-level potential of 0 V.

Si transistor sizes are a channel length L of 0.5 µm and a channel width W of 4.0 µm (in the case of an n-channel transistor) or 8.0 µm (in the case of a p-channel transistor).

OS transistor sizes are a channel length L of 1.0 µm and a channel width W of 4.0 µm.

Note that parameters for the characteristics of the Si transistor and the OS transistor are derived from an actual device.

Figure 28:
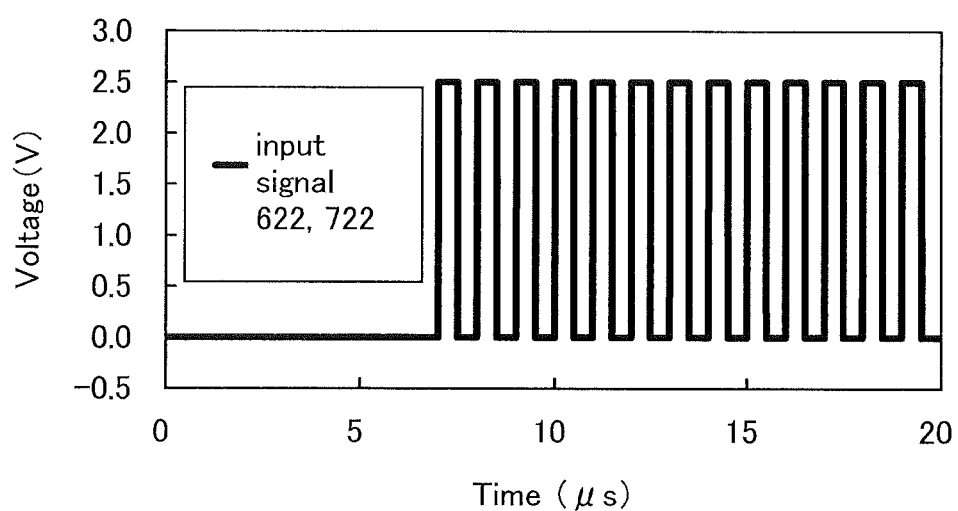
FIG. 28 is a timing chart.

FIG. 28 shows the waveform of the signal 622. After 0 V is input as initial voltage, a rectangular wave with a frequency of 1 MHz and a duty ratio of 1:1 is generated at time 7 µs.

On the other hand, H-level potentials are input as the signals 620 and 621 from time 0 µs.

L-level potentials are input as the signals 623 to 625 from the time 0 µs.

Since the transistor 601 is on, the signal 620 is input to the gate of the transistor 602, and the transistor 602 is turned on. The signal 622 is input to one of the source and the drain of the transistor 602 through the buffer 617, so that the signal 622 is output from the other of the source and the drain of the transistor 602.

Since the transistor 605 is on, the signal 621 is input to the gate of the transistor 606, and the transistor 606 is turned on. The signal 622 is input to one of the source and the drain of the transistor 606, so that the signal 622 is output from the other of the source and the drain of the transistor 606.

Since the transistor 603 is on, an inversion signal of the signal 620 is input to the gate of the transistor 604, and the transistor 604 is turned off. Although the signal 623 (L signal) is input to one of the source and the drain of the transistor 604, the L signal is not output because the transistor 604 is off.

Since the transistor 607 is on, the signal 620 is input to the gate of the transistor 608, and the transistor 608 is turned on. The signal 624 (L signal) is input to one of the source and the drain of the transistor 608, so that the L signal is output from the other of the source and the drain of the transistor 608.

Since the transistor 611 is on, an inversion signal of the signal 621 is input to the gate of the transistor 612, and the transistor 612 is turned off. Although the signal 624 (L signal) is input to one of the source and the drain of the transistor 612, the L signal is not output because the transistor 612 is off.

Since the transistor 609 is on, the inversion signal of the signal 620 is input to the gate of the transistor 610, and the transistor 610 is turned off. Although the signal 625 (L signal) is input to one of the source and the drain of the transistor 610, the L signal is not output because the transistor 610 is off.

As described above, the MUX 630 selects and outputs the signal 622.

Figure 29:
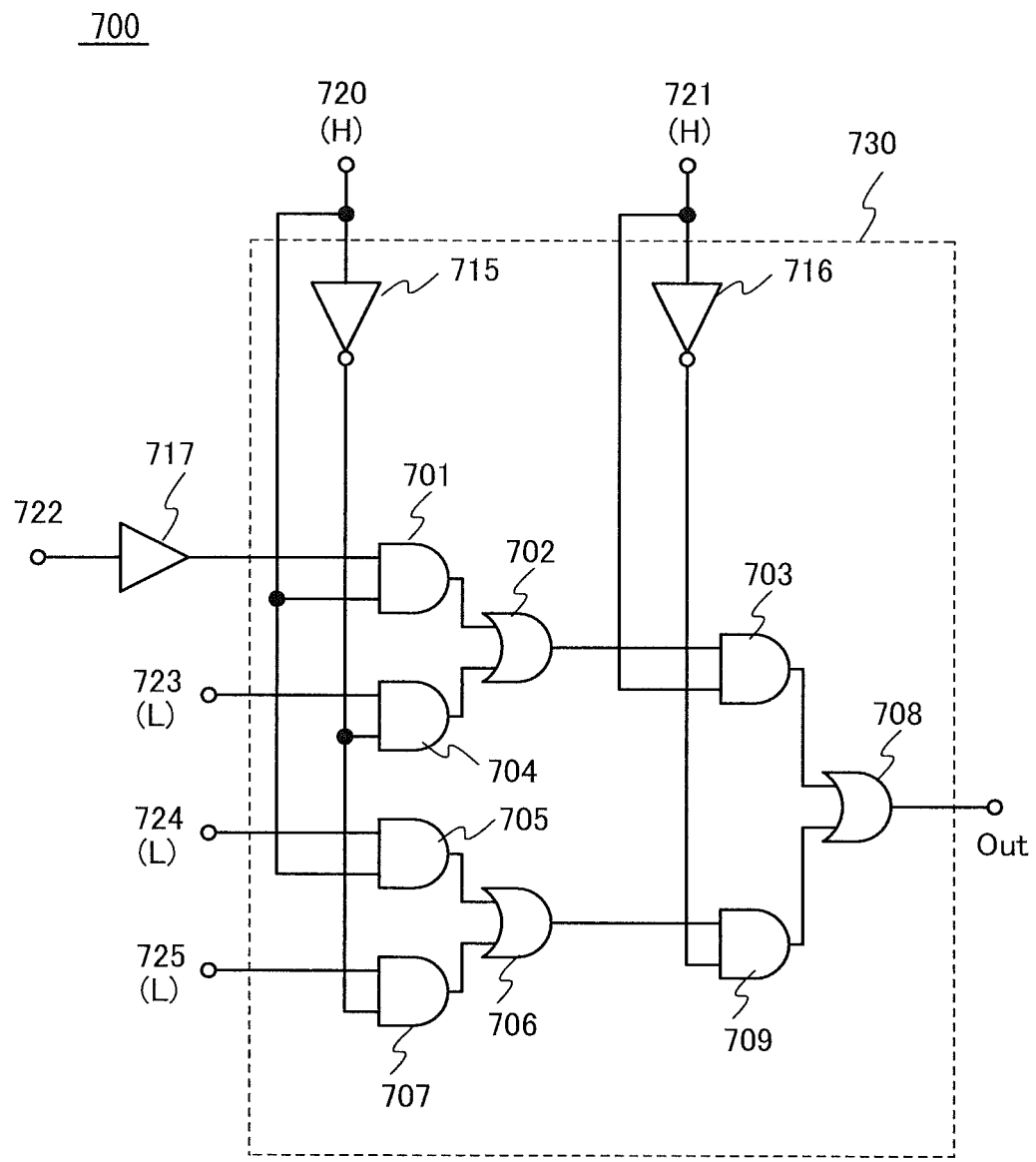
FIG. 29 illustrates a multiplexer including logic circuits.

For comparison, an MUX 730 is formed using logic circuits. FIG. 29 illustrates a device 700 including the MUX 730. The device 700 further includes a buffer 717.

The MUX 730 includes inverters 715 and 716, AND circuits 701, 703, 704, 705, 707, and 709, and OR circuits 702, 706, and 708. Transistors are all Si transistors.

A signal 720 is input to the AND circuit 701. In addition, a signal 722 is input to the AND circuit 701 through the buffer 717. The AND circuit 701 outputs a signal to the OR circuit 702.

An inversion signal of the signal 720 and a signal 723 are input to the AND circuit 704. The AND circuit 704 outputs a signal to the OR circuit 702.

The signal 720 and a signal 724 are input to the AND circuit 705. The AND circuit 705 outputs a signal to the OR circuit 706.

The inversion signal of the signal 720 and a signal 725 are input to the AND circuit 707. The AND circuit 707 outputs a signal to the OR circuit 706.

A signal 721 is input to the AND circuit 703. An output of the OR circuit 702 is input to the AND circuit 703. The AND circuit 703 outputs a signal to the OR circuit 708.

An inversion signal of the signal 721 is input to the AND circuit 709. In addition, an output of the OR circuit 706 is input to the AND circuit 709. The AND circuit 709 outputs a signal to the OR circuit 708.

A signal output from the OR circuit 708 corresponds to a signal output from the MUX 730.

Parameters for calculation of the device 700 in FIG. 29 are as follows.

Input voltage conditions are an H-level potential of 2.5 V and an L-level potential of 0 V.

Si transistor sizes are a channel length L of 0.5 µm and a channel width W of 4.0 µm (in the case of an n-channel transistor) or 8.0 µm (in the case of a p-channel transistor).

Note that parameters for the characteristics of the Si transistor are derived from an actual device.

FIG. 28 shows the waveform of the signal 722.

After 0 V is input as initial voltage, a rectangular wave with a frequency of 1 MHz and a duty ratio of 1:1 is generated at the time 7 µs.

On the other hand, H-level potentials are input as the signals 720 and 721 from the time 0 µs.

L-level potentials are input as the signals 723 to 725 from the time 0 µs.

The signal 720 (H signal) is input to the AND circuit 701. In addition, the signal 722 is input to the AND circuit 701 through the buffer 717. The AND circuit 701 outputs H voltage to the OR circuit 702 when the signal 722 is H voltage and outputs L voltage to the OR circuit 702 when the signal 722 is L voltage.

The inversion signal of the signal 720 and the signal 723 (L signal) are input to the AND circuit 704. The AND circuit 704 outputs an L signal to the OR circuit 702.

The OR circuit 702 outputs H voltage when an output from the AND circuit 701 is H voltage and outputs L voltage when the output from the AND circuit 701 is L voltage.

The signal 720 (H signal) and the signal 724 (L signal) are input to the AND circuit 705. The AND circuit 705 outputs an L signal to the OR circuit 706.

The inversion signal of the signal 720 and the signal 725 (L signal) are input to the AND circuit 707. The AND circuit 707 outputs an L signal to the OR circuit 706.

The OR circuit 706 outputs an L signal.

The signal 721 (H signal) is input to the AND circuit 703. In addition, the output of the OR circuit 702 is input to the AND circuit 703. The AND circuit 703 outputs H voltage when the output from the OR circuit 702 is H voltage and outputs L voltage when the output from the OR circuit 702 is L voltage.

The inversion signal of the signal 721 is input to the AND circuit 709. In addition, the output (L signal) of the OR circuit 706 is input to the AND circuit 709. The AND circuit 709 outputs an L signal.

The OR circuit 708 outputs H voltage when an output from the AND circuit 703 is H voltage and outputs L voltage when the output from the AND circuit 703 is L voltage.

Thus, the MUX 730 outputs H voltage when the signal 722 is H voltage and outputs L voltage when the signal 722 is L voltage. As described above, the MUX 730 selects and outputs the signal 722.

Figure 30:
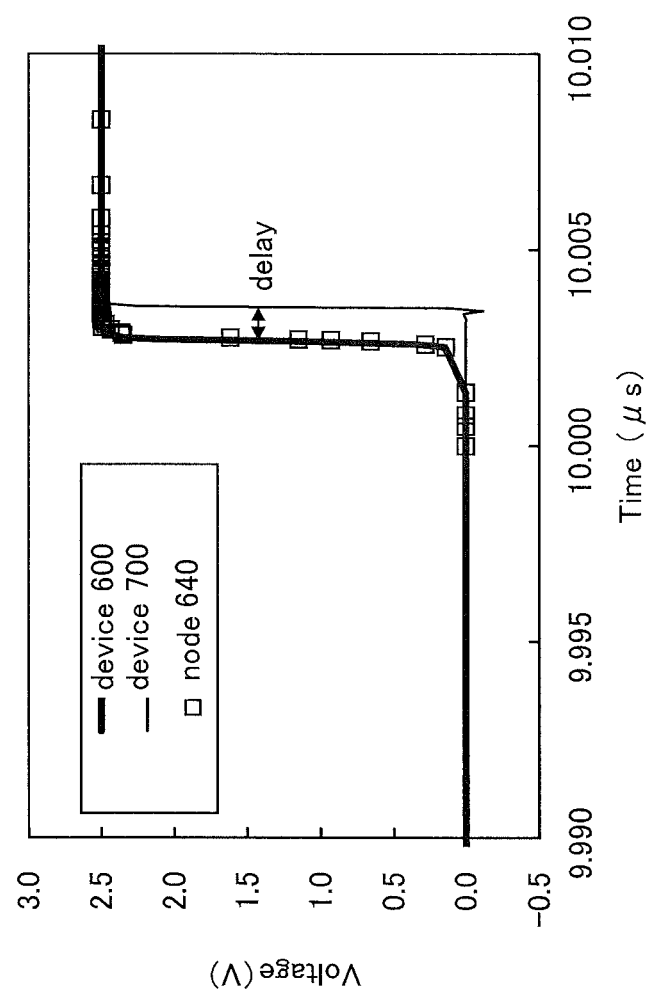
FIG. 30 shows a relationship between voltage and time.

FIG. 30 illustrates waveforms of signals output from the device 600 and the device 700 (relationships between voltage (V) and time (µs)). In FIG. 30, the signals output from the device 600 and the device 700 are indicated by a thick line and a thin line, respectively. In addition, a signal of a node 640 in the device 600 is denoted by □. The node 640 corresponds to an output portion of the buffer 617.

Signals input to the device 600 and the device 700 are alternately H voltage and L voltage, and oscillation frequency is 1 MHz. FIG. 30 illustrates waveforms of output signals at the time when input signals are changed from L voltage into H voltage.

The signal output from the device 700 is delayed compared to the signal output from the device 600. This is due to gate delay as described in Embodiment 2.

In the device 700, gate delay occurs because the signal is input to many gates before the signal is output. On the other hand, in the device 600, gate delay does not occur because the signal 622 is not input to gates (excluding the buffer 617). Thus, the signal output from the device 700 is delayed compared to the signal output from the device 600.

In FIG. 30, the voltage (H voltage) of the signal output from the device 600 is equal to the voltage (H voltage) of a signal output from the node 640. This indicates that the input signal is output without a decrease in voltage by the threshold voltage of a path transistor, as described in Embodiment 2.

Figure 31:
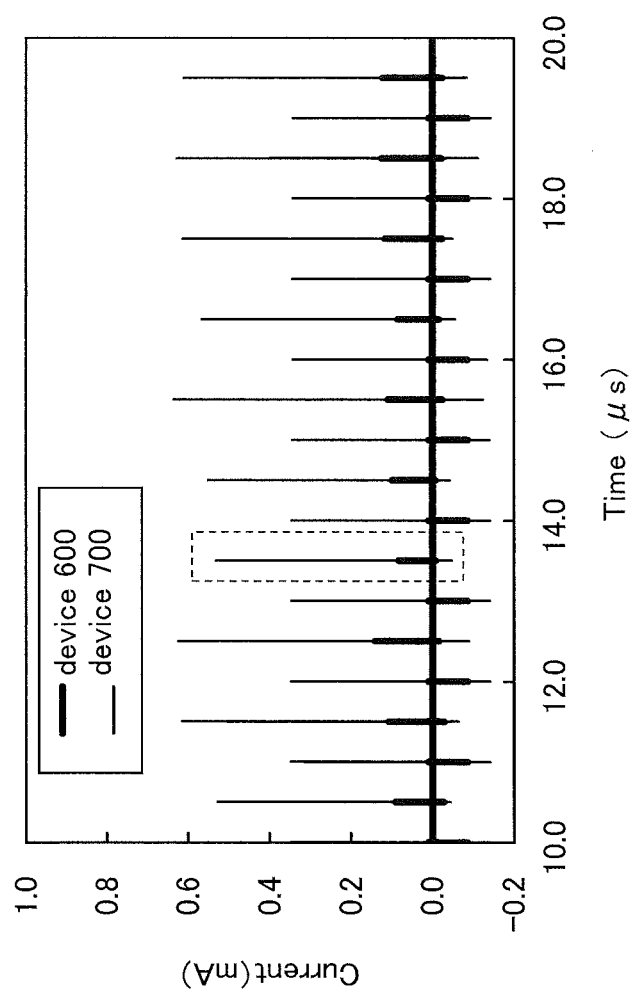
FIG. 31 shows a relationship between current and time.

FIG. 31 shows relationships between power consumption (mA) and time (µs) in the device 600 and the device 700. The relationship between power consumption and time in the device 600 and the relationship between power consumption and time in the device 700 are indicated by a thick line and a thin line, respectively.

Signals input to the device 600 and the device 700 are alternately H voltage and L voltage, and oscillation frequency is 1 MHz. The power consumption of the device 600 and the device 700 is changed with changes in input signals; thus, the power consumption can be regarded as dynamic power consumption.

Figure 32:
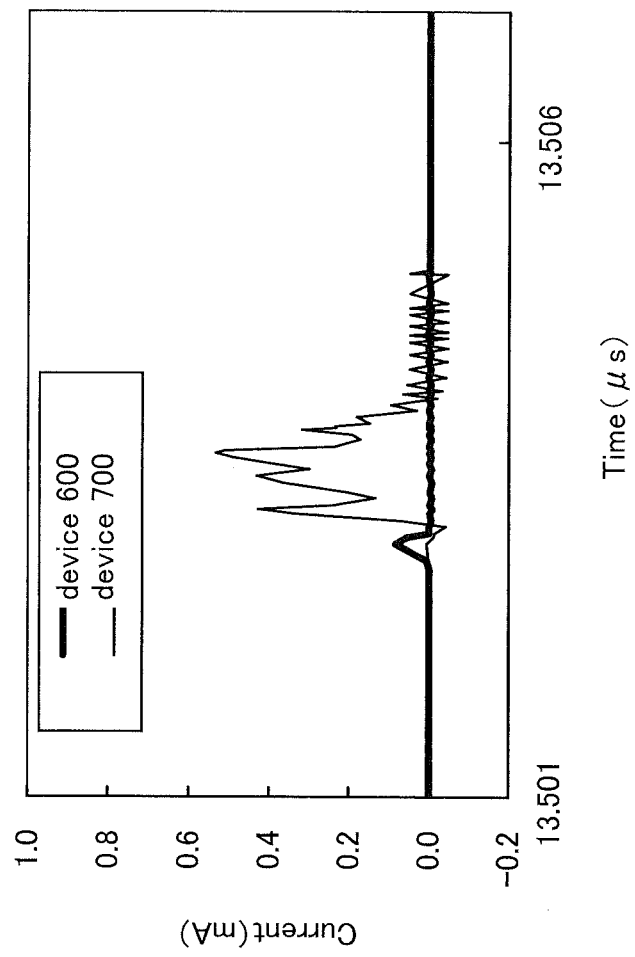
FIG. 32 shows a relationship between current and time.

FIG. 32 is a magnified view of a portion surrounded by a broken line in FIG. 31. FIG. 31 and FIG. 32 show that the power consumption of the device 600 is lower than 0.2 mA and that the power consumption of the device 700 is approximately 0.6 mA.

As described in Embodiment 2, as the number of gate stages increases, dynamic power consumption increases. In the device 700, the signal is input to many gates before the signal is output. Thus, power consumption and dynamic power consumption increase. On the other hand, in the device 600, power consumption does not increase because the signal 622 is not input to gates (excluding the buffer 617). Thus, the power consumption of the device 600 is lower than the power consumption of the device 700.

As described above, the operation speed of the device 600 is higher than that of the device 700 including logic circuits, and the device 600 can operate with low power. Further, an input signal is output without a decrease in voltage by the boosting effect.

As described in Embodiment 2, the number of transistors included in the device 600 is smaller than the number of transistors included in the device 700. Thus, the circuit size of the device 600 can be reduced.

REFERENCE NUMERALS

10: PLD, 11: PLE, 12: LUT, 13: FF, 14: MUX, 15: CM, 16: terminal, 17: terminal, 18: configuration data, 18a: CM, 19: configuration data, 20: switch, 20a: switch, 20b: switch, 20c: switch, 20d: switch, 20e: switch, 20f: switch, 21: transistor, 22: transistor, 23: wiring, 24: wiring, 24a: wiring, 24b: wiring, 25: wiring, 25a: wiring, 25b: wiring, 25c: wiring, 25d: wiring, 26: wiring, 26a: wiring, 27: inverter, 27a: inverter, 27b: inverter, 30a: AO gate, 30b: AO gate, 30c: AO gate, 31: AND circuit, 32: AND circuit, 33: OR circuit, 40: MUX, 50: AO gate, 50a: AO gate, 50b: AO gate, 50c: AO gate, 50d: AO gate, 50e: AO gate, 50f: AO gate, 50g: AO gate, 50h: AO gate, 50i: AO gate, 50j: AO gate, 50k: AO gate, 50l: AO gate, 50m: AO gate, 50n: AO gate, 50o: AO gate, 51: AND circuit, 52: AND circuit, 53: OR circuit, 54: wiring, 55: wiring, 56: wiring, 57: inverter, 57a: inverter, 57d: inverter, 60: wiring, 61: wiring, 62: wiring, 63: wiring, 64: wiring, 65: wiring, 67: wiring, 70a: transistor, 70b: transistor, 70c: transistor, 71a: transistor, 71b: transistor, 71c: transistor, 72a: transistor, 72b: transistor, 72c: transistor, 72d: transistor, 72e: transistor, 73a: transistor, 73b: transistor, 73c: transistor, 73d: transistor, 73e: transistor, 74: inverter, 75a: transistor, 75b: transistor, 75c: transistor, 75d: transistor, 75e: transistor, 76a: transistor, 76b: transistor, 76c: transistor, 76d: transistor, 76e: transistor, 77: inverter, 80: MUX, 81: CM, 82: terminal, 90: gate, 91: NAND circuit, 92: NAND circuit, 93: NAND circuit, 121: wiring group, 122: switch, 123: routing resource, 124: output terminal, 125: wiring, 126: wiring, 127: transistor, 128: transistor, 129: transistor, 130: transistor, 131: transistor, 132: transistor, 140: I/O element, 141: PLL, 142: RAM, 143: multiplier, 200: MUX, 201: inverter, 202: AND circuit, 203: AND circuit, 204: OR circuit, 205: signal, 206: signal, 207: signal, 208: signal, 220: AND circuit, 221: transistor, 222: transistor, 223: transistor, 224: transistor, 225: transistor, 226: transistor, 227: signal, 228: signal, 229: signal, 230: OR circuit, 231: transistor, 232: transistor, 233: transistor, 234: transistor, 235: transistor, 236: transistor, 237: signal, 238: signal, 239: signal, 350: interposer, 351: chip, 352: terminal, 353: mold resin, 400: semiconductor substrate, 401: element isolation insulating film, 402: impurity region, 403: impurity region, 404: gate electrode, 405: gate insulating film, 409: insulating film, 410: wiring, 411: wiring, 412: wiring, 415: wiring, 416: wiring, 417: wiring, 420: insulating film, 421: wiring, 430: semiconductor film, 431: gate insulating film, 432: conductive film, 433: conductive film, 434: gate electrode, 440: insulating film, 441: insulating film, 442: insulating film, 443: conductive film, 500: substrate, 501: element isolation region, 502: impurity region, 503: impurity region, 504: channel formation region, 505: insulating film, 506: gate electrode, 511: insulating film, 512: conductive film, 513: conductive film, 514: conductive film, 516: conductive film, 517: conductive film, 518: conductive film, 520: insulating film, 521: insulating film, 522: insulating film, 530: semiconductor film, 530a: oxide semiconductor film, 530c: oxide semiconductor film, 531: gate insulating film, 532: conductive film, 533: conductive film, 534: gate electrode, 550: transistor, 551: transistor, 600: device, 601: transistor, 602: transistor, 603: transistor, 604: transistor, 605: transistor, 606: transistor, 607: transistor, 608: transistor, 609: transistor, 610: transistor, 611: transistor, 612: transistor, 615: inverter, 616: inverter, 617: buffer, 620: signal, 621: signal, 622: signal, 623: signal, 624: signal, 625: signal, 630: multiplexer, 640: node, 700: device, 701: AND circuit, 702: OR circuit, 703: AND circuit, 704: AND circuit, 705: AND circuit, 706: OR circuit, 707: AND circuit, 708: OR circuit, 709: AND circuit, 715: inverter, 716: inverter, 717: buffer, 720: signal, 721: signal, 722: signal, 723: signal, 724: signal, 725: signal, 730: multiplexer, 800: panel, 801: printed wiring board, 802: package, 803: FPC, 804: battery, 820: insulating film, 830: semiconductor film, 830a: oxide semiconductor film, 830b: oxide semiconductor film, 830c: oxide semiconductor film, 831: gate insulating film, 832: conductive film, 833: conductive film, 834: gate electrode, 910: PLD, 911: PLE, 913: FF, 914: MUX, 917: signal, 918: configuration data, 919: configuration data, 1101: semiconductor device, 1109: MUX, 1110: transistor, 1110A: transistor, 1111: transistor, 1112: transistor, 1113: transistor, 1114: memory, 1115: LUT, 1116: signals, 1117: signal, 1119: power supply line, 1122: inverter, 1132: signal, 1140: node, 1141: node, 1142: capacitor, 1143: capacitor, 1144: node, 1145: node, 1146: node, 1147: node, 1148: input node, 1149: output node, 1150: MUX, 1151: memory, 1152: input node, 1301: semiconductor device, 1309: MUX, 1310: transistor, 1311: transistor, 1312: transistor, 1313: transistor, 1314: memory, 1315: LUT, 1316: signals, 1317: signal, 1319: power supply line, 1332: signal, 1350: MUX, 1351: memory, 2401: semiconductor device, 2410: transistor, 2411: transistor, 2412: transistor, 2413: transistor, 2414: transistor, 2415: transistor, 2416: transistor, 2417: transistor, 2418: transistor, 2419: transistor, 2420: transistor, 2421: transistor, 2422: transistor, 2423: transistor, 2424: transistor, 2425: transistor, 2426: transistor, 2427: transistor, 2428: transistor, 2429: transistor, 2430: transistor, 2431: transistor, 2432: transistor, 2433: transistor, 2440: wiring, 2441: wiring, 2442: wiring, 2450: power supply line, 2460: signal, 2461: signal, 2462: signal, 2463: signal, 2481: memory, 2482: LUT, 2483: memory, 2484: MUX, 2490: MUX, 2500: signal, 2501: signal, 2502: signal, 5001: housing, 5002: housing, 5003: display portion, 5004: display portion, 5005: microphone, 5006: speaker, 5007: operation key, 5008: stylus, 5101: car body, 5102: wheel, 5103: dashboard, 5104: light, 5301: housing, 5302: refrigerator door, 5303: freezer door, 5401: housing, 5402: display portion, 5403: keyboard, 5404: pointing device, 5601: housing, 5602: housing, 5603: display portion, 5604: display portion, 5605: hinge, 5606: operation key, 5801: housing, 5802: housing, 5803: display portion, 5804: operation key, 5805: lens, 5806: hinge, M1: transistor, M2: transistor, M3: transistor, M4: transistor, M5: transistor, C1: capacitor, Sig1_0: signal, Sig1_1: signal, Sig2_0: signal, Sig2_1: signal, Sig3: signal, Sig4: signal, and Sig5: signal.

This application is based on Japanese Patent Application serial No. 2013-025157 filed with Japan Patent Office on Feb. 13, 2013 and Japanese Patent Application serial No. 2013-025221 filed with Japan Patent Office on Feb. 13, 2013, the entire contents of which are hereby incorporated by reference.

The invention claimed is:

1. A programmable logic element comprising:
a look-up table comprising a plurality of Schmitt trigger logic gates; and
a multiplexer comprising a first switch and a second switch,
wherein the first switch comprises a first transistor and a second transistor,
wherein the second switch comprises a third transistor and a fourth transistor,
wherein a first output of the look-up table is directly connected to a first input of the multiplexer,
wherein a second output of the look-up table is directly connected to a second input of the multiplexer,
wherein the first input of the multiplexer is directly connected to one of a source and a drain of the second transistor,
wherein the second input of the multiplexer is directly connected to one of a source and a drain of the fourth transistor,
wherein an output of the multiplexer is electrically connected to the other of the source and the drain of the second transistor and the other of the source and the drain of the fourth transistor,
wherein a gate of the second transistor is configured to be supplied with a configuration data through the first transistor, and
wherein a gate of the fourth transistor is configured to be supplied with an inverted configuration data through the third transistor.

2. The programmable logic element according to claim 1, wherein each of the first transistor and the third transistor comprises an oxide semiconductor in a channel formation region.

3. The programmable logic element according to claim 2, wherein the oxide semiconductor includes In and Zn.

4. The programmable logic element according to claim 2, wherein the oxide semiconductor includes Ga.

5. The programmable logic element according to claim 1, wherein each of the second transistor and the fourth transistor comprises silicon in a channel formation region.

6. A semiconductor device comprising the programmable logic element according to claim 1.

* * * * *